United States Patent
Lee et al.

(10) Patent No.: US 11,489,124 B2
(45) Date of Patent: Nov. 1, 2022

(54) ORGANIC ELECTROLUMINESCENCE DEVICE AND FUSED POLYCYCLIC COMPOUND FOR ORGANIC ELECTROLUMINESCENCE DEVICE

(71) Applicant: Samsung Display Co., Ltd., Yongin-si (KR)

(72) Inventors: Hyoyoung Lee, Suwon-si (KR); Soo-Byung Ko, Yongin-si (KR); Junha Park, Gwacheon-si (KR); Han Kyu Pak, Suwon-si (KR); Jang Yeol Baek, Yongin-si (KR); Mun-Ki Sim, Seoul (KR); Chanseok Oh, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 325 days.

(21) Appl. No.: 16/882,900

(22) Filed: May 26, 2020

(65) Prior Publication Data
US 2021/0013423 A1    Jan. 14, 2021

(30) Foreign Application Priority Data
Jul. 8, 2019   (KR) .................. 10-2019-0082058

(51) Int. Cl.
*H01L 51/00* (2006.01)
*C07F 5/02* (2006.01)
(Continued)

(52) U.S. Cl.
CPC .......... *H01L 51/0072* (2013.01); *C07F 5/027* (2013.01); *C09K 11/06* (2013.01);
(Continued)

(58) Field of Classification Search
CPC ............ H01L 51/0072; H01L 51/0061; C09K 11/06
See application file for complete search history.

(56) References Cited

U.S. PATENT DOCUMENTS 10,680,186 B2 *  6/2020  Hatakeyama ........ C09K 11/025
2015/0236274 A1   8/2015  Hatakeyama et al.
(Continued)

FOREIGN PATENT DOCUMENTS

KR   10-2016-0119683 A   10/2016

*Primary Examiner* — Douglas M Menz
(74) *Attorney, Agent, or Firm* — Lewis Roca Rothgerber Christie LLP

(57) ABSTRACT

An organic electroluminescence device of the present embodiments includes oppositely disposed first electrode and second electrode, and a plurality of organic layers disposed between the first electrode and the second electrode, wherein at least one among the plurality of organic layers includes a fused polycyclic compound represented by Formula 1 below, thereby showing improved emission efficiency:

Formula 1

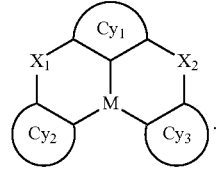

20 Claims, 2 Drawing Sheets

(51) Int. Cl.
*C09K 11/06* (2006.01)
*H01L 51/56* (2006.01)
*H01L 51/50* (2006.01)

(52) U.S. Cl.
CPC .............. H01L 51/0061 (2013.01); *C09K 2211/1018* (2013.01); *H01L 51/5012* (2013.01); *H01L 51/56* (2013.01); *H01L 2251/558* (2013.01)

(56) References Cited

U.S. PATENT DOCUMENTS

| | | | |
|---|---|---|---|
| 2017/0324037 A1* | 11/2017 | Itoi | C07C 211/58 |
| 2018/0301629 A1 | 10/2018 | Hatakeyama et al. | |
| 2020/0227639 A1* | 7/2020 | Yamatani | C07F 5/027 |
| 2020/0283426 A1* | 9/2020 | Uno | C07D 405/04 |
| 2020/0287138 A1* | 9/2020 | Suzaki | H01L 51/008 |
| 2020/0328352 A1* | 10/2020 | Ahn | C07F 5/027 |
| 2020/0381634 A1* | 12/2020 | Baek | C07F 7/0816 |
| 2020/0403160 A1* | 12/2020 | Sakamoto | C09K 11/06 |
| 2020/0411764 A1* | 12/2020 | Furue | C07F 5/027 |
| 2021/0013430 A1* | 1/2021 | Lee | H01L 51/0085 |

\* cited by examiner

ORGANIC ELECTROLUMINESCENCE DEVICE AND FUSED POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2019-0082058, filed on Jul. 8, 2019, the entire content of which is hereby incorporated by reference.

BACKGROUND

One or more embodiments of the present disclosure herein relate to an organic electroluminescence device and a fused polycyclic compound used (utilized) therein, and more particularly, to a fused polycyclic compound used (utilized) as a light-emitting material and an organic electroluminescence device including the same.

Recently, the development of an organic electroluminescence display device as an image display device is being actively conducted. Different from a liquid crystal display device, the organic electroluminescence display device is a self-luminescent display device in which holes and electrons injected from a first electrode and a second electrode recombine in an emission layer, and a light-emitting material including an organic compound in the emission layer emits light to attain display of images.

In the application of an organic electroluminescence device to a display device, the decrease of the driving voltage, and the increase of the emission efficiency and the life of the organic electroluminescence device are required (or desired), and developments of materials for an organic electroluminescence device capable of stably attaining these characteristics are being continuously required (or desired).

Recently, in order to accomplish an organic electroluminescence device with high efficiency, techniques on phosphorescence emission (which uses energy in a triplet state) or delayed fluorescence emission (which uses the generating phenomenon of singlet excitons by the collision of triplet excitons (triplet-triplet annihilation, TTA)) are being developed, and development of a material for thermally activated delayed fluorescence (TADF) using delayed fluorescence phenomenon is being conducted.

SUMMARY

One or more aspects of embodiments of the present disclosure are directed toward an organic electroluminescence device having improved emission efficiency.

One or more aspects of embodiments of the present disclosure are also directed toward a fused polycyclic compound capable of improving the emission efficiency of an organic electroluminescence device.

An embodiment of the inventive concept provides an organic electroluminescence device including a first electrode, a second electrode facing the first electrode, and a plurality of organic layers between the first electrode and the second electrode. At least one organic layer among the plurality of organic layers includes a fused polycyclic compound represented by the following Formula 1:

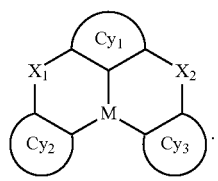

Formula 1

In Formula 1, M is B, Al, Ga, or In; $X_1$ and $X_2$ may each independently be $NR_1$, O, S, $P(=O)R_2$, or $P(=S)R_3$; $R_1$ to $R_3$ may each independently be a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_1$ to $R_3$ may (optionally) be combined with an adjacent group to form a ring; $Cy_1$ to $Cy_3$ may each independently be a substituted or unsubstituted aromatic hydrocarbon ring, or a substituted or unsubstituted aromatic heterocycle, and any of $Cy_1$ to $Cy_3$ may (optionally) be combined with an adjacent group to form a ring, and at least one among $Cy_1$ to $Cy_3$ is substituted with a substituent represented by the following Formula 2:

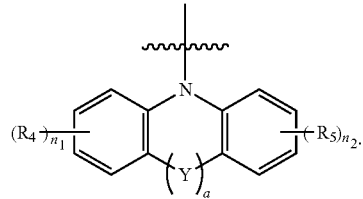

Formula 2

In Formula 2, $R_4$ and $R_5$ may each independently be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_4$ and $R_5$ may (optionally) be combined with an adjacent group to form a ring; $n_1$ and $n_2$ are each independently an integer of 0 to 4; at least one among $R_4$ and $R_5$ is a substituted or unsubstituted amine group, or a substituted or unsubstituted carbazole group, provided that when $R_4$ is the substituted or unsubstituted amine group, or the substituted or unsubstituted carbazole group, $n_1$ is an integer of 1 to 4, and when $R_5$ is the substituted or unsubstituted amine group, or the substituted or unsubstituted carbazole group, $n_2$ is an integer of 1 to 4; Y is a direct linkage; and "a" is 0 or 1.

In an embodiment, the plurality of organic layers may include a hole transport region on the first electrode, an emission layer on the hole transport region, and an electron transport region on the emission layer. The emission layer may include the fused polycyclic compound represented by Formula 1.

In an embodiment, the emission layer may emit delayed fluorescence.

In an embodiment, the emission layer may be a delayed fluorescence emission layer including a first compound and a second compound. The second compound may include the fused polycyclic compound represented by Formula 1.

In an embodiment, the emission layer may include a first compound having a first lowest triplet excitation energy level, a second compound having a second lowest triplet excitation energy level which is lower than the first lowest triplet excitation energy level, and a third compound having a third lowest triplet excitation energy level which is lower than the second lowest triplet excitation energy level. The second compound may include the fused polycyclic compound represented by Formula 1.

In an embodiment, the second compound may be a delayed fluorescence material. The third compound may be a phosphorescence material or a fluorescence material.

In an embodiment, the fused polycyclic compound represented by Formula 1 may be represented by the following Formula 3:

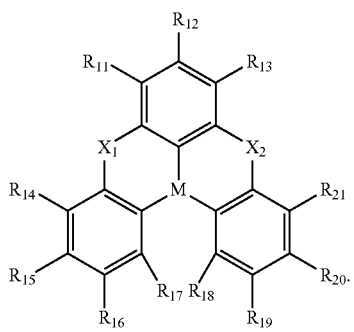

Formula 3

In Formula 3, $R_{11}$ to $R_{21}$ may each independently be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_{11}$ to $R_{21}$ may (optionally) be combined with an adjacent group to form a ring, and at least one among $R_{11}$ to $R_{21}$ may be represented by Formula 2 above.

In Formula 3, M, $X_1$, and $X_2$ may be the same as defined in Formula 1.

In an embodiment, the fused polycyclic compound represented by Formula 3 may be represented by the following Formula 4:

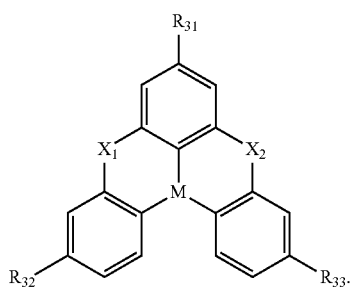

Formula 4

In Formula 4, $R_{31}$ to $R_{33}$ may each independently be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_{31}$ to $R_{33}$ may (optionally) be combined with an adjacent group to form a ring, and at least one among $R_{31}$ to $R_{33}$ may be represented by Formula 2 above.

In Formula 4, M, $X_1$, and $X_2$ are the same as defined in Formula 1.

In an embodiment, the substituent represented by Formula 2 may be represented by the following Formula 5-1 or Formula 5-2:

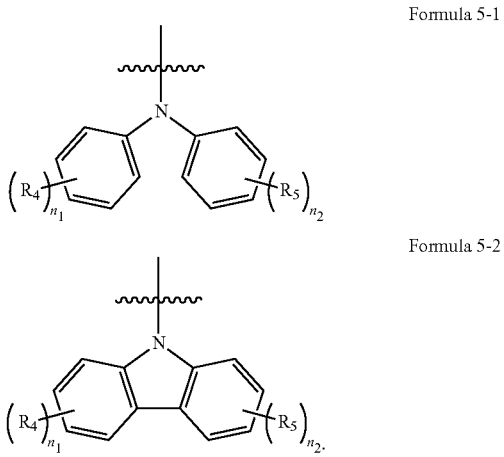

Formula 5-1

Formula 5-2

In Formulae 5-1 and 5-2, $R_4$, $R_5$, $n_1$ and $n_2$ are the same as defined in Formula 2.

In an embodiment, the substituent represented by Formula 2 may be represented by any one among the following Formula 6-1 to Formula 6-4:

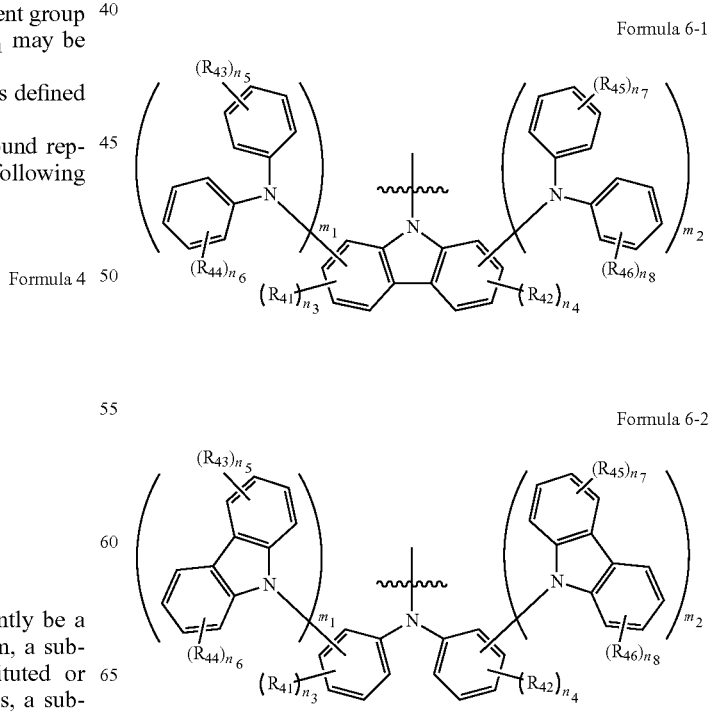

Formula 6-1

Formula 6-2

-continued

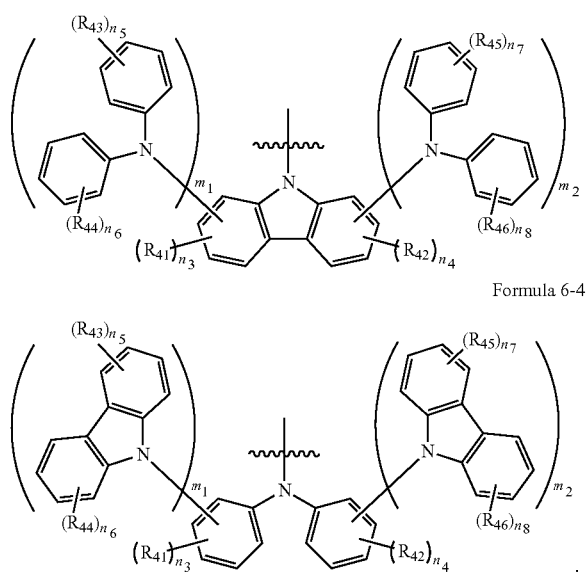

Formula 6-3

Formula 6-4

In Formulae 6-1 to 6-4, $R_{41}$ to $R_{46}$ may each independently be a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_{41}$ to $R_{46}$ may (optionally) be combined with an adjacent group to form a ring, $n_3$ and $n_4$ are each independently an integer of 0 to 3, $n_5$ to $n_8$ are each independently an integer of 0 to 4, $m_1$ and $m_2$ are each independently 0 or 1, and at least one of $m_1$ and $m_2$ is 1 ($m_1+m_2\neq 0$).

In an embodiment, the substituent represented by Formula 2 may be represented by the following Formula 7-1 or Formula 7-2:

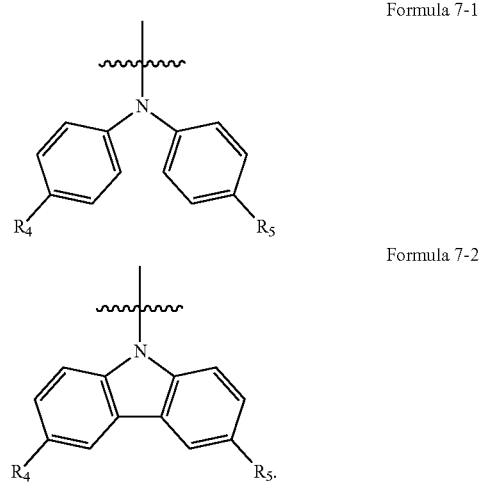

Formula 7-1

Formula 7-2

In Formulae 7-1 and 7-2, $R_4$, and $R_5$ are the same as defined in Formula 2.

In an embodiment, $X_1$ and $X_2$ may be each independently $NR_1$, or O, and $R_1$ may be a substituted or unsubstituted phenyl group.

In an embodiment, the first electrode and the second electrode are each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, or a compound of two or more selected from them, a mixture of two or more selected from them, or oxides of one or more selected from them.

In an embodiment of the inventive concept, a fused polycyclic compound according to an embodiment may be represented by Formula 1 above.

BRIEF DESCRIPTION OF THE FIGURES

The accompanying drawings are included to provide a further understanding of the inventive concept, and are incorporated in and constitute a part of this specification. The drawings illustrate exemplary (example) embodiments of the inventive concept and, together with the description, serve to explain principles of the inventive concept. In the drawings.

DETAILED DESCRIPTION

Figure 1:
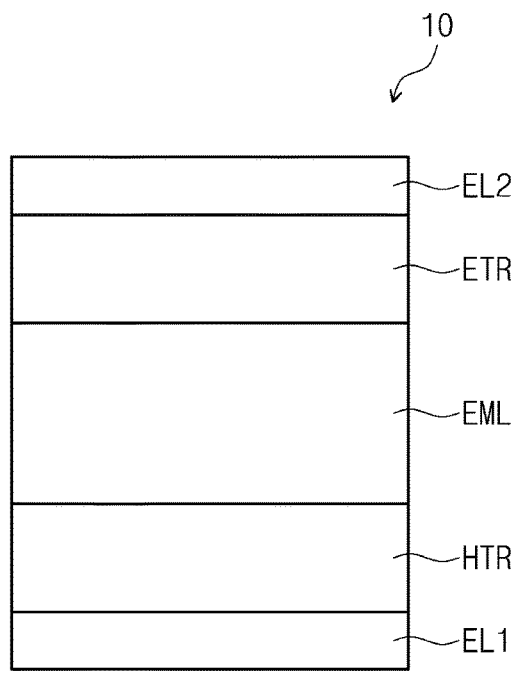
FIG. 1 is a cross-sectional view schematically illustrating an organic electroluminescence device according to an embodiment of the inventive concept.

The above objects, other objects, features and advantages of the inventive concept will be easily understood from preferred exemplary (example) embodiments with reference to the accompanying drawings. The inventive concept may, however, be embodied in different forms and should not be construed as limited to the embodiments set forth herein. Rather, exemplary (example) embodiments are provided so that the contents disclosed herein become thorough and complete, and the spirit of the inventive concept is sufficiently accepted (evident) for a person skilled in the art.

Like reference numerals refer to like elements for explaining each drawing. In the drawings, the sizes of elements may be enlarged for clarity of the inventive concept. It will be understood that, although the terms first, second, etc. may be used herein to describe various elements, these elements should not be limited by these terms. These terms are only used to distinguish one element from another element. For example, a first element discussed below could be termed a second element, and similarly, a second element could be termed a first element. As used herein, the singular forms are intended to include the plural forms as well, unless the context clearly indicates otherwise.

It will be further understood that the terms "comprises" or "comprising," when used in this specification, specify the presence of stated features, numerals, steps, operations, elements, parts, or a combination thereof, but do not preclude the presence or addition of one or more other features, numerals, steps, operations, elements, parts, or a combination thereof. It will also be understood that when a layer, a film, a region, a plate, etc. is referred to as being "on" another part, it can be "directly on" the other part, or intervening layers (or parts) may also be present. Similarly, when a layer, a film, a region, a plate, etc. is referred to as being "under" another part, it can be "directly under" the other part, or intervening layers (or parts) may also be present. In contrast, when a layer, a film, a region, a plate, etc. is referred to as being "directly on" or "directly under" another part, no intervening layers (or parts) may be present.

Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention."

Hereinafter, the organic electroluminescence device according to one or more embodiments of the inventive concept and a fused polycyclic compound according to one or more embodiments included therein will be explained with reference to attached drawings.

FIGS. 1 to 4 are cross-sectional views schematically showing organic electroluminescence devices according to exemplary (example) embodiments of the inventive concept. Referring to FIGS. 1 to 4, in an organic electroluminescence device 10 according to an embodiment, a first electrode EL1 and a second electrode EL2 are oppositely disposed (positioned), and between the first electrode EL1 and the second electrode EL2, a plurality of organic layers may be disposed. The plurality of the organic layers may include a hole transport region HTR, an emission layer EML and an electron transport region ETR. That is, the organic electroluminescence device 10 of an embodiment may include a first electrode EL1, a hole transport region HTR, an emission layer EML, an electron transport region ETR, and a second electrode, laminated one by one (sequentially). On the second electrode EL2, a capping layer CPL may be further disposed.

The organic electroluminescence device 10 of the present embodiments may include a fused polycyclic compound of the present embodiments, which will be explained in more detail later, in at least one organic layer among the plurality of the organic layers disposed between the first electrode EL1 and the second electrode EL2. For example, the organic electroluminescence device 10 of the present embodiments may include a fused polycyclic compound of the present embodiments in the emission layer EML disposed between the first electrode EL1 and the second electrode EL2. However, embodiments of the inventive concept are not limited thereto, and the organic electroluminescence device 10 of the present embodiments may include the fused polycyclic compound of the present embodiments in at least one organic layer included in the hole transport region HTR and the electron transport region ETR, which are among the plurality of the organic layers disposed between the first electrode EL1 and the second electrode EL2 in addition to the emission layer EML, or the fused polycyclic compound of the present embodiments may be in the capping layer CPL disposed on the second electrode EL2.

Figure 2:
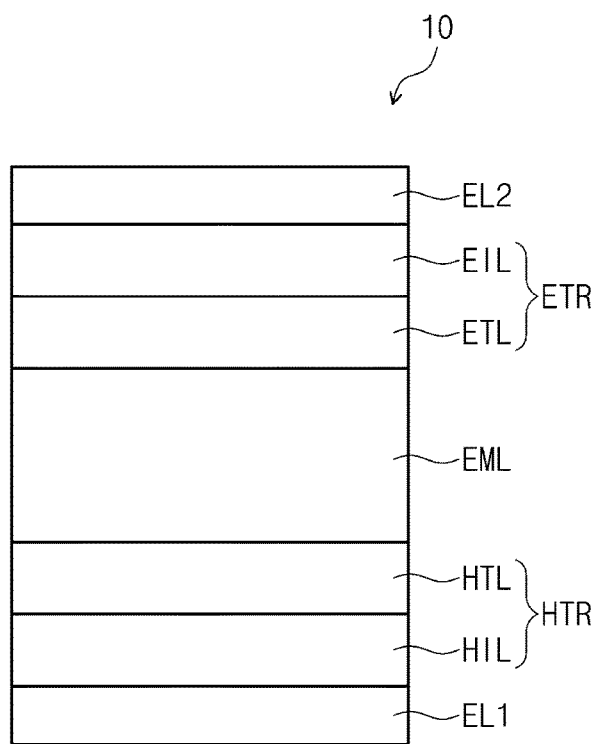
FIG. 2 is a cross-sectional view schematically illustrating an organic electroluminescence device according to an embodiment of the inventive concept.
Figure 3:
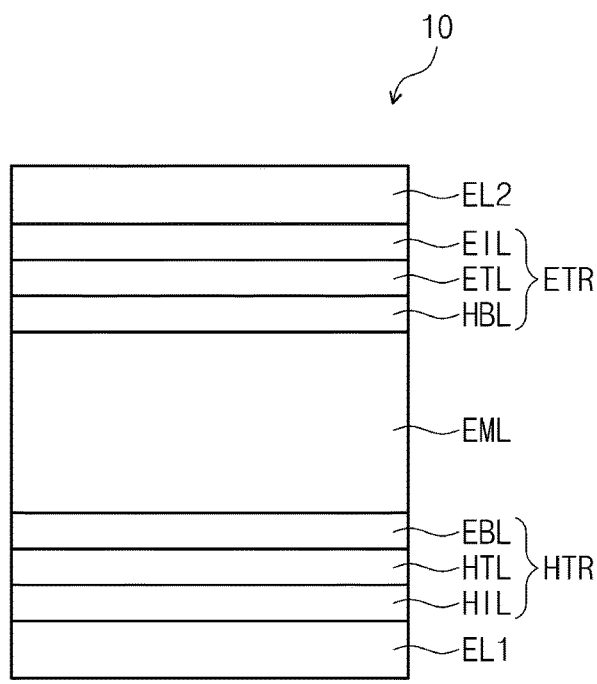
FIG. 3 is a cross-sectional view schematically illustrating an organic electroluminescence device according to an embodiment of the inventive concept.
Figure 4:
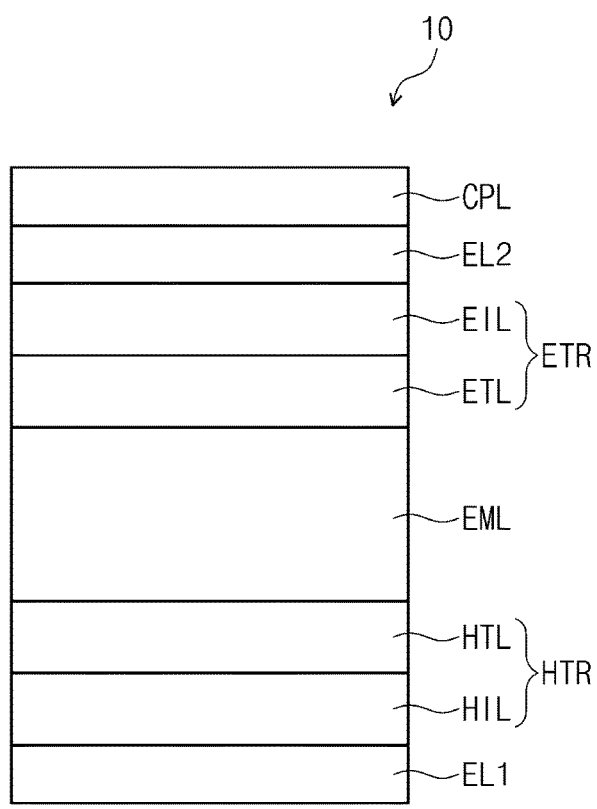
FIG. 4 is a cross-sectional view schematically illustrating an organic electroluminescence device according to an embodiment of the inventive concept.

FIG. 2 shows the cross-sectional view of an organic electroluminescence device 10 of the present embodiments, wherein a hole transport region HTR includes a hole injection layer HIL and a hole transport layer HTL, and an electron transport region ETR includes an electron injection layer EIL and an electron transport layer ETL. FIG. 3 shows the cross-sectional view of an organic electroluminescence device 10 of the present embodiments, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. When compared with FIG. 2, FIG. 4 shows the cross-sectional view of an organic electroluminescence device 10 of the present embodiments including a capping layer CPL disposed on the second electrode EL2.

Hereinafter, in explaining the organic electroluminescence device 10 of the present embodiments, the emission layer EML is explained to include a fused polycyclic compound according to the present embodiments, but an embodiment of the inventive concept is not limited thereto. The fused polycyclic compound may be included in a hole transport region HTR, electron transport region ETR, or capping layer CPL.

The first electrode EL1 has conductivity. The first electrode EL1 may be formed using a metal alloy or a conductive compound. The first electrode EL1 may be an anode. The first electrode EL1 may be a pixel electrode. The first electrode EL1 may be a transmissive electrode, a transflective electrode, or a reflective electrode. If the first electrode EL1 is the transmissive electrode, the first electrode EU may be formed using a transparent metal oxide such as indium tin oxide (ITO), indium zinc oxide (IZO), zinc oxide (ZnO), and indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/AI, Mo, Ti, a compound thereof, or a mixture thereof (for example, a mixture of Ag and Mg). In one or more embodiments, the first electrode EL1 may have a structure including a plurality of layers including a reflective layer or a transflective layer formed using any of the above materials, and a transmissive conductive layer formed using ITO, IZO, ZnO, and/or ITZO. For example, the first electrode EL1 may include a three-layer structure of ITO/Ag/ITO. However, an embodiment of the inventive concept is not limited thereto. The thickness of the first electrode EL1 may be from about 1,000 Å to about 10,000 Å, for example, from about 1,000 Å to about 3,000 Å.

The hole transport region HTR is provided on the first electrode EL1. The hole transport region HTR may include at least one of a hole injection layer HIL, a hole transport layer HTL, a hole buffer layer, or an electron blocking layer EBL. The thickness of the hole transport region HTR may be from about 50 Å to about 1,500 Å

The hole transport region HTR may have a single layer formed using a single material, a single layer formed using a plurality of different materials, or a multilayer structure including a plurality of layers formed using a plurality of different materials.

For example, the hole transport region HTR may have the structure of a single layer of a hole injection layer HIL, or a hole transport layer HTL, and may have a structure of a single layer formed using a hole injection material and a hole transport material. In some embodiments, the hole transport region HTR may have a structure of a single layer formed using a plurality of different materials, or a structure laminated from the first electrode EL1 of hole injection layer HIL/hole transport layer HTL, hole injection layer H IL/hole transport layer HTL/hole buffer layer, hole injection layer HIL/hole buffer layer, hole transport layer HTL/hole buffer layer, or hole injection layer HIL/hole transport layer HTL/ electron blocking layer EBL, but the present disclosure is not limited thereto.

The hole transport region HTR may be formed using one or more suitable methods such as a vacuum deposition method, a spin coating method, a cast method, a Langmuir- Blodgett (LB) method, an inkjet printing method, a laser printing method, and/or a laser induced thermal imaging (LITI) method.

The hole injection layer HIL may include, for example, a phthalocyanine compound (such as copper phthalocyanine), N,N'-diphenyl-N,N'-bis-[4-(phenyl-m-tolyl-amino)-phenyl]-phenyl-4,4'-diamine (DNTPD), 4,4',4"-[tris(3-methylphenyl)phenylamino] triphenylamine (m-MTDATA), 4,4', 4"-tris(N,N-diphenylamino)triphenylamine (TDATA), 4,4', 4"-tris{N,-2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenyl-benzidine (NPB), N,N'-di(1-naphthyl)-N,N"-diphenyl-(1, 1"-biphenyl)-4,4"-diamine (NPD), triphenylamine-containing polyetherketone (TPAPEK), 4-isopropyl-4'-methyldiphenyliodonium [tetrakis(pentafluorophenyl) borate], and/or dipyrazino[2,3-f:2',3'-h]quinoxaline-2,3,6,7, 10,11-hexacarbonitrile (HAT-CN).

The hole transport layer HTL may include, for example, carbazole derivatives (such as N-phenyl carbazole and/or polyvinyl carbazole), fluorene-based derivatives, N,N'-bis (3-methylphenyl)-N,N'-diphenyl-[1,1-biphenyl]-4,4'-diamine (TPD), triphenylamine-based derivatives (such as 4,4',4"-tris(N-carbazolyl)triphenylamine (TCTA)), N,N'-di (1-naphthalene-1-yl)-N,N'-diphenyl-benzidine (NPB), 4,4'-cyclohexylidene bis[N,N-bis(4-methylphenyl)benzeneamine (TAPC), 4,4'-bis[N,N'-(3-tolyl)amino]-3,3'-dimethylbiphenyl (HMTPD), 1,3-bis(N-carbazolyl)benzene (mCP), 9-(4-tert-butylphenyl)-3,6-bis(triphenylsilyl)-9H-carbazole (CzSi), and/or the like.

The thickness of the hole transport region HTR may be from about 100 Å to about 10,000 Å, for example, from about 100 Å to about 5,000 Å. The thickness of the hole injection region HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. If the thicknesses of the hole transport region HTR, the hole injection layer HIL, the hole transport layer HTL, and the electron blocking layer EBL each independently satisfy the above-described ranges, satisfactory (or suitable) hole transport properties may be achieved without a substantial increase of a driving voltage.

The hole transport region HTR may further include a charge generating material, in addition to the above-described materials, to increase conductivity. The charge generating material may be dispersed uniformly or non-uniformly in the hole transport region HTR. The charge generating material may be, for example, a p-dopant. The p-dopant may be one of quinone derivatives, metal oxides, or cyano group-containing compounds, but the present disclosure is not limited thereto. Non-limiting examples of the p-dopant may include quinone derivatives (such as tetracyanoquinodimethane (TCNQ) and/or 2,3,5,6-tetrafluoro-7,7', 8,8'-tetracyanoquinodimethane (F4-TCNQ)), and/or metal oxides (such as tungsten oxide and/or molybdenum oxide), but the present disclosure is not limited thereto.

As described above, the hole transport region HTR may further include at least one of a hole buffer layer or an electron blocking layer EBL, in addition to the hole injection layer HIL and the hole transport layer HTL. The hole buffer layer may compensate an optical resonance distance according to the wavelength of light emitted from an emission layer EML and may increase light emission efficiency. Materials which may be included in a hole transport region HTR may be used as materials included in a hole buffer layer. The electron blocking layer EBL is a layer capable of preventing (or reducing) the electron injection from the electron transport region ETR to the hole transport region HTR.

The emission layer EML is provided on the hole transport region HTR. The emission layer EML may have a thickness of, for example, about 100 Å to about 1,000 Å or about 100 Å to about 300 Å. The emission layer EML may have a single layer formed using a single material, a single layer formed using a plurality of different materials, or a multi-layer structure having a plurality of layers formed using a plurality of different materials.

In the organic electroluminescence device 10 of the present embodiments, the emission layer EML may include the fused polycyclic compound of the present embodiments.

In the present description,

means a connecting part.

In the present description, the term "substituted or unsubstituted" when used in connection with a functional group corresponds to the group that is unsubstituted or is substituted with at least one substituent selected from a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. In addition, each of the exemplified substituents may be substituted or unsubstituted. For example, a biphenyl group may be interpreted as an aryl group or a phenyl group substituted with a phenyl group.

In the present description, the term "forming a ring via the combination with an adjacent group" may refer to forming a substituted or unsubstituted hydrocarbon ring, or a substituted or unsubstituted heterocycle via the combination of one group with an adjacent group. The hydrocarbon ring may include an aliphatic hydrocarbon ring and an aromatic hydrocarbon ring. The heterocycle may include an aliphatic heterocycle and an aromatic heterocycle. The ring formed by the combination with an adjacent group may be a monocyclic ring or a polycyclic ring. In addition, the ring formed via the combination with an adjacent group may be combined with another ring to form a spiro structure.

In the present description, the term "adjacent group" may refer to a pair of substituent groups where a first substituent is connected to an atom which is directly connected to another atom substituted with a second substituent, a pair of substituent groups connected to the same atom, or a pair of substituent groups where the first substituent is sterically positioned at the nearest position to the second substituent. For example, in 1,2-dimethylbenzene, two methyl groups may be interpreted as "adjacent groups" to each other, and in 1,1-diethylcyclopentene, two ethyl groups may be interpreted as "adjacent groups" to each other.

In the present description, the halogen atom may be a fluorine atom, a chlorine atom, a bromine atom, and/or an iodine atom.

In the present description, the alkyl may be a linear, branched or cyclic group. The carbon number of the alkyl may be 1 to 50, 1 to 30, 1 to 20, 1 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., but the present disclosure is not limited thereto.

In the present description, the hydrocarbon ring includes an aliphatic hydrocarbon ring and an aromatic hydrocarbon ring. The heterocycle includes an aliphatic heterocycle and an aromatic heterocycle. The hydrocarbon ring and the heterocycle may each independently be monocyclic or polycyclic.

In the present description, the hydrocarbon ring may refer to a functional group or substituent, which is derived from an aliphatic hydrocarbon ring, or a functional group or substituent derived from an aromatic hydrocarbon ring. The carbon number of the hydrocarbon ring to form a ring (e.g., the number of ring-forming carbon atoms) may be 5 to 60.

In the present description, the heterocyclic group may be a functional group or substituent, which is derived from a heterocycle including at least one heteroatom as a ring-forming element. The carbon number of the heterocyclic group to form a ring may be 5 to 60.

In the present description, the aryl group refer to a functional group or substituent derived from an aromatic hydrocarbon ring. The aryl group may be a monocyclic aryl group or a polycyclic aryl group. The carbon number to form a ring in the aryl group may be 6 to 60, 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc., but the present disclosure is not limited thereto.

In the present description, the fluorenyl group may be substituted, and two substituents may be combined with each other to form a spiro structure. Examples of a substituted fluorenyl group are as follows. However, an embodiment of the inventive concept is not limited thereto:

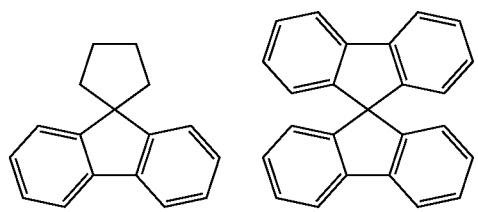

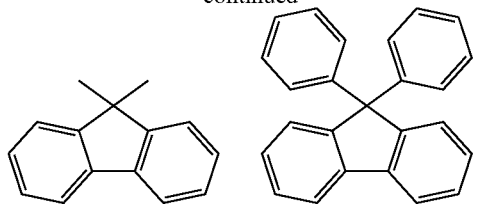

In the present description, the heteroaryl group may include one or more from among B, O, N, P, Si and S as heteroatoms. If the heteroaryl group includes two or more heteroatoms, two or more heteroatoms may be the same or different. The heteroaryl group may be monocyclic heteroaryl or polycyclic heteroaryl. The carbon number to form a ring of the heteroaryl group may be 2 to 60, 2 to 30, 2 to 20, or 2 to 10. Examples of the heteroaryl group may include thiophene, furan, pyrrole, imidazole, thiazole, oxazole, oxadiazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuran, phenanthroline, thiazole, isooxazole, oxadiazole, thiadiazole, phenothiazine, dibenzosilole, dibenzofuran, etc., but the present disclosure is not limited thereto.

In the present description, the silyl group may include an alkylsilyl group and an arylsilyl group. Examples of the silyl group may include trimethylsilyl, triethylsilyl, t-butyldimethylsilyl, vinyldimethylsilyl, propyldimethylsilyl, triphenylsilyl, diphenylsilyl, phenylsilyl, etc., but the present disclosure is not limited thereto. However, an embodiment of the inventive concept is not limited thereto.

In the present description, the boron group may include an alkyl boron group and an aryl boron group. Examples of the boron group include a trimethylboron group, a triethylboron group, a t-butyldimethylboron group, a triphenylboron group, a diphenylboron group, a phenylboron group, etc., but the present disclosure is not limited thereto.

In the present description, the carbon number of the amine group is not specifically limited, but may be 1 to 30. The amine group may include an alkyl amine group and an aryl amine group. Examples of the amine group include a methylamine group, a dimethylamine group, a phenylamine group, a naphthylamine group, a 9-methyl-anthracenylamine group, a triphenylamine group, etc., but the present disclosure is not limited thereto In the present description, the hydrocarbon ring means a functional group or a substituent derived from an aliphatic hydrocarbon ring. The hydrocarbon ring may be a saturated hydrocarbon ring of 5 to 20 carbon atoms to form a ring.

In the present description, the heterocyclic group may include one or more from among B, O, N, P, Si and S as heteroatoms. If the heterocyclic group includes two or more heteroatoms, two or more heteroatoms may be the same or different. The heterocyclic group may be monocyclic heterocyclic group or polycyclic heterocyclic group, and may be a heteroaryl group. The carbon number to form a ring of the heterocyclic group may be 2 to 30, 2 to 20, or 2 to 10.

The fused polycyclic compound of the present embodiments is represented by the following Formula 1:

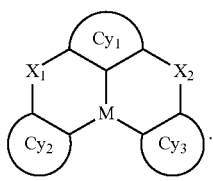

Formula 1

In Formula 1, M is B, Al, Ga, or In. M may be any one among the elements in Group 13. For example, M may be boron (B).

In Formula 1, $X_1$ and $X_2$ may each independently be $NR_1$, O, S, $P(=O)R_2$, or $P(=S)R_3$. $R_1$ to $R_3$ may each independently be a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring. Optionally, any of $R_1$ to $R_3$ may be each independently combined with an adjacent group to form a ring. In an embodiment, $X_1$ and $X_2$ may each independently be $NR_1$, or O. For example, in the fused polycyclic compound represented by Formula 1, both $X_1$ and $X_2$ may be $NR_1$. In some embodiments, both $X_1$ and $X_2$ may be O. In some embodiments, any one among $X_1$ and $X_2$ may be $NR_1$ and the other one may be O. In case where at least one among $X_1$ and $X_2$ is $NR_1$, $R_1$ may be a substituted or unsubstituted phenyl group. For example, $R_1$ may be an unsubstituted phenyl group.

In some embodiments, $R_1$ may be a 1,3,5-trimethylphenyl group.

In Formula 1, $Cy_1$ to $Cy_3$ may each independently be a substituted or unsubstituted aromatic hydrocarbon ring, or a substituted or unsubstituted aromatic heterocycle. $Cy_1$ to $Cy_3$ may each independently be a five- or six-member substituted or unsubstituted aromatic hydrocarbon ring, or a substituted or unsubstituted aromatic heterocycle. Optionally, $Cy_1$ to $Cy_3$ may each independently be combined with an adjacent group to form an additional ring. $Cy_1$ to $Cy_3$ may each independently be a substituted or unsubstituted six-member aromatic hydrocarbon ring.

In Formula 1, at least one among $Cy_1$ to $Cy_3$ is substituted with a substituent represented by the following Formula 2:

Formula 2

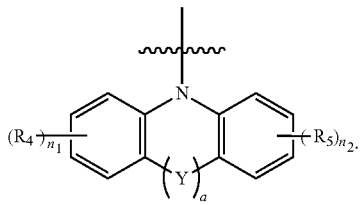

In Formula 2, $R_4$ and $R_5$ may each independently be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring. In some embodiments, $R_4$ and $R_5$ may each independently be combined with an adjacent group to form an additional ring.

At least one among $R_4$ and $R_5$ may be a substituted or unsubstituted amine group, or a substituted or unsubstituted carbazole group. For example, any one among $R_4$ and $R_5$ may be a substituted or unsubstituted N,N-diphenylamine group, or a substituted or unsubstituted carbazole group. In some embodiments, both $R_4$ and $R_5$ may be substituted or unsubstituted N,N-diphenylamine groups, or substituted or unsubstituted carbazole groups.

In Formula 2, Y is a direct linkage, and "a" is 0 or 1. If "a" is 0, the substituent represented by Formula 2 may be a substituted or unsubstituted N,N-diphenylamine group. If "a" is 1, the substituent represented by Formula 2 may be a substituted or unsubstituted carbazole group.

In Formula 2, $n_1$ and $n_2$ may each independently be an integer of 0 to 4. If $n_1$ is 0, the fused polycyclic compound according to embodiments may not be substituted with $R_4$. A case where $n_1$ is 4 and all $R_4$ groups are hydrogen atoms, may be the same as a case where $n_1$ is 0. If $n_1$ is an integer of 2 or more, a plurality of $R_4$ groups may be the same, or at least one among the plurality of $R_4$ groups may be different. If $n_2$ is 0, the fused polycyclic compound may not be substituted with $R_5$. A case where $n_2$ is 4 and all $R_5$ groups are hydrogen atoms, may be the same as a case where $n_2$ is 0. If $n_2$ is an integer of 2 or more, a plurality of $R_5$ groups may be the same or at least one among the plurality of $R_5$ groups may be different.

In Formula 2, at least one among $n_1$ and $n_2$ is an integer of 1 or more. If $R_4$ is a substituted or unsubstituted amine group, or a substituted or unsubstituted carbazole group, $n_1$ is an integer of 1 to 4. If $R_5$ is a substituted or unsubstituted amine group, or a substituted or unsubstituted carbazole group, $n_2$ is an integer of 1 to 4. That is, the fused polycyclic compound of the present embodiments may have a structure in which a first hetero substituent including nitrogen is substituted at the fused polycyclic ring structure and in addition, a second hetero substituent including nitrogen is additionally substituted at the first hetero substituent.

The fused polycyclic compound of the present embodiments includes a nitrogen-containing hetero substituent, which reinforces the donor properties of electrons when compared with the related art polycyclic compound including two nitrogen atoms and one boron atom in a core. Particularly, the fused polycyclic compound of the present embodiments has a structure in which a first hetero substituent including nitrogen is substituted at the fused polycyclic ring and in addition, a second hetero substituent including nitrogen is additionally substituted at the first hetero substituent. In addition, the fused polycyclic compound of the present embodiments shows multiple resonance by a plurality of aromatic rings forming fused rings, to easily separate HOMO and LUMO states in one molecule, and may be used as a material emitting delayed fluorescence. The fused polycyclic compound according to the embodiments includes a double nitrogen-containing hetero substituent which reinforces the donor properties of electrons when compared with the related art polycyclic compound including two nitrogen atoms and one boron atom, and may have a decreased difference ($\Delta E_{ST}$) between the lowest triplet excitation energy level (T1 level) and the lowest singlet excitation energy level (S1 level). Accordingly, if the fused polycyclic compound of the present embodiments is used as a material for emitting delayed florescence, the emission efficiency of an organic electroluminescence device may be even further improved.

The fused polycyclic compound represented by Formula 1 may be represented by the following Formula 3:

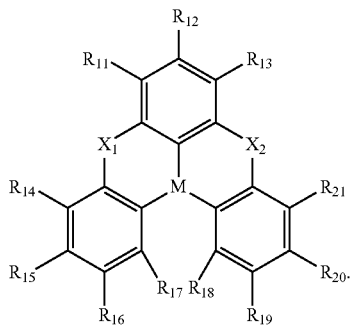

Formula 3

In Formula 3, $R_{11}$ to $R_{21}$ may each independently be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring. Optionally, any of $R_{11}$ to $R_{21}$ may each independently be combined with an adjacent group to form an additional ring.

At least one among $R_{11}$ to $R_{21}$ may be represented by Formula 2. For example, at least one among $R_{12}$, $R_{15}$, and $R_{20}$ may be represented by Formula 2. At least one among $R_{12}$, $R_{15}$, and $R_{20}$ may be a substituted or unsubstituted amine group, or a substituted or unsubstituted carbazole group. At least one among $R_{12}$, $R_{15}$, and $R_{20}$ may be a substituted or unsubstituted N,N-diphenylamine group, or a substituted or unsubstituted carbazole group. At least one among $R_{12}$, $R_{15}$, and $R_{20}$ may be an unsubstituted N,N-diphenylamine group, a N,N-diphenylamine group which is substituted with a substituted or unsubstituted carbazole group, or a substituted or unsubstituted carbazole group.

Meanwhile, in Formula 3, the same explanation on M, $X_1$, and $X_2$ provided in reference to Formula 1 may be applied.

The fused polycyclic compound represented by Formula 3 may be represented by the following Formula 4:

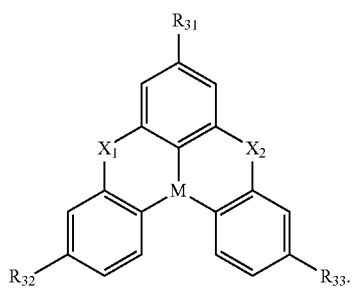

Formula 4

In Formula 4, $R_{31}$ to $R_{33}$ may each independently be a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring. Optionally, any of $R_{31}$ to $R_{33}$ may each independently be combined with an adjacent group to form an additional ring.

At least one among $R_{31}$ to $R_{33}$ may be represented by Formula 2. At least one among $R_{31}$ to $R_{33}$ may be a substituted or unsubstituted amine group, or a substituted or unsubstituted carbazole group. At least one among $R_{31}$ to $R_{33}$ may be a substituted or unsubstituted N,N-diphenylamine group, or a substituted or unsubstituted carbazole group. At least one among $R_{31}$ to $R_{33}$ may be an unsubstituted N,N-diphenylamine group, a N,N-diphenylamine group which is substituted with a substituted or unsubstituted carbazole group, or a substituted or unsubstituted carbazole group.

Meanwhile, in Formula 4, the same explanation on M, $X_1$, and $X_2$ provided in reference to Formula 1 may be applied.

In Formula 1, the substituent represented by Formula 2 may be represented by the following Formula 5-1 or Formula 5-2:

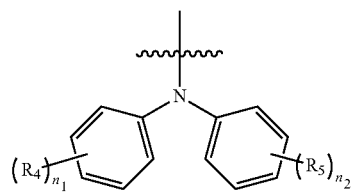

Formula 5-1

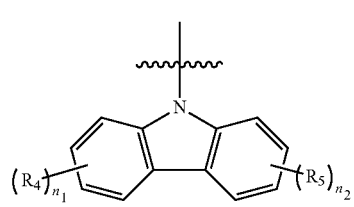

Formula 5-2

Formula 5-1 may correspond to Formula 2 where "a" is 0. Formula 5-2 may correspond to Formula 2 where "a" is 1.

Meanwhile, in Formula 5-1 and Formula 5-2, the same explanation for $R_4$, $R_5$, $n_1$, and $n_2$ provided in reference to Formula 2 may be applied.

The substituent represented by Formula 2 may be represented by any one among the following Formula 6-1 to Formula 6-4:

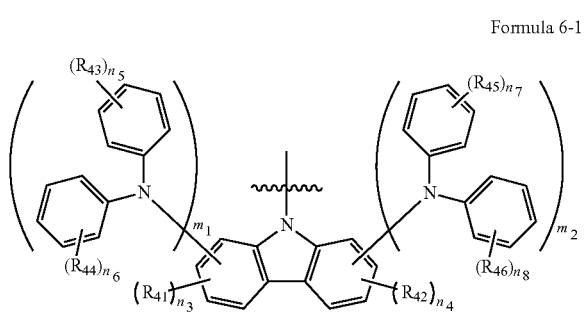

Formula 6-1

Formula 6-2

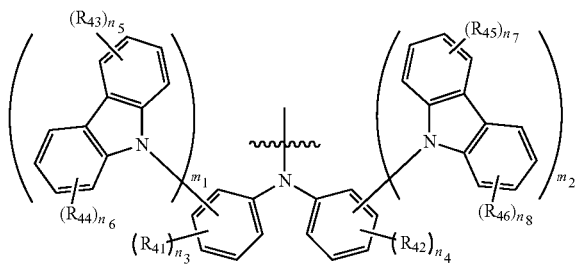

Formula 6-3

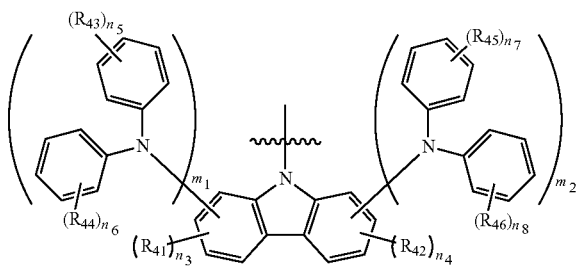

Formula 6-4

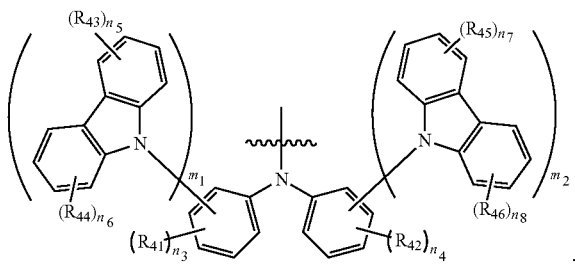

In Formulae 6-1 to 6-4, $R_{41}$ to $R_{46}$ may each independently be a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring. Optionally, any of $R_{41}$ to $R_{46}$ may each independently be combined with an adjacent group to form an additional ring. For example, all of $R_{41}$ to $R_{46}$ may be hydrogen atoms.

In Formulae 6-1 to 6-4, $n_3$ and $n_4$ may each independently be an integer of 0 to 3. If $n_3$ is 0, the fused polycyclic compound according to the embodiments may not be substituted with $R_{41}$. If $n_3$ is an integer of 2 or more, a plurality of $R_{41}$ groups may be the same or at least one among the plurality of $R_{41}$ groups may be different. If $n_4$ is 0, the fused polycyclic compound may not be substituted with $R_{42}$. If $n_4$ is an integer of 2 or more, a plurality of $R_{42}$ groups may be the same or at least one among the plurality of $R_{42}$ groups may be different.

In Formulae 6-1 to 6-4, $n_5$ to $n_8$ may each independently be an integer of 0 to 4. If $n_5$ is 0, the fused polycyclic compound according to the embodiments may not be substituted with $R_{43}$. If $n_5$ is an integer of 2 or more, a plurality of $R_{43}$ groups may be the same or at least one among the plurality of $R_{43}$ groups may be different. If $n_6$ is 0, the fused polycyclic may not be substituted with $R_{44}$. If $n_6$ is an integer of 2 or more, a plurality of $R_{44}$ groups may be the same or at least one among the plurality of $R_{44}$ groups may be different. If $n_7$ is 0, the fused polycyclic compound may not be substituted with $R_{45}$. If $n_7$ is an integer of 2 or more, a plurality of $R_{45}$ groups may be the same or at least one among the plurality of $R_{45}$ groups may be different. If $n_8$ is 0, the fused polycyclic compound may not be substituted with $R_{46}$. If $n_8$ is an integer of 2 or more, a plurality of $R_{46}$ groups may be the same or at least one among the plurality of $R_{46}$ groups may be different.

In Formulae 6-1 to 6-4, $m_1$ and $m_2$ may each independently be 0 or 1. In this case, $m_1+m_2\neq 0$, that is, at least one among $m_1$ and $m_2$ may be 1. A case where both $m_1$ and $m_2$ are 0, is excluded. In one or more embodiments, one among $m_1$ and $m_2$ may be 1, and the other one may be 0. In some embodiments, both $m_1$ and $m_2$ may be 1.

The substituent represented by Formula 2 may be represented by the following Formula 7-1 or Formula 7-2:

Formula 7-1

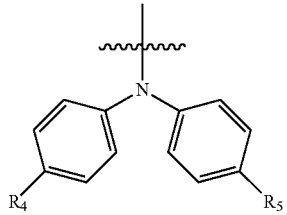

Formula 7-2

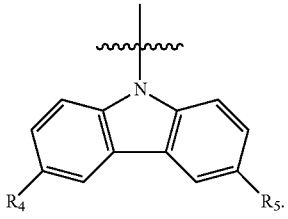

In Formulae 7-1 and 7-2, the same explanation on $R_4$, and $R_5$ provided in reference to Formula 2 may be applied.

The fused polycyclic compound of the present embodiments may be any one among the compounds represented in Compound Group 1 below. The organic electroluminescence device 10 of the present embodiments may include at least one fused polycyclic compound among the compounds represented in Compound Group 1 in an emission layer EML.

Compound Group 1
1
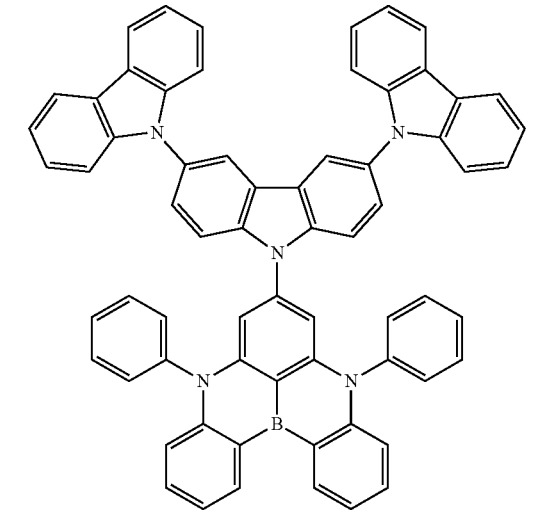
2
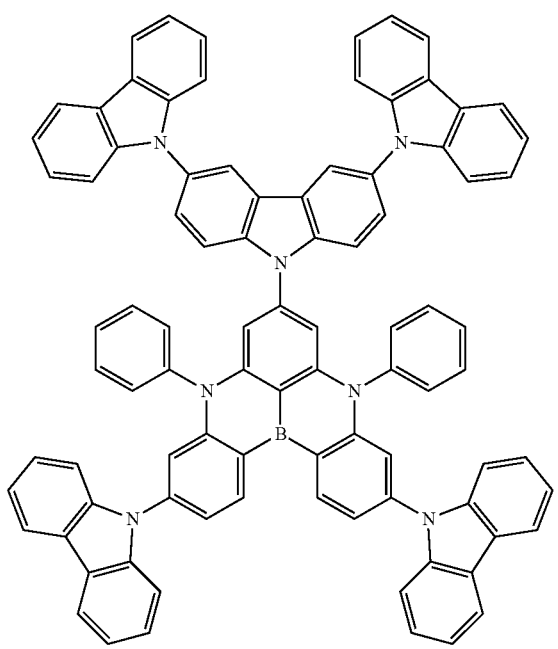
3
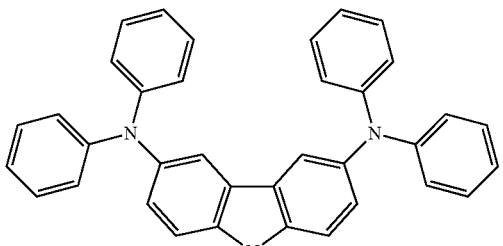
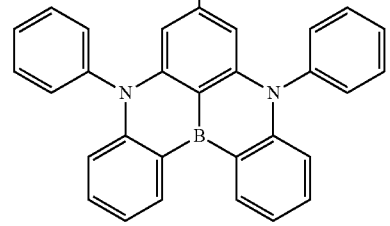
4
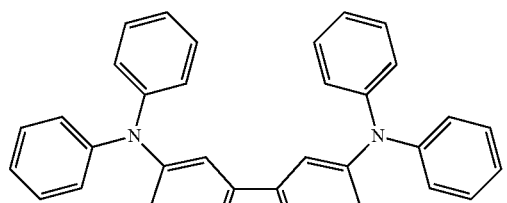
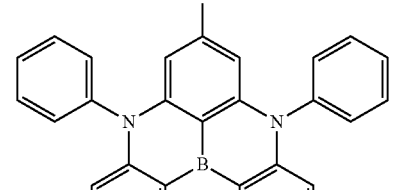
5
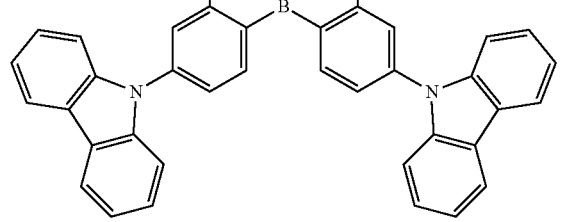
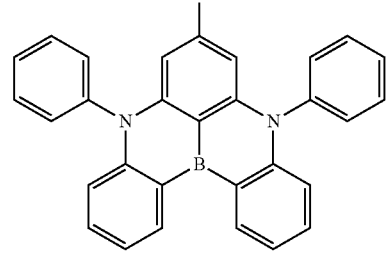

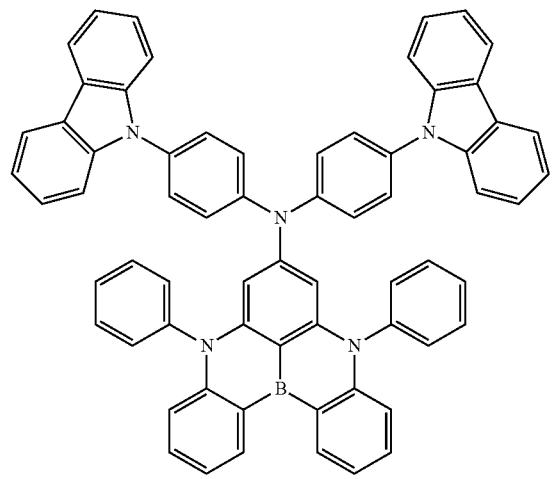
5
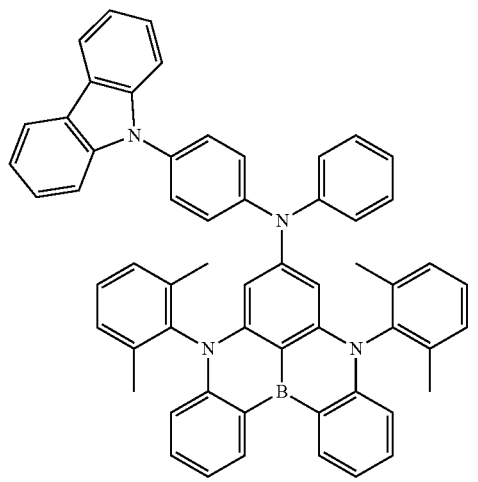
9
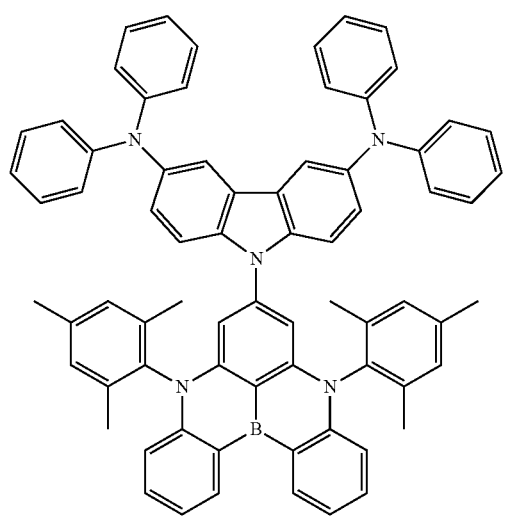
7
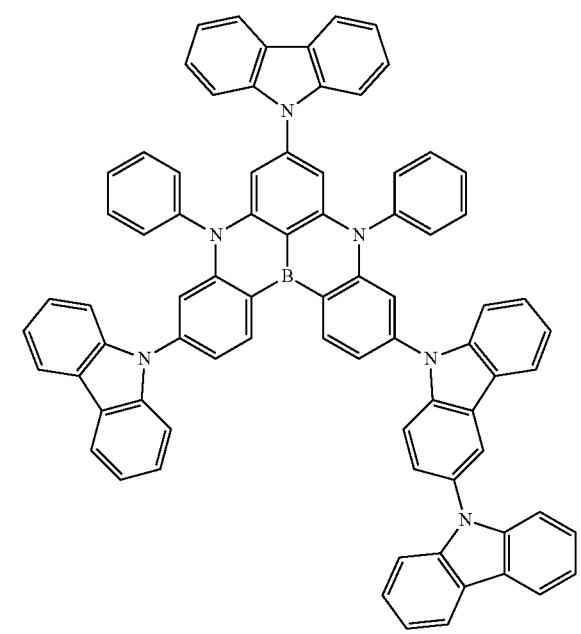
10
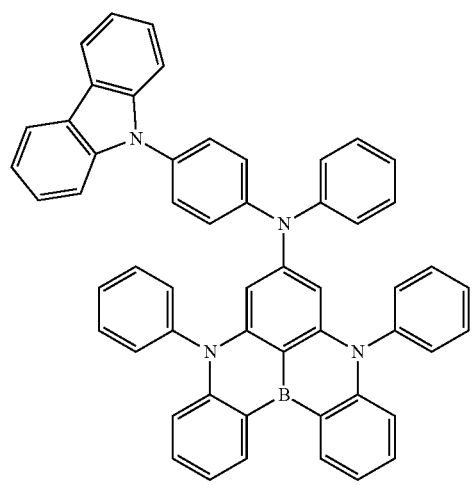
8
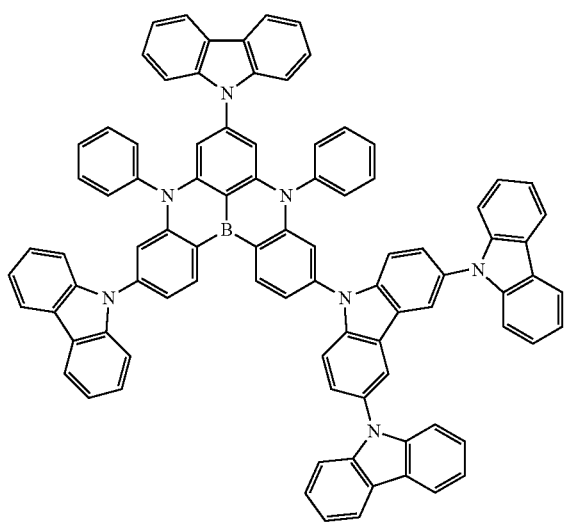
11

12
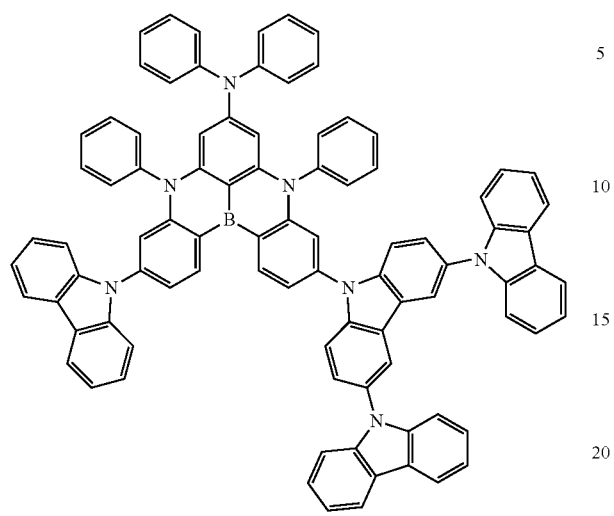
13
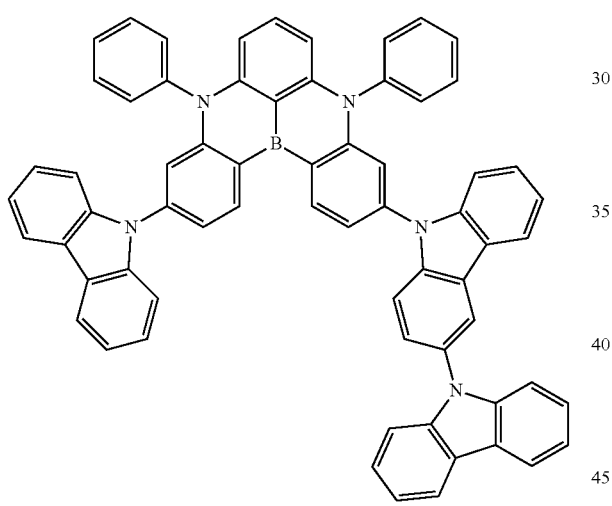
14
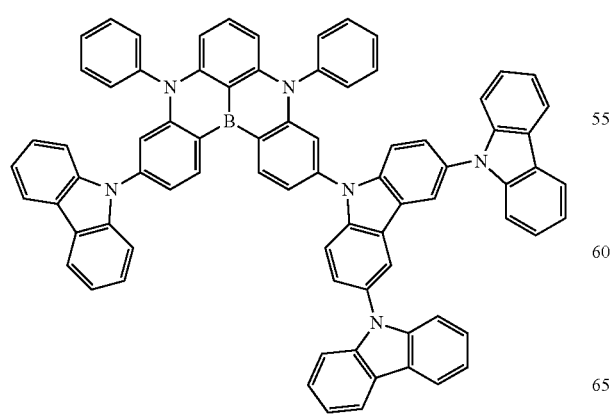
15
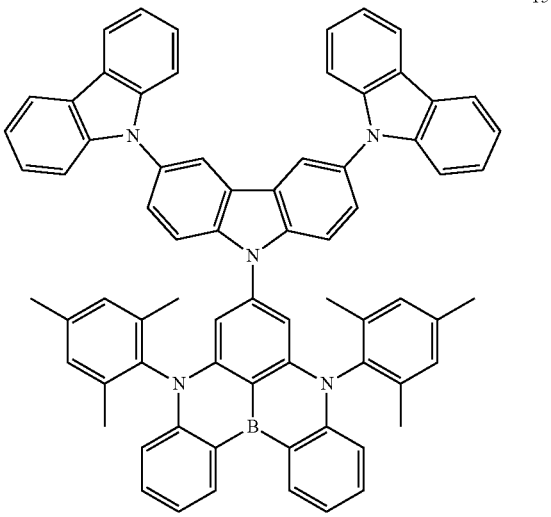
16
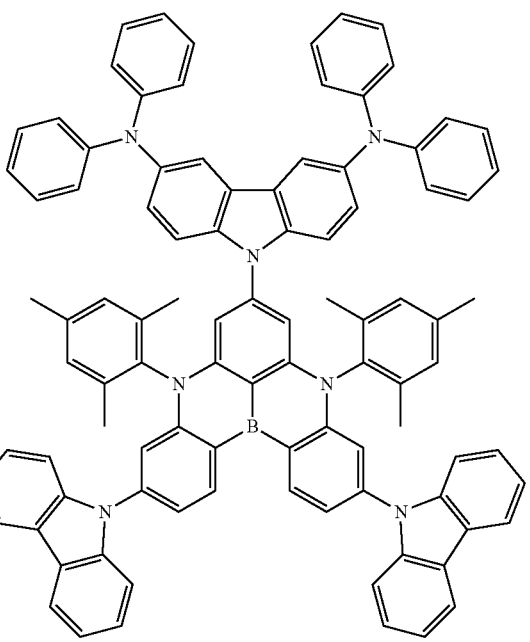

17
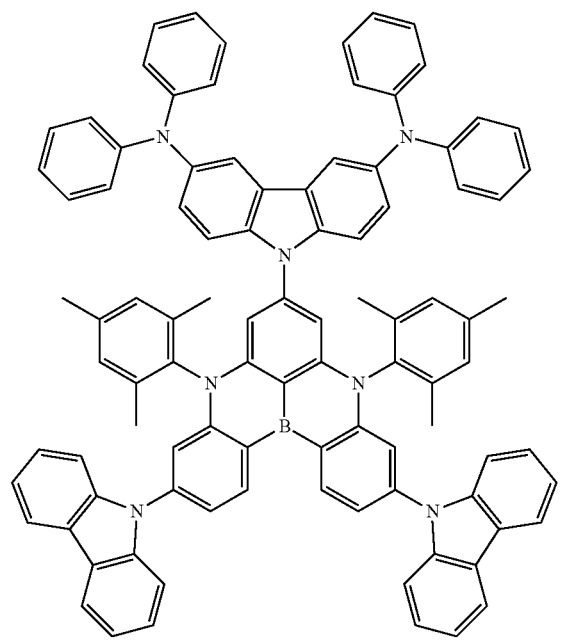
19
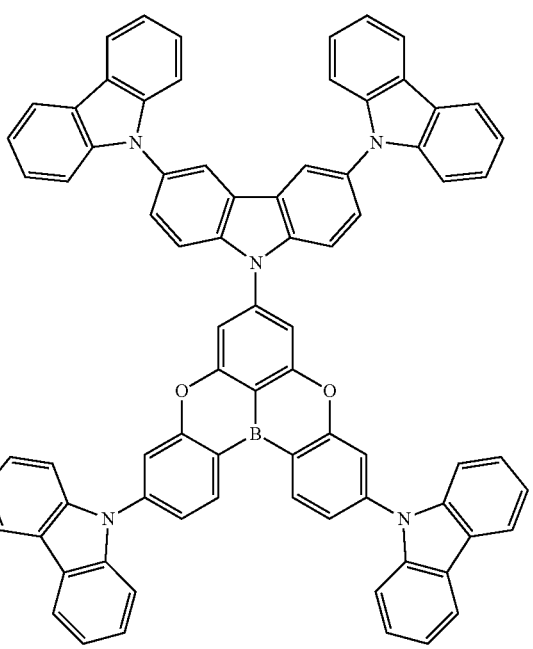
18
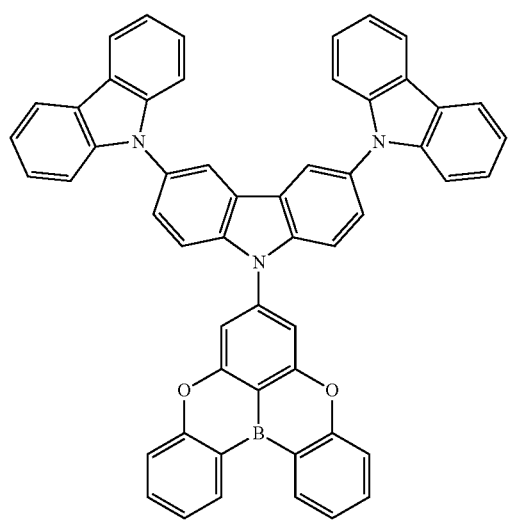
20
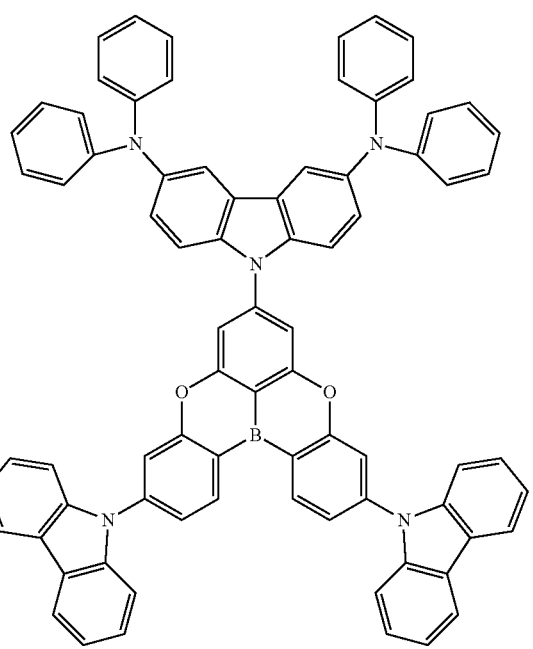

21
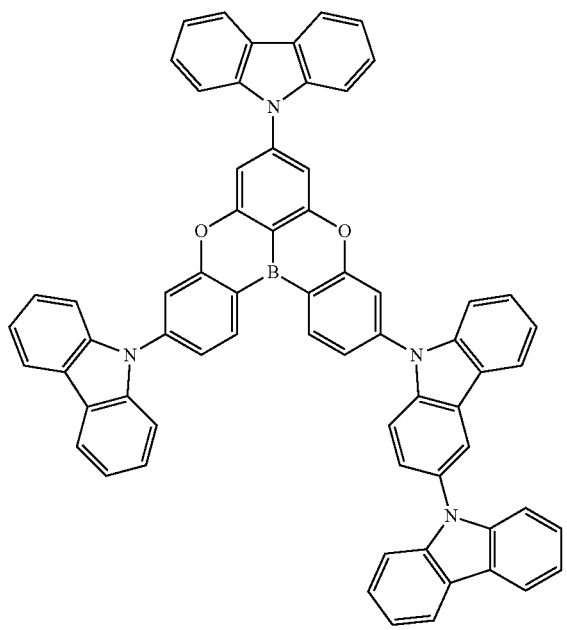
22
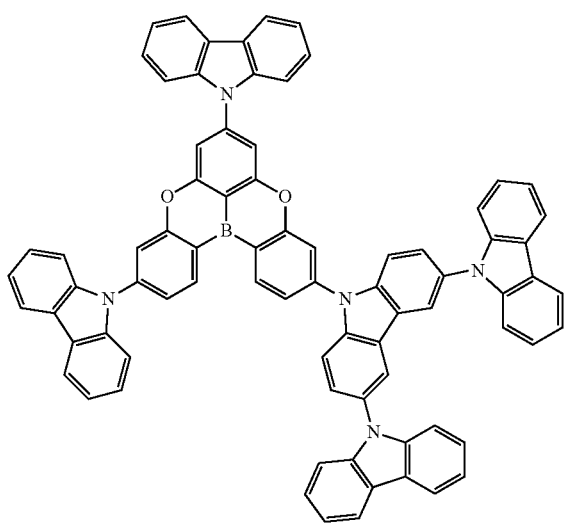
23
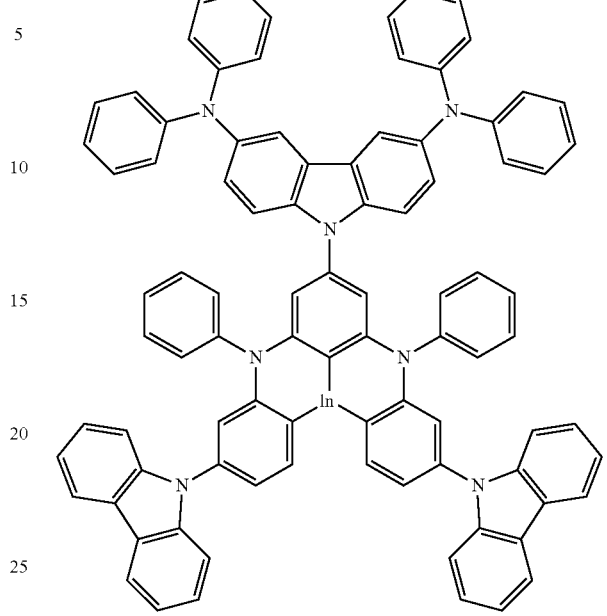
24
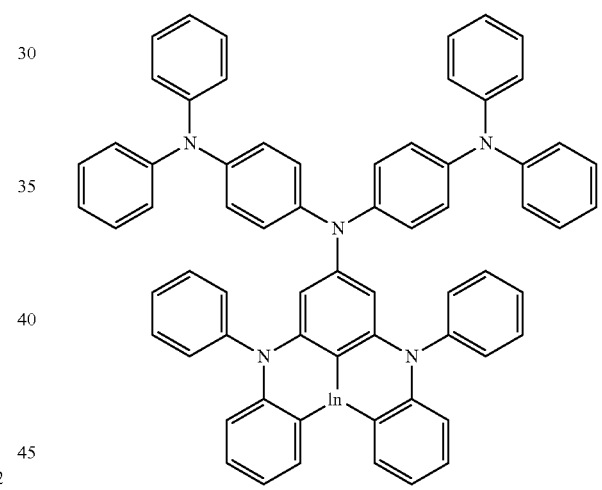
25
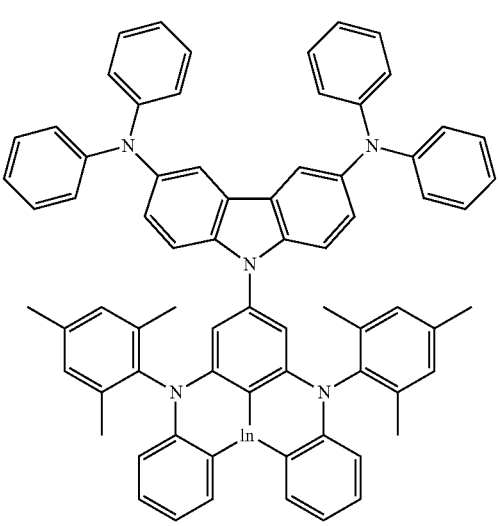

26

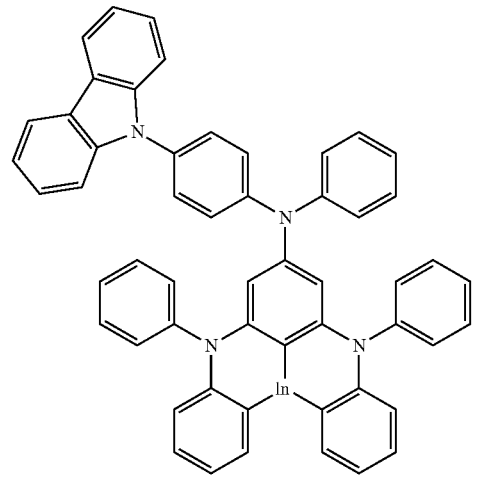

27

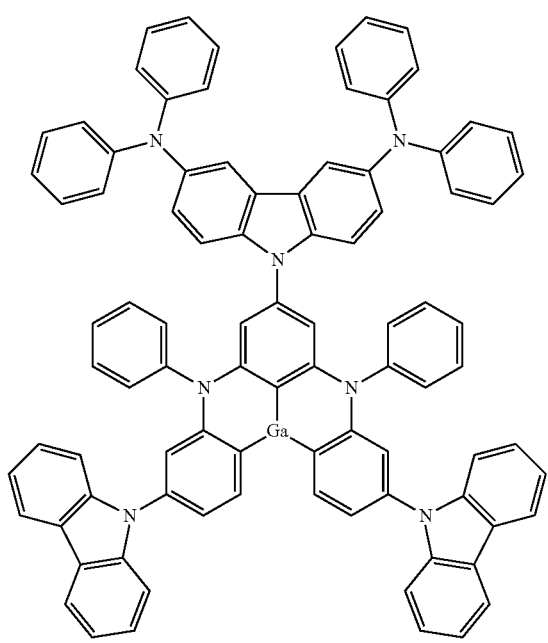

28

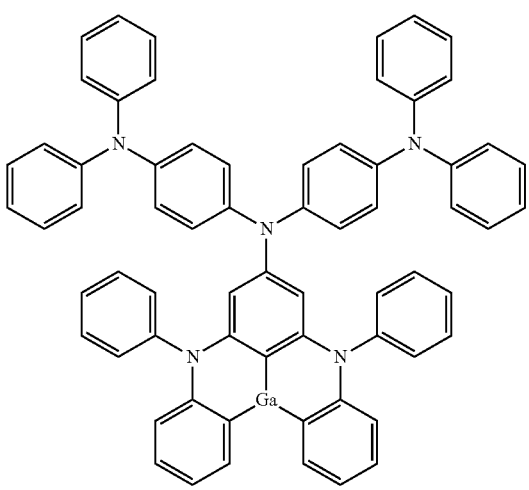

29

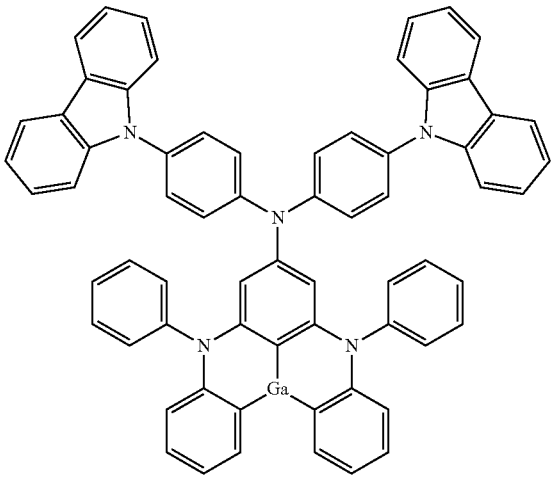

30

The fused polycyclic compound of the present embodiments, represented by Formula 1 may be a thermally activated delayed fluorescence emission material. In addition, the fused polycyclic compound of the present embodiments represented by Formula 1 may be a thermally activated delayed fluorescence dopant having a difference ($\Delta E_{ST}$) between the lowest triplet excitation energy level (T1 level) and the lowest singlet excitation energy level (S1 level) of about 0.4 eV or less.

The fused polycyclic compound of the present embodiments represented by Formula 1 may be a light-emitting material having a light-emitting central wavelength in a wavelength region of about 430 nm to about 490 nm. For example, the fused polycyclic compound of the present embodiments represented by Formula 1 may be a blue thermally activated delayed fluorescence (TADF) dopant. However, an embodiment of the inventive concept is not limited thereto, and in case of using the fused polycyclic compound of the present embodiments as the light-emitting material, the fused polycyclic compound may be used as a dopant material emitting light in various suitable wavelength regions, such as a red emitting dopant and/or a green emitting dopant.

In the organic electroluminescence device 10 of the present embodiments, the emission layer EML may emit delayed fluorescence. For example, the emission layer EML may emit thermally activated delayed fluorescence (TADF). In addition, the organic electroluminescence device 10 may emit blue light. For example, the emission layer EML of the organic electroluminescence device 10 of the present embodiments may emit blue light in a region of about 490 nm or more. However, an embodiment of the inventive concept is not limited thereto, and the emission layer EML may emit green light or red light.

The organic electroluminescence device 10 of the present embodiments may include a plurality of emission layers. The plurality of emission layers may be laminated one by one (sequentially). For example, the organic electroluminescence device 10 (including a plurality of emission layers) may emit white light. The organic electroluminescence device (including the plurality of emission layers) may be an organic electroluminescence device having a tandem structure. If the organic electroluminescence device 10 includes a plurality of emission layers, at least one emission layer EML may include the fused polycyclic compound of the present embodiments.

In an embodiment, the emission layer EML includes a host and a dopant, and may include the fused polycyclic compound of the present embodiments as a dopant. For example, in the organic electroluminescence device 10 of the present embodiments, the emission layer EML may include a host for emitting delayed fluorescence and a dopant for emitting delayed fluorescence, and may include the fused polycyclic compound as a dopant for emitting delayed fluorescence. The emission layer EML may include at least one among the fused polycyclic compounds represented in Compound Group 1 as a thermally activated delayed fluorescence dopant.

In one or more embodiments, the emission layer EML may be a delayed fluorescence emission layer, and the emission layer EML may include any suitable host material and the above-described fused polycyclic compound. For example, in an embodiment, the fused polycyclic compound may be used as a TADF dopant.

As the host material of the emission layer EML, any suitable material may be used, and may be selected, without specific limitation, from fluoranthene derivatives, pyrene derivatives, arylacetylene derivatives, anthracene derivatives, fluorene derivatives, perylene derivatives, chrysene derivatives, and the like. In one or more embodiments, pyrene derivatives, perylene derivatives, and/or anthracene derivatives may be used. For example, as the host material of the emission layer EML, anthracene derivatives represented by the following Formula 8 may be used:

Formula 8

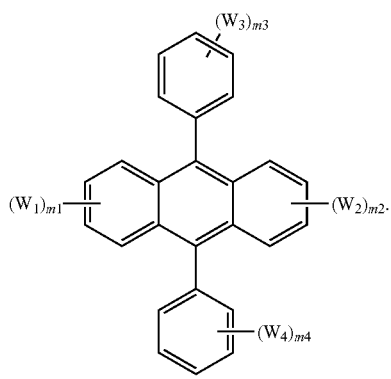

In Formula 8, $W_1$ to $W_4$ may each independently be a hydrogen atom, a deuterium atom, a halogen atom, a substituted or unsubstituted silyl group, a substituted or unsubstituted alkyl group of 1 to 20 carbon atoms, a substituted or unsubstituted aryl group of 6 to 30 carbon atoms to form a ring, or a substituted or unsubstituted heteroaryl group of 2 to 30 carbon atoms to form a ring, and any of $W_1$ to $W_4$ may be combined with an adjacent group to form a ring. $m_1$ and $m_2$ may each independently be an integer of 0 to 4, and $m_3$ and $m_4$ may each independently be an integer of 0 to 5.

In case where $m_1$ is 1, $W_1$ may not be a hydrogen atom, in case where $m_2$ is 1, $W_2$ may not be a hydrogen atom, in case where $m_3$ is 1, $W_3$ may not be a hydrogen atom, and in case where $m_4$ is 1, $W_4$ may not be a hydrogen atom.

In case where $m_1$ is 2 or more, a plurality of $W_1$ groups are the same or different. In case where $m_2$ is 2 or more, a plurality of $W_2$ groups are the same or different. In case where $m_3$ is 2 or more, a plurality of $W_3$ groups are the same or different. In case where $m_4$ is 2 or more, a plurality of $W_4$ groups are the same or different.

The compound represented by Formula 8 may include, for example, the compounds represented by the structures below. However, an embodiment of the compound represented by Formula 8 is not limited thereto.

a-1

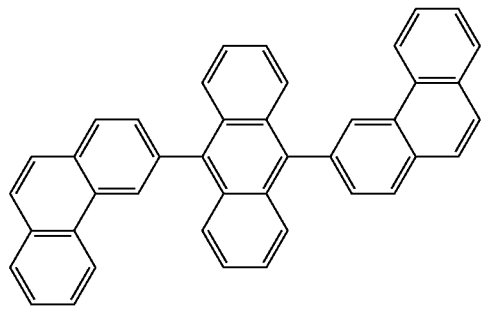

a-2

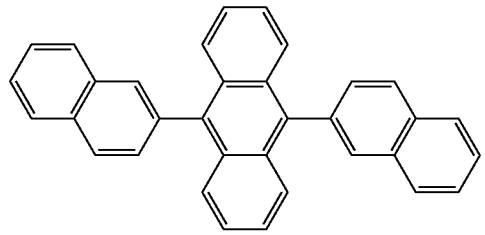

a-3

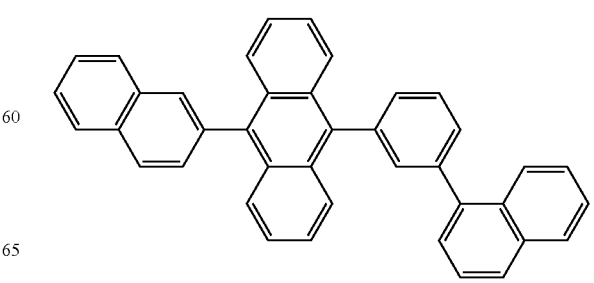

a-4
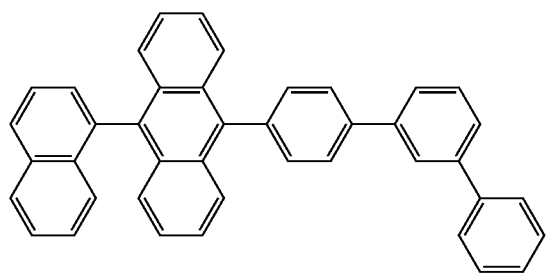

a-5
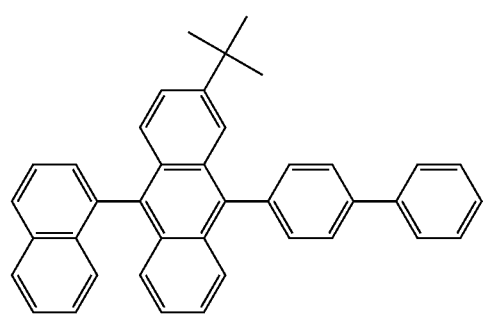

a-6
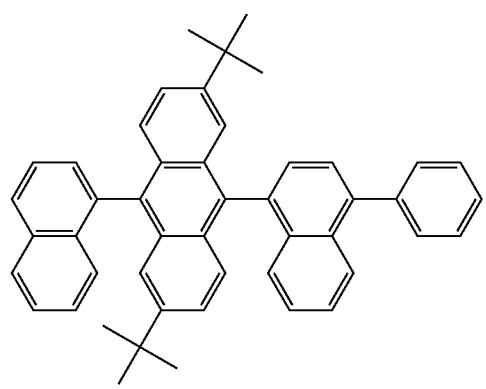

a-7
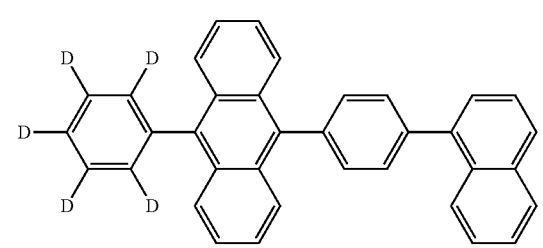

a-8
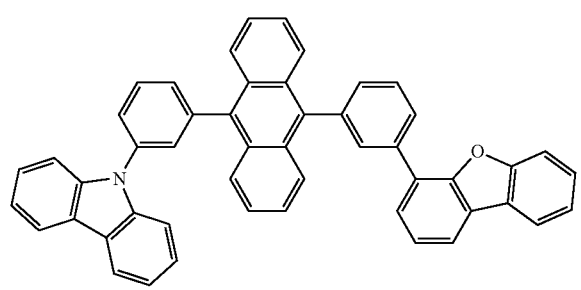

a-9
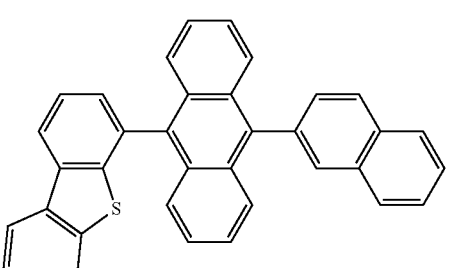

a-10
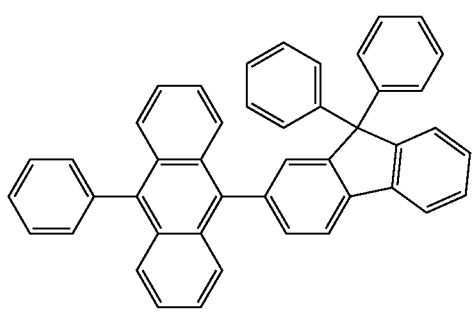

a-11
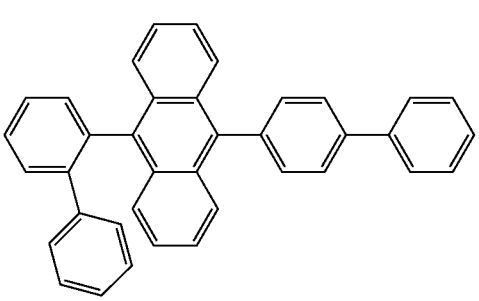

a-12
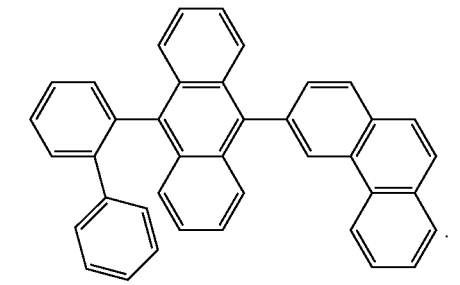

In one or more embodiments, the emission layer EML may include, as a host material, tris(8-hydroxyquinolino) aluminum (Alq$_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4"-tris(carbazol-9-yl)-triphenylamine (TCTA), 1,3,5-tris(1-phenyl-1H-benzo[d]imidazol-2-yl)benzene (TPBi), 3-tert-butyl-9,10-di(naphth-2-yl)anthracene (TBADN), distyrylarylene (DSA), 4,4'-bis(9-carbazolyl)-2,2"-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane (DPSiO$_3$), octaphenylcyclotetrasiloxane (DPSiO$_4$), 2,8-bis(diphenylphosphoryl)dibenzofuran (PPF), 3,3'-bis(N-carbazolyl)-1,1'-biphenyl (mCBP), 1,3-bis(N-carbazolyl)benzene (mCP), 9,10-di(naphthalen-2-yl)anthracene (DNA), etc. However, an embodiment of the inventive concept is not limited thereto. Any suitable host material for emitting delayed fluorescence other than the suggested host materials may be included.

Meanwhile, in the organic electroluminescence device 10 of the present embodiments, the emission layer EML may further include any suitable dopant material. In one or more embodiments, the emission layer EML may include as a dopant, styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), and/or N-(4 ((E)-2-(6((E)-4-(diphenylamino)styryl)naphthalen-2-yl) vinyl)phenyl)-N-phenylbenzenamine (N-BDAVBi)), perylene and the derivatives thereof (for example, 2,5,8,11-tetra-t-butylperylene (TBP)), pyrene and the derivatives thereof (for example, 1,1-dipyrene, 1,4-dipyrenylbenzene, and/or 1,4-bis(N,N-diphenylamino)pyrene), etc.

In one or more embodiments, the emission layer EML may include two dopant materials having different lowest triplet excitation energy levels (T1 levels) from each other. In the organic electroluminescence device 10 of the present embodiments, the emission layer EML may include a host having the first lowest triplet excitation energy level, a first dopant having the second lowest triplet excitation energy level which is lower than the first lowest triplet excitation energy level, and a second dopant having the third lowest triplet excitation energy level which is lower than the second lowest triplet excitation energy level. In one or more embodiments, the emission layer EML may include the above-described fused polycyclic compound of the present embodiments as the first dopant.

In the organic electroluminescence device 10 of the present embodiments, including the host, the first dopant, and the second dopant in the emission layer EML, the first dopant may be a delayed fluorescence dopant, and the second dopant may be a fluorescence dopant. In addition, in the organic electroluminescence device 10 of the present embodiments, the fused polycyclic compound represented by Formula 1 may play the role of an assistant dopant.

For example, in case where the emission layer EML of the organic electroluminescence device 10 of the present embodiments includes a plurality of dopants, the emission layer EML may include the polycyclic compound of the present embodiments as the first dopant, and the above-described dopant material as the second dopant. For example, in case where the emission layer EML emits blue light, the emission layer EML may further include, as the second dopant, any one selected from styryl derivatives (for example, 1,4-bis[2-(3-N-ethylcarbazoryl)vinyl]benzene (BCzVB), 4-(di-p-tolylamino)-4'-[(di-p-tolylamino)styryl] stilbene (DPAVB), and/or N-(4-((E)-2-(6-((E)-4-(diphenylamino)styryl)naphthalen-2-yl)vinyl)phenyl)-N-phenylbenzenamine (N-BDAVBi)), perylene and the derivatives thereof (for example, 2,5,8,11-tetra-t-butylperylene (TBP)), pyrene and the derivatives thereof (for example, 1,1-dipyrene, 1,4-dipyrenylbenzene, 1,4-bis(N,N-diphenylamino)pyrene), etc. In addition, a metal complex and/or an organometallic complex, including Ir, Pt, Pd, etc. as a core atom may be used as the second dopant.

Meanwhile, in the organic electroluminescence device 10 of the present embodiments, including the fused polycyclic compound of the present embodiments as the first dopant of the emission layer EML, the emission layer EML may emit green light or red light, and in this case, the second dopant material used may be the above-described dopant, a suitable green fluorescence dopant, or a suitable red fluorescence dopant.

In the organic electroluminescence device 10 of the present embodiments, the emission layer EML may be a phosphorescence emission layer. For example, the fused polycyclic compound according to the present embodiments may be included in the emission layer EML as a phosphorescence host material.

In the organic electroluminescence device 10 of the present embodiments, as shown in FIGS. 1 to 4, the electron transport region ETR is disposed on the emission layer EML. The electron transport region ETR may include at least one of an electron blocking layer HBL, an electron transport layer ETL, or an electron injection layer EIL. However, an embodiment of the inventive concept is not limited thereto.

The electron transport region ETR may have a single layer formed using a single material, a single layer formed using a plurality of different materials, or a multilayer structure having a plurality of layers formed using a plurality of different materials.

For example, the electron transport region ETR may have a single layer structure of an electron injection layer EIL or an electron transport layer ETL, or a single layer structure formed using an electron injection material and an electron transport material. In addition, the electron transport region ETR may have a single layer structure having a plurality of different materials, or a structure laminated from the emission layer EML of electron transport layer ETL/electron injection layer EIL, or hole blocking layer HBL/electron transport layer ETL/electron injection layer EIL, but the present disclosure is not limited thereto. The thickness of the electron transport region ETR may be, for example, from about 100 Å to about 1,500 Å.

The electron transport region ETR may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method.

If the electron transport region ETR includes an electron transport layer ETL, the electron transport region ETR may include an anthracene-based compound. The electron transport region may include, for example, tris(8-hydroxyquinolinato)aluminum ($Alq_3$), 1,3,5-tri[(3-pyridyl)-phen-3-yl] benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tris(1-phenyl-1H-benzo[d] imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate ($Bebq_2$), 9,10-di(naphthalene-2-yl)anthracene (ADN), diphenyl(4-(triphenylsilyl)phenyl)phosphine oxide (TSPO1), or a mixture thereof, but the present disclosure is not limited thereto. The thickness of the electron transport layer ETL may be from about 100 Å to about 1,000 Å and may be, for example, from about 150 Å to about 500 Å. If the thickness of the electron transport layer ETL satisfies the above-described range, satisfactory (or suitable) electron transport properties may be obtained without substantial increase of a driving voltage.

If the electron transport region ETR includes the electron injection layer EIL, the electron transport region ETR may include a metal halide (such as LiF, NaCl, CsF, RbCl, RbI, and/or CuI), a metal in lanthanides (such as Yb), a metal oxide (such as $Li_2O$ and/or BaO), and/or lithium quinolate (LiQ). However, an embodiment of the inventive concept is not limited thereto. The electron injection layer EIL also may be formed using a mixture material of an electron transport material and an insulating organo metal salt. The organo metal salt may be a material having an energy band gap of about 4 eV or more. The organo metal salt may include, for example, metal acetates, metal benzoates, metal acetoacetates, metal acetylacetonates, and/or metal stearates. The thickness of the electron injection layer EIL may be from about 1 Å to about 500 Å, and from about 3 Å to about 300 Å. If the thickness of the electron injection layer EIL satisfies the above described range, satisfactory (or suitable) electron injection properties may be obtained without inducing substantial increase of a driving voltage.

The electron transport region ETR may include a hole blocking layer HBL as described above. The hole blocking layer HBL may include, for example, at least one of 2,9-dimethyl-4,7-diphenyl-1,10-phenanthroline (BCP), or 4,7-diphenyl-1,10-phenanthroline (Bphen). However, an embodiment of the inventive concept is not limited thereto.

The second electrode EL2 is provided on the electron transport region ETR. The second electrode EL2 may be a common electrode or a cathode. The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayered structure including a reflective layer or a transflective layer formed using any of the above-described materials and a transparent conductive layer formed using ITO, IZO, ZnO, ITZO, etc.

The second electrode EL2 may be connected with an auxiliary electrode. If the second electrode EL2 is connected with the auxiliary electrode, the resistance of the second electrode EL2 may decrease.

Meanwhile, on the second electrode EL2 of the organic electroluminescence device 10 of the present embodiments, a capping layer (CPL) may be further disposed. The capping layer (CPL) may include, for example, α-NPD, NPB, TPD, m-MTDATA, $Alq_3$, CuPc, N4,N4,N4',N4'-tetra(biphenyl-4-yl) biphenyl-4,4'-diamine (TPD15), 4,4',4''-tris(carbazol sol-9-yl) triphenylamine (TCTA), N, N'-bis(naphthalene-1-yl), etc.

The organic electroluminescence device 10 according to an embodiment of the inventive concept includes the fused polycyclic compound of the present embodiments in the emission layer EML disposed between the first electrode EL1 and the second electrode EL2, thereby showing high emission efficiency properties. In addition, the fused polycyclic compound according to the present embodiments may be a thermally activated delayed fluorescence dopant, and the emission layer EML may include the fused polycyclic compound of the present embodiments to emit thermally activated delayed fluorescence. Accordingly, high emission efficiency properties may be achieved.

The fused polycyclic compound of the present embodiments may be included in an organic layer other than the emission layer EML as a material for the organic electroluminescence device 10. For example, the organic electroluminescence device 10 according to an embodiment of the inventive concept may include the fused polycyclic compound in at least one organic layer disposed between the first electrode EL1 and the second electrode EL2, or in the capping layer (CPL) disposed on the second electrode EL2.

The fused polycyclic compound of the present embodiments includes a double nitrogen-containing hetero substituent, which is obtained by additionally substituting a nitrogen-containing second hetero substituent at a nitrogen-containing first hetero substituent, when compared with the related art polycyclic compound including two nitrogen atoms and one boron atom, and may relatively decrease a difference ($\Delta E_{ST}$) between the lowest triplet excitation energy level (T1 level) and the lowest singlet excitation energy level (S1 level). Accordingly, if used as a material for an organic electroluminescence device, the efficiency of the organic electroluminescence device may be further improved.

Hereinafter, the fused polycyclic compound according to embodiments of the inventive concept and the organic electroluminescence device of the present embodiments will be particularly explained referring to particular embodiments and comparative embodiments. The following embodiments are only illustrations to assist the understanding of the inventive concept, and the scope of the inventive concept is not limited thereto.

EXAMPLES

1. Synthesis of Fused Polycyclic Compound

First, the synthetic (synthesis) method of the fused polycyclic compound according to an embodiment will be particularly explained referring to the synthetic methods of Compound 1, Compound 7, Compound 20, and Compound 21. However, the synthetic methods of the fused polycyclic compounds explained below are only example embodiments, and the synthetic method of the fused polycyclic compound according to embodiments of the inventive concept is not limited thereto.

(1) Synthesis of Compound 1

Fused Polycyclic Compound 1 according to an embodiment may be synthesized, for example, by Reaction 1 and Reaction 2 below.

Synthesis of Intermediate Compound I-1

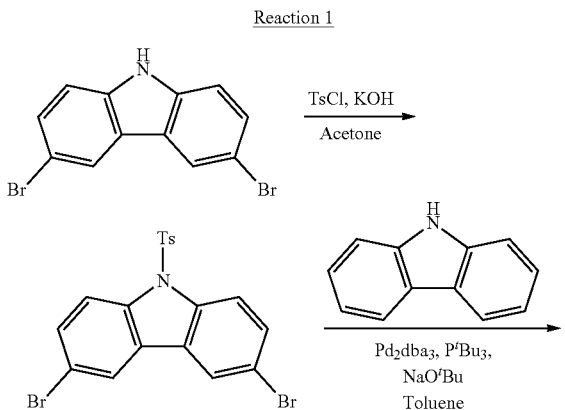

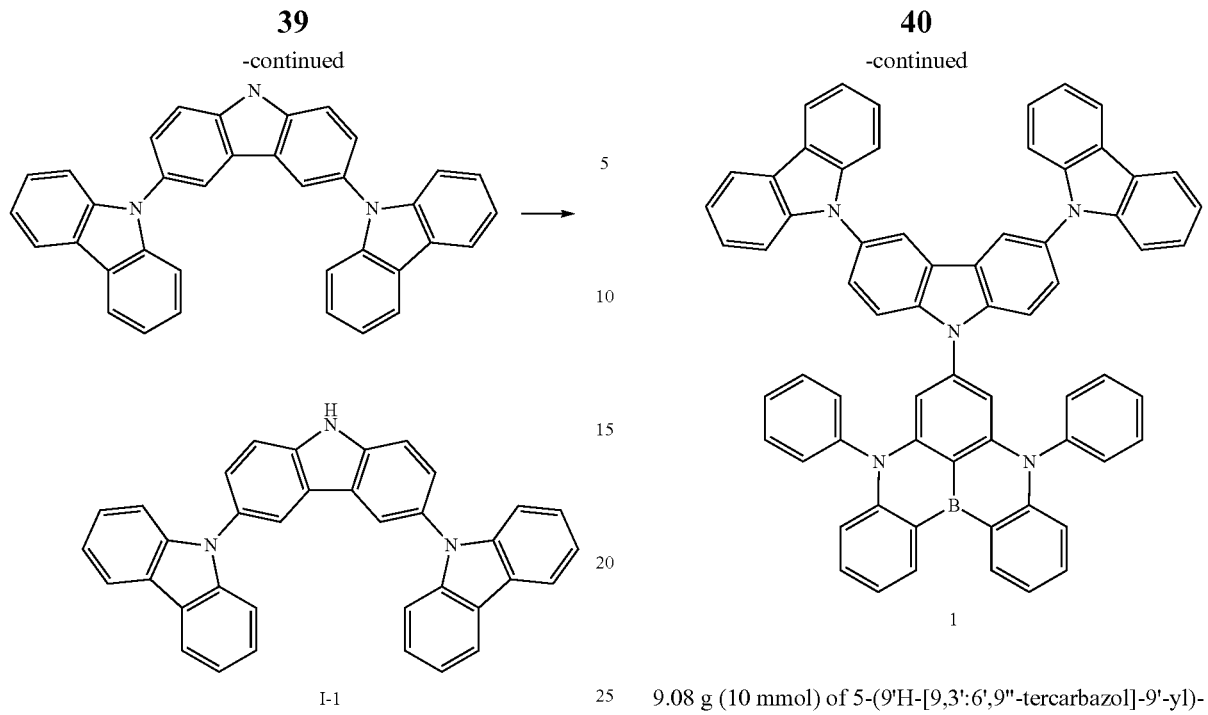

Synthesis of Compound 1

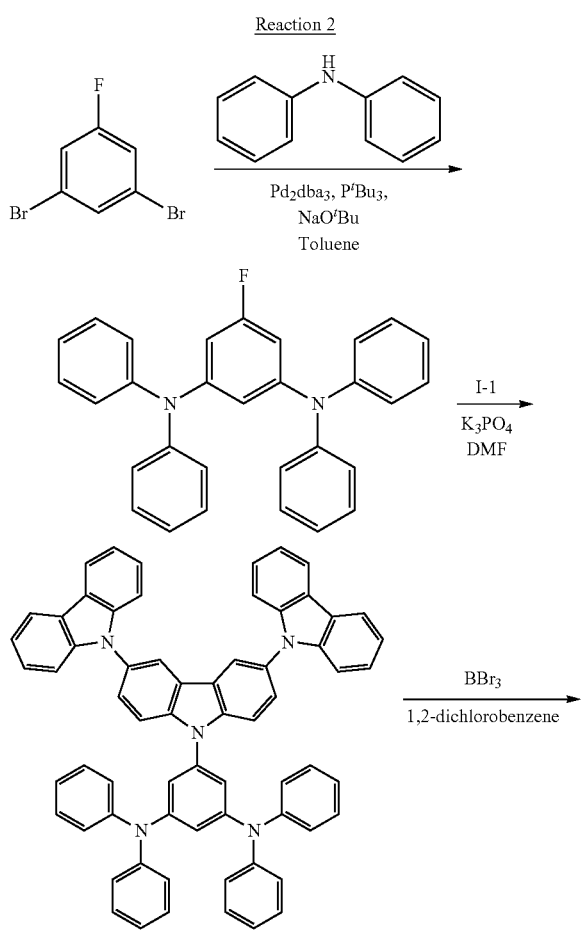

9.08 g (10 mmol) of 5-(9'H-[9,3':6',9"-tercarbazol]-9'-yl)-N1,N1,N3,N3-tetraphenylbenzene-1,3-diamine was dissolved in 60 ml of 1,2-dichlorobenzene, and $BBr_3$ (30 mmol) was added at about 0° C. Then, the reactants were stirred at about 150° C. for about 15 hours, and the temperature was decreased to room temperature. Water was added thereto and washing with 30 ml of methylene chloride was carried out three times. The methylene chloride layer thus washed was dried with $MgSO_4$, the solvents were evaporated, and the crude product was separated by silica gel chromatography to obtain 3.66 g (yield 40%) of Compound 1. From confirmation results through Mass Spectrometry-Fast Atom Bombardment (MS/FAB) and $^1$H NMR, the product thus produced had a molecular formula of $C_{66}H_{42}BN_5$ and a molecular weight of 915.37. From the results, the compound thus obtained was identified as Compound 1.

(2) Synthesis of Compound 7

Fused Polycyclic Compound 7 according to an embodiment may be synthesized, for example, by Reaction 3 and Reaction 4 below.

Synthesis of Intermediate Compound I-2

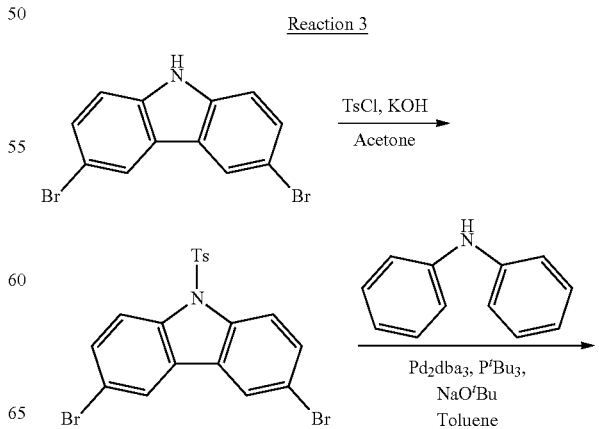

41

-continued

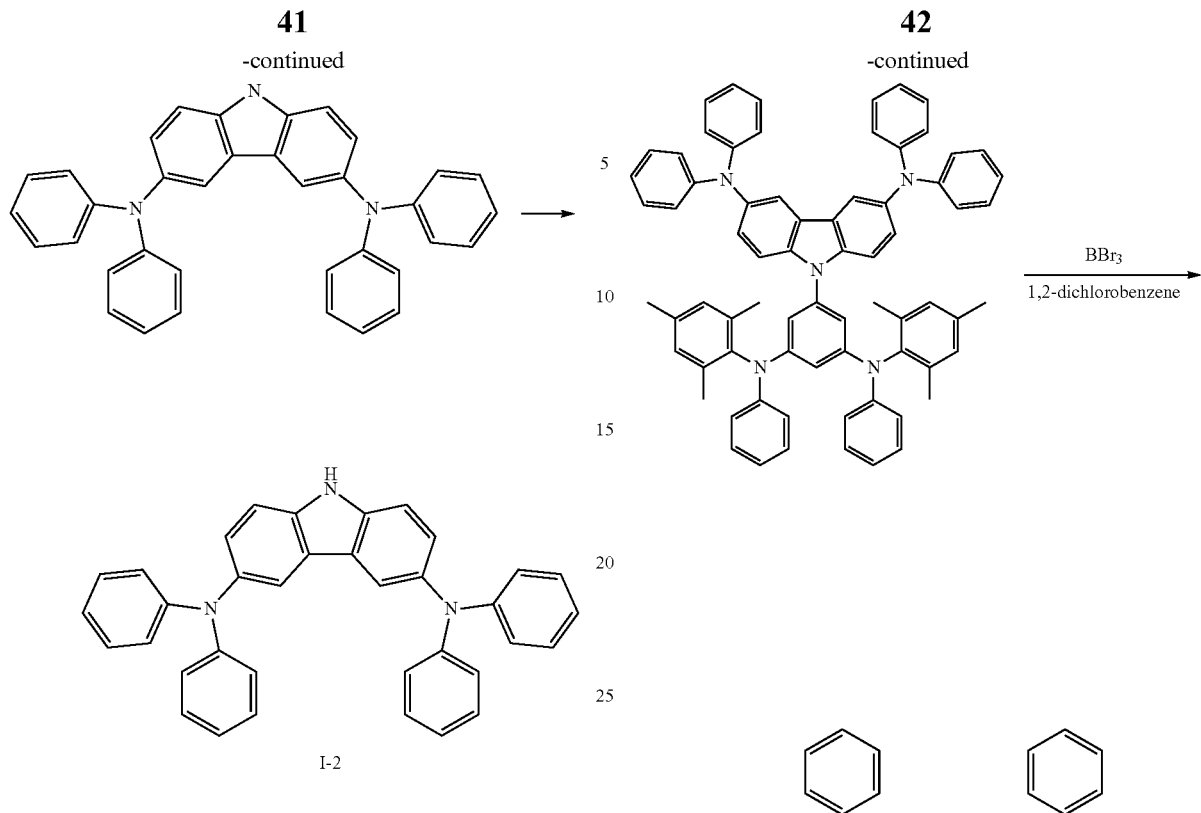

I-2

Synthesis of Compound 7

42

-continued

7

3.68 g (yield 36%) of Compound 7 was synthesized by the same (or substantially the same) method as that used for synthesizing Compound 1, except for using diphenylamine instead of carbazole in Reaction 1, using 2,4,6-trimethyl-N-phenylaniline instead of diphenylamine in Reaction 2, and using 9.96 g (10 mmol) of 9-(3,5-bis(mesityl(phenyl)amino)phenyl)-N3,N3,N6,N6-tetraphenyl-9H-carbazole-3,6-diamine and $BBr_3$ (30 mmol). From confirmation results through MS/FAB and $^1$H NMR, the product thus produced had a molecular formula of $C_{72}H_{58}BN_5$ and a molecular weight of 1003.50. From the results, the compound thus obtained was identified as Compound 7.

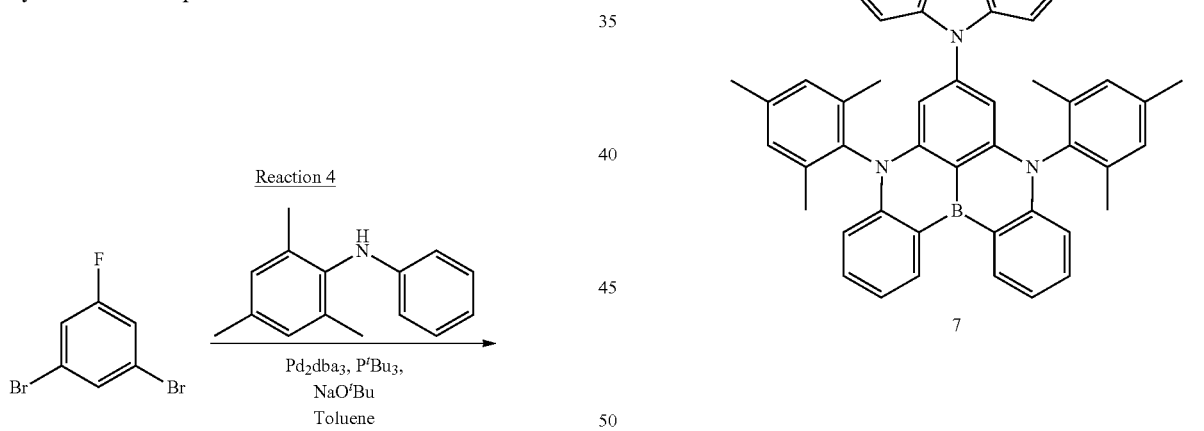

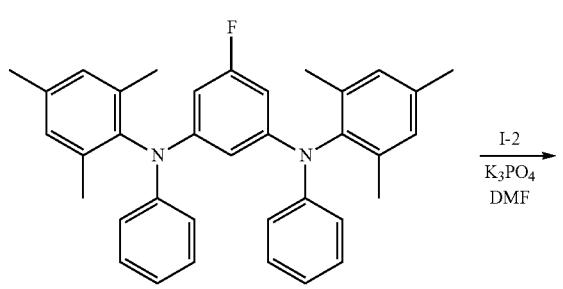

(3) Synthesis of Compound 20

Fused Polycyclic Compound 20 according to an embodiment may be synthesized, for example, by Reaction 5 below.

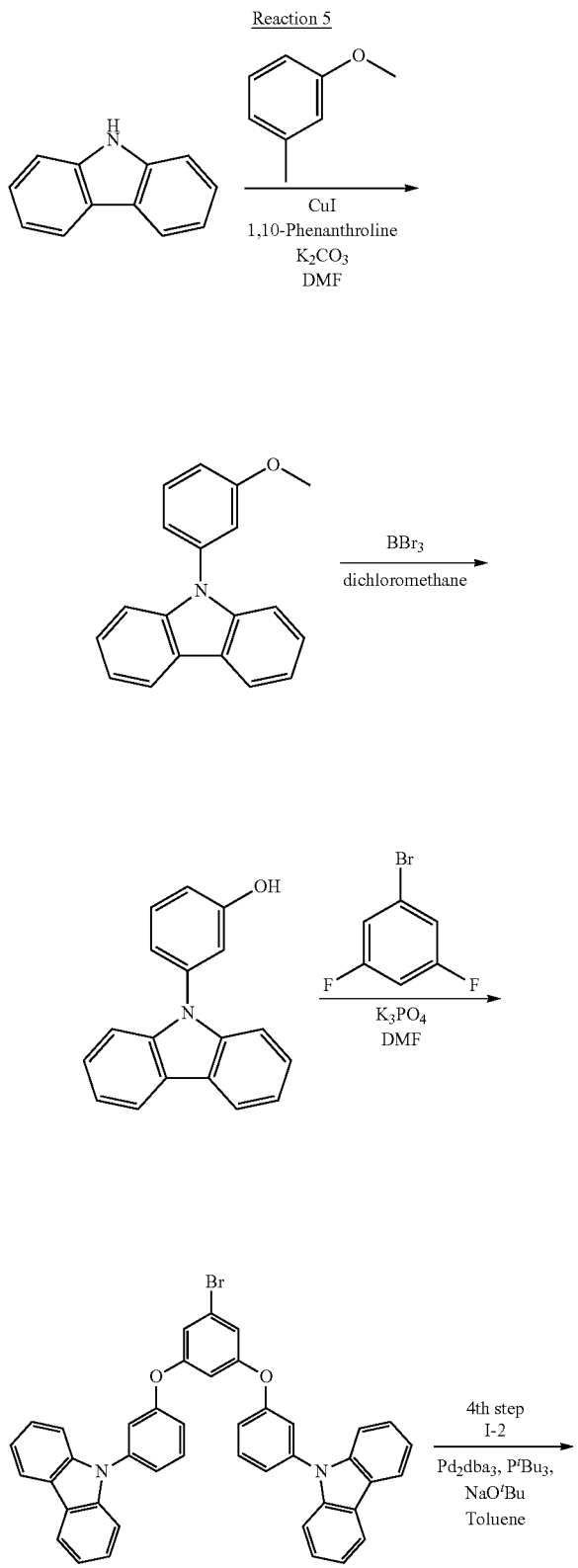

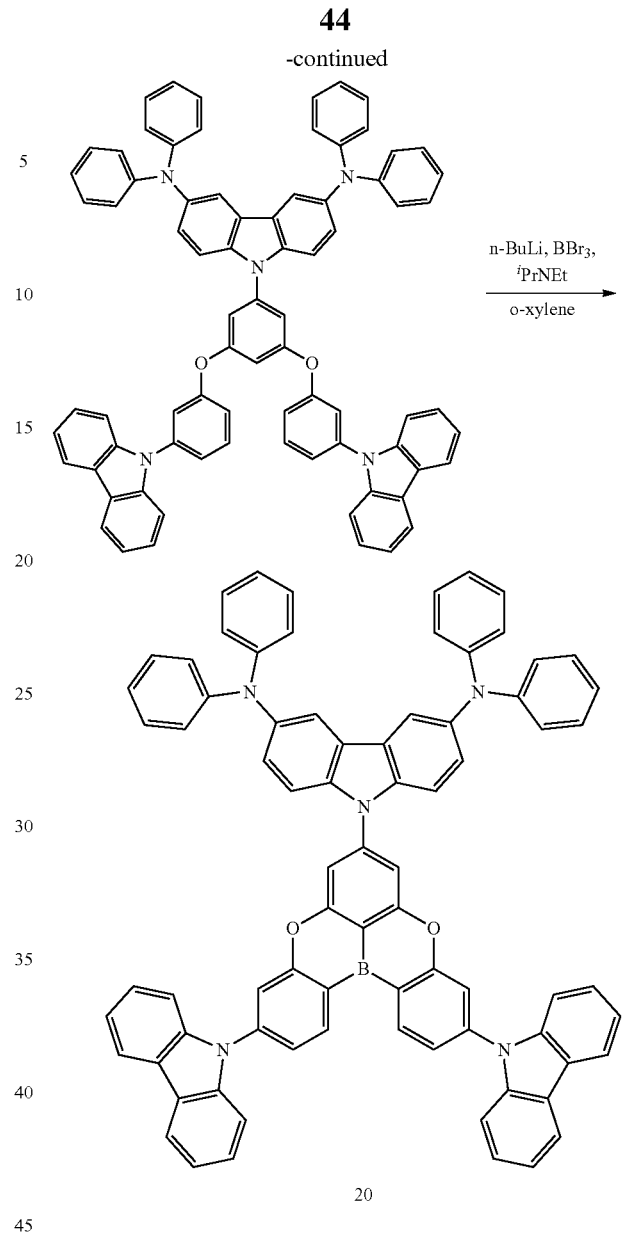

Intermediate I-2 prepared in Reaction 3 was used in step 4.

10.92 g (10 mmol) of 9-(3,5-bis(3-(9H-carbazol-9-yl)phenoxy)phenyl)-N3,N3,N6,N6-tetraphenyl-9H-carbazole-3,6-diamine was dissolved in 60 ml of o-xylene, and 10 ml (25 mmol) of 2.5 M n-BuLi was added at about −30° C. Then, the reactants were stirred at about 70° C. for about 1 hour, and BBr$_3$ (30 mmol) was added at about 0° C. dropwisely. The reactants were stirred at about 150° C. for about 15 hours and the temperature was increased to room temperature. Water was added thereto and washing with 30 ml of ethyl acetate was carried out three times. The ethyl acetate layer thus washed was dried with MgSO$_4$, the solvents were evaporated, and the crude product was separated by silica gel chromatography to obtain 201.1 g (yield 10%) of Compound 20. From confirmation results through MS/FAB and $^1$H NMR, the product thus produced had a molecular formula of $C_{78}H_{50}BN_5O_2$ and a molecular weight of 1099.45. From the results, the compound thus obtained was identified as Compound 20.

(4) Synthesis of Compound 21
Fused Polycyclic Compound 21 according to an embodiment may be synthesized, for example, by Reaction 6 below.
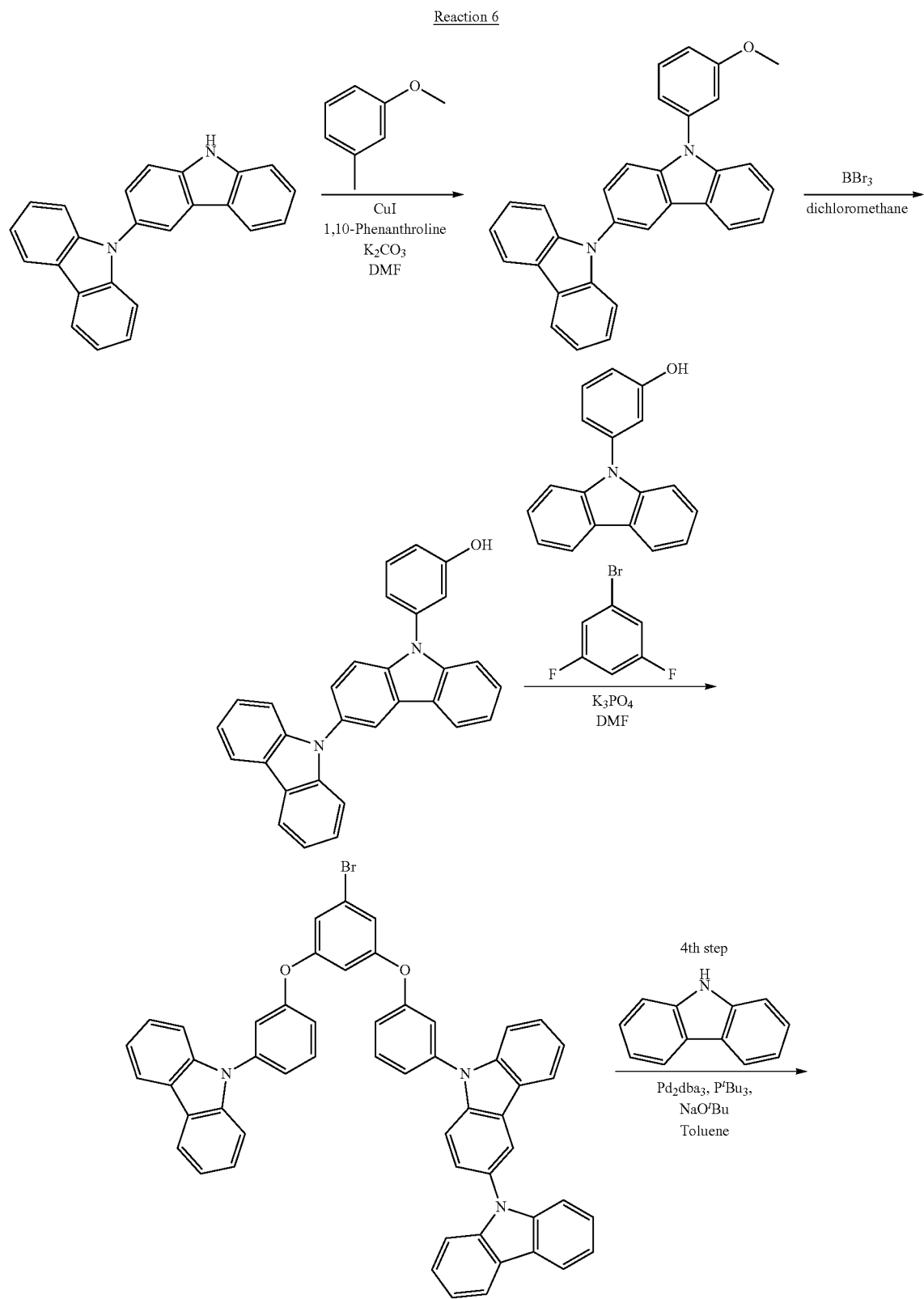

-continued

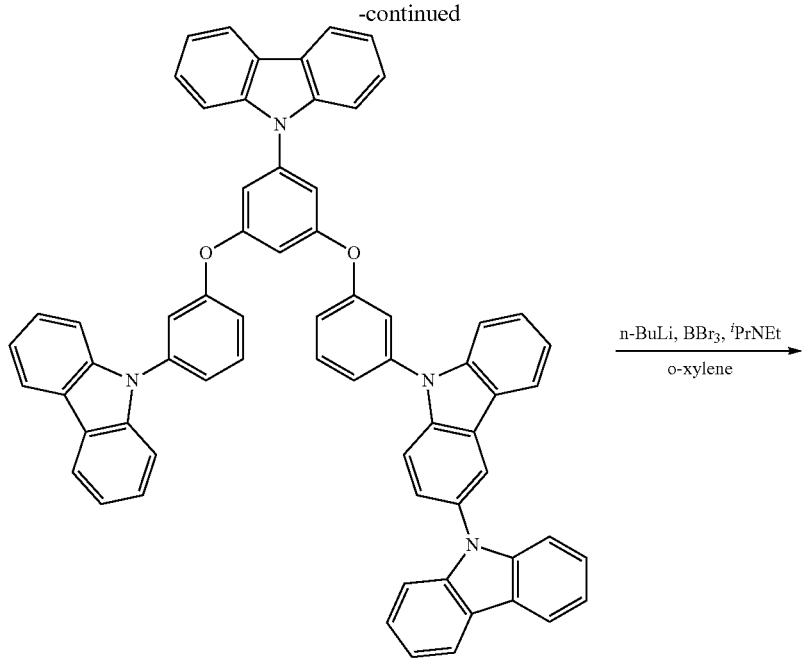

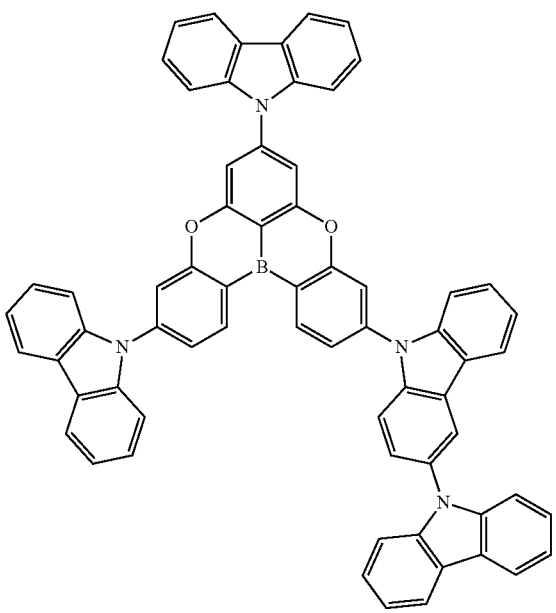

21

Compared to Reaction 5, 9H-3,9'-bicarbazole was used in Reaction 6 instead of carbazole, and carbazole was used instead of Intermediate I-2 in step 4.

0.75 g (yield 8%) of Compound 21 was obtained by the same (or substantially the same) method as that used for synthesizing Compound 20, by using 9.23 g (10 mmol) of 9-(3-(3-(3-(9H-carbazol-9-yl)phenoxy)-5-(9H-carbazol-9-yl)phenoxy)phenyl)-9H-3,9'-bicarbazole, 10 ml (25 mmol) of 2.5 M n-BuLi, and $BBr_3$ (30 mmol). From confirmation results through MS/FAB and $^1$H NMR, the product thus produced had a molecular formula of $C_{66}H_{39}BN_4O_2$ and a molecular weight of 930.36. From the results, the compound thus obtained was identified as Compound 21.

2. Evaluation of Energy Level of Fused Polycyclic Compound
The compounds used in Example 1 to Example 4 and Comparative Example 1 to Comparative Example 8 are shown in Table 1.
TABLE 1
Compound 1
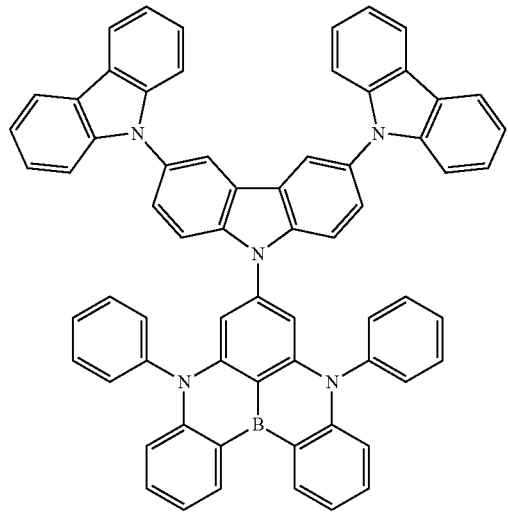
1
Comparative Compound C3
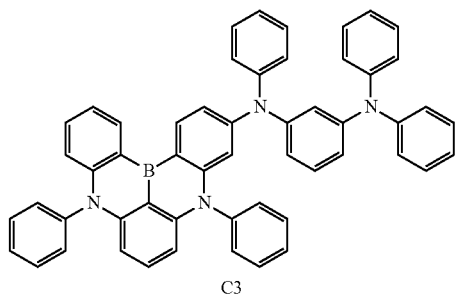
C3
Compound 7
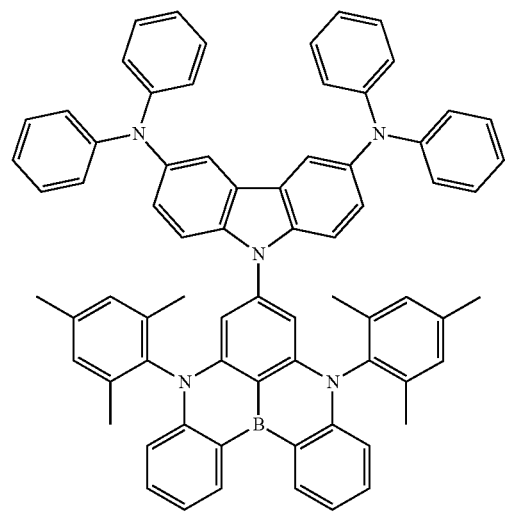
7
Comparative Compound C4
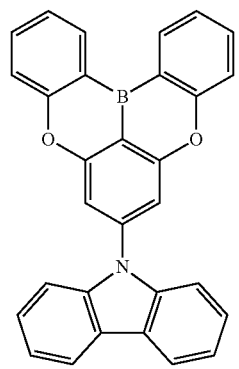
C4

TABLE 1-continued
| Compound 20 | 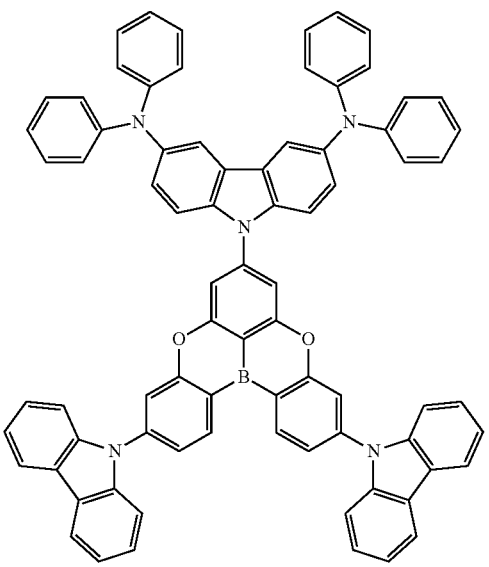 20 | Comparative Compound C5 | 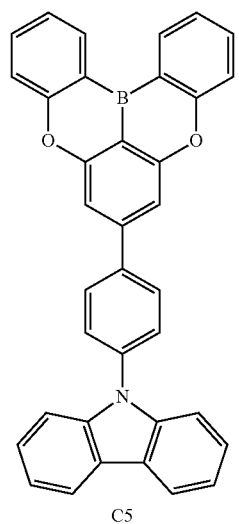 C5 |
|---|---|---|---|
| Compound 21 | 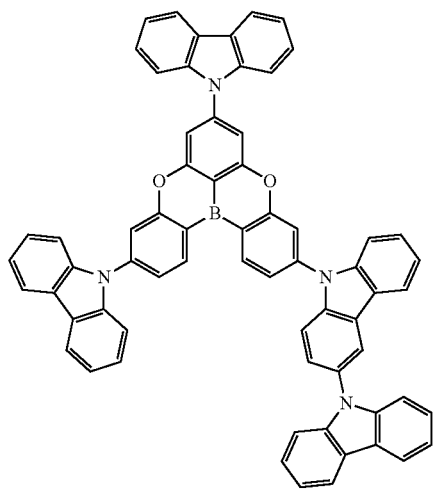 21 | Comparative Compound C6 | 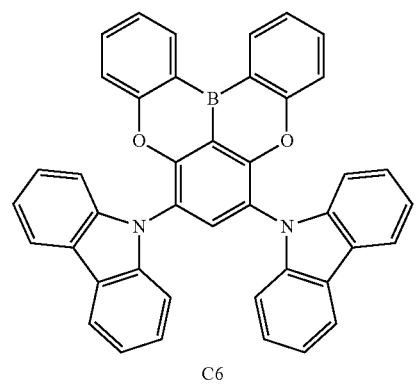 C6 |

TABLE 1-continued

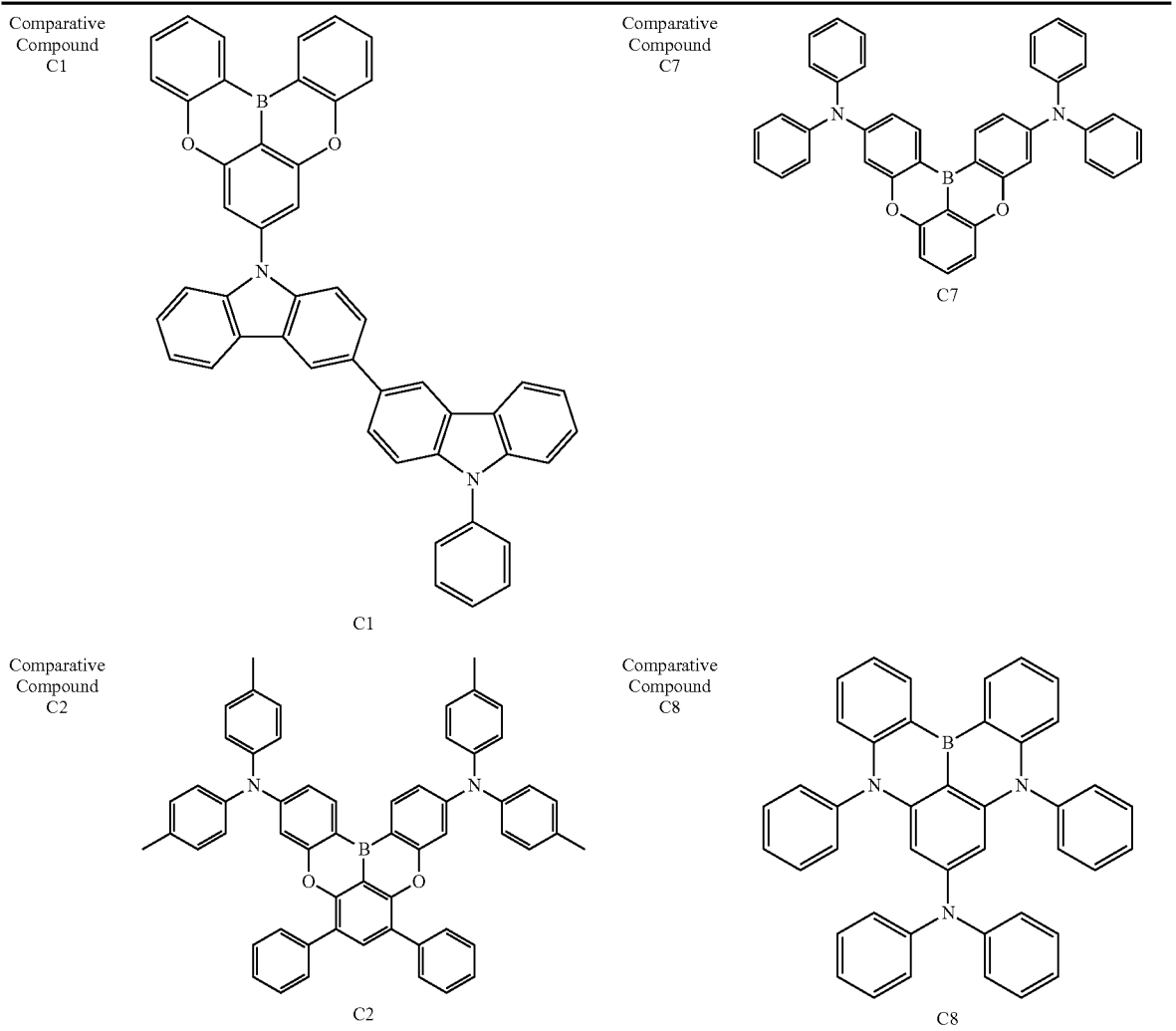

In Table 2 below, the lowest singlet excitation energy level (S1 level), the lowest triplet excitation energy level (T1 level), and $E_{ST}$ of Compound 1, Compound 7, Compound 20, and Compound 21 (which are the Example Compounds), and Comparative Compound C1 to Comparative Compound C8 are shown. The energy level values in Table 2 were calculated by a nonempirical molecular orbital method. Particularly, the calculation was conducted by B3LYP/6-31G(d) using Gaussian 09 of Gaussian Co. $E_{ST}$ represents a difference between the lowest singlet excitation energy level (S1 level) and the lowest triplet excitation energy level (T1 level).

TABLE 2

| Division | Compound type | S1 level (eV) | T1 level (eV) | $E_{ST}$ (eV) |
|---|---|---|---|---|
| Example 1 | Compound 1 | 2.99 | 2.64 | 0.35 |
| Example 2 | Compound 7 | 2.88 | 2.64 | 0.24 |
| Example 3 | Compound 20 | 2.20 | 2.16 | 0.04 |
| Example 4 | Compound 21 | 2.72 | 2.67 | 0.05 |
| Comparative Example 1 | Comparative Compound C1 | 2.82 | 2.73 | 0.09 |
| Comparative Example 2 | Comparative Compound C2 | 2.93 | 2.55 | 0.38 |

TABLE 2-continued

| Division | Compound type | S1 level (eV) | T1 level (eV) | $E_{ST}$ (eV) |
|---|---|---|---|---|
| Comparative Example 3 | Comparative Compound C3 | 3.06 | 2.61 | 0.45 |
| Comparative Example 4 | Comparative Compound C4 | 3.11 | 2.93 | 0.18 |
| Comparative Example 5 | Comparative Compound C5 | 3.15 | 2.84 | 0.31 |
| Comparative Example 6 | Comparative Compound C6 | 2.79 | 2.65 | 0.14 |
| Comparative Example 7 | Comparative Compound C7 | 3.01 | 2.60 | 0.41 |
| Comparative Example 8 | Comparative Compound C8 | 3.13 | 2.64 | 0.49 |

It could be confirmed that Compound 1, Compound 7, Compound 20, and Compound 21, which are the Example Compounds, showed small $E_{ST}$ values. Since Compound 1, Compound 7, Compound 20, and Compound 21, which are the Example Compounds showed small $E_{ST}$ values of about 0.4 eV or less, these compounds could be used as dopant materials for thermally activated delayed fluorescence, with high light efficiency.

3. Manufacture and Evaluation of Organic Electroluminescence Device Including Fused Polycyclic Compound Manufacture of Organic Electroluminescence Device An organic electroluminescence device of the present embodiments including the fused polycyclic compound of the present embodiments in an emission layer was manufactured by a method described below. Organic electroluminescence devices of Example 1 to Example 4 were manufactured using the fused polycyclic compounds of Compound 1, Compound 7, Compound 20, and Compound 21, which were Example Compounds, as dopant materials for an emission layer. The organic electroluminescence devices of Comparative Example 1 to Comparative Example 8 were manufactured using Comparative Compound C1 to Comparative Compound C8 as dopant materials in an emission layer.

On a glass substrate, ITO with a thickness of about 1,200 Å was patterned and washed with isopropyl alcohol and ultra-pure water, washed with ultrasonic waves for about 5 minutes, exposed to UV for about 30 minutes and treated with ozone. Then, NPD was vacuum deposited to a thickness of about 300 Å to form a hole injection layer, and TCTA was vacuum deposited to a thickness of about 200 Å, and CzSi was vacuum deposited to a thickness of about 100 Å to form a hole transport layer.

On the hole transport layer, mCP and the fused polycyclic compound of the present embodiments of the inventive concept or Comparative Compound were co-deposited in a ratio of 99:1 to form an emission layer with a thickness of about 200 Å. The emission layer formed by the co-deposition, was formed by mixing Compound 1, Compound 7, Compound 20, and Compound 21, respectively, with mCP to prepare Example 1 to Example 4, respectively, or by mixing Comparative Compound C1 to Comparative Compound C8, respectively, with mCP to prepare Comparative Example 1 to Comparative Compound 8, respectively.

On the emission layer, an electron transport layer was formed using TPSO1 to a thickness of about 200 Å, and then, an electron injection layer was formed by depositing TPBi to a thickness of about 300 Å and Yb to a thickness of about 10 Å in order. Then, a second electrode was formed using aluminum (Al) to a thickness of about 3,000 Å on the electron injection layer.

Compounds used in the Examples and Comparative Examples are shown below.

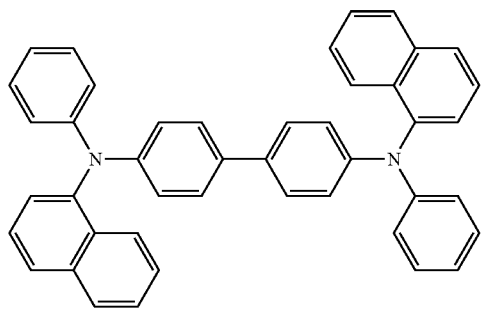

NPD

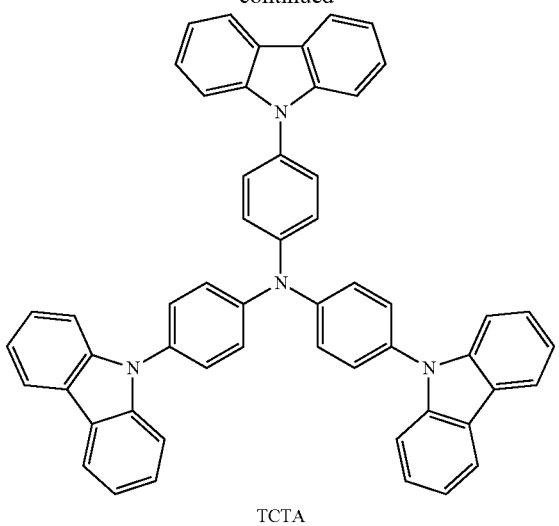

TCTA

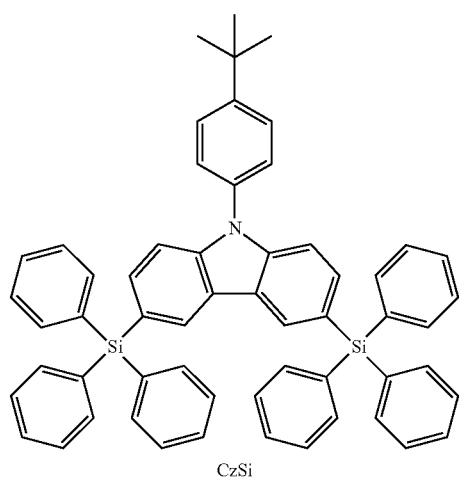

CzSi

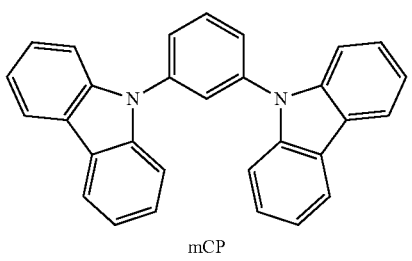

mCP

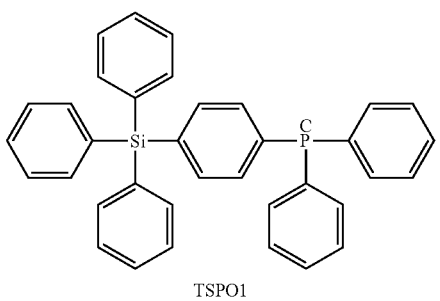

TPSO1

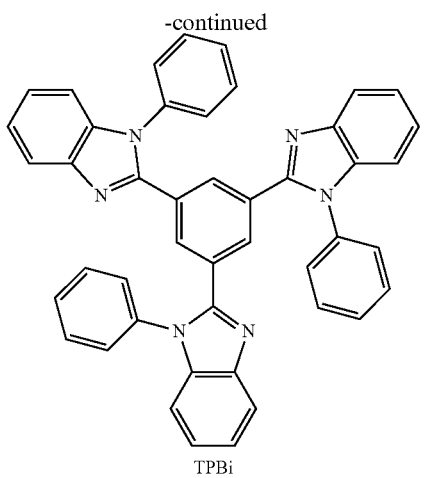

TPBi

Evaluation of Properties of Organic Electroluminescence Device

In Table 3, the evaluation results of the organic electroluminescence devices of Example 1 to Example 4, and Comparative Example 1 to Comparative Example 8 are shown. In Table 3, the driving voltage, emission efficiency and external quantum efficiency (EQE) of the organic electroluminescence devices thus manufactured are compared and shown.

In the evaluation results of the properties on the Examples and the Comparative Examples, as shown in Table 3, the voltage and current density were measured using a source meter (Keithley Instrument Co., 2400 series), and the external quantum efficiency (EQE) was measured using an external quantum efficiency measurement apparatus C9920-12 of HAMAMATSU Photonics Co. The emission efficiency represents a current efficiency value with respect to current density of 10 mA/cm$^2$.

TABLE 3

| Device manufacturing example | Dopant material of emission layer | Driving voltage (V) | Emission efficiency (cd/A) | EQE (%) | Color of emitted light |
|---|---|---|---|---|---|
| Example 1 | Compound 1 | 4.9 | 18.6 | 17.9 | Blue |
| Example 2 | Compound 7 | 4.7 | 22.2 | 21.4 | Blue |
| Example 3 | Compound 20 | 5.0 | 23.8 | 23.0 | Blue |
| Example 4 | Compound 21 | 5.5 | 21.7 | 20.4 | Blue |
| Comparative Example 1 | Comparative Compound C1 | 6.4 | 15.3 | 14.0 | Blue |
| Comparative Example 2 | Comparative Compound C2 | 6.5 | 15.0 | 13.9 | Blue |
| Comparative Example 3 | Comparative Compound C3 | 5.7 | 14.8 | 13.3 | Blue |
| Comparative Example 4 | Comparative Compound C4 | 5.9 | 14.2 | 13.1 | Blue |
| Comparative Example 5 | Comparative Compound C5 | 6.1 | 14.4 | 13.4 | Blue |
| Comparative Example 6 | Comparative Compound C6 | 6.3 | 13.9 | 12.8 | Blue |
| Comparative Example 7 | Comparative Compound C7 | 5.8 | 15.2 | 14.3 | Blue |
| Comparative Example 8 | Comparative Compound C8 | 5.7 | 15.4 | 14.5 | Blue |

Referring to the results in Table 3, the organic electroluminescence devices according to the Examples, using the fused polycyclic compound according to embodiments of the inventive concept as a material for an emission layer, were found to show lower driving voltage values and higher emission efficiency and external quantum efficiency, when compared with the Comparative Examples. In case of the Example Compounds, TADF properties are shown by using multiple resonance phenomenon by aromatic rings which form fused rings, and may have small EST values by including a double nitrogen-containing hetero substituent which is obtained by substituting a nitrogen-containing first hetero substituent in addition to a nitrogen-containing second hetero substituent at a ring which forms the fused ring. Accordingly, the organic electroluminescence devices of the Examples may show improved emission efficiency than the organic electroluminescence devices of the Comparative Examples. Particularly, the organic electroluminescence device of the present embodiments may accomplish high emission efficiency in a blue light wavelength region by including the fused polycyclic compound of the present embodiments as a material for an emission layer.

The organic electroluminescence device of the present embodiments may show improved device characteristics showing high emission efficiency in a blue region.

The fused polycyclic compound of the present embodiments may be included in an emission layer of an organic electroluminescence device and may contribute to increasing the efficiency of the organic electroluminescence device.

Although the exemplary (example) embodiments of the present invention have been described, it is understood that the present invention should not be limited to these exemplary (example) embodiments but various changes and modifications can be made by one ordinary skilled in the art within the spirit and scope of the present invention as hereinafter defined by the following claims and their equivalents.

What is claimed is:
1. An organic electroluminescence device, comprising:
a first electrode;
a second electrode facing the first electrode; and
a plurality of organic layers between the first electrode and the second electrode,
wherein the first electrode and the second electrode are each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, or a compound of two or more selected from them, a mixture of two or more selected from them, or oxides of one or more selected from them, and
wherein at least one organic layer among the plurality of organic layers comprises a fused polycyclic compound represented by Formula 1:

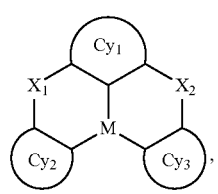

Formula 1 wherein, in Formula 1,
M is B, Al, Ga, or In,
$X_1$ and $X_2$ are each independently NR$_1$, O, S, P(=O)R$_2$, or P(=S)R$_3$,
R$_1$ to R$_3$ are each independently a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_1$ to $R_3$ are optionally combined with an adjacent group to form a ring, $Cy_1$ to $Cy_3$ are each independently a substituted or unsubstituted aromatic hydrocarbon ring, or a substituted or unsubstituted aromatic heterocycle, and any of $Cy_1$ to $Cy_3$ are optionally combined with an adjacent group to form a ring, and at least one among $Cy_1$ to $Cy_3$ is substituted with a substituent represented by Formula 2:

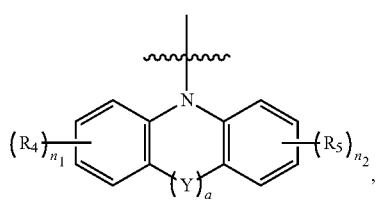

Formula 2 wherein, in Formula 2, $R_4$ and $R_5$ are each independently a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_4$ and $R_5$ are optionally combined with an adjacent group to form a ring, $n_1$ and $n_2$ are each independently an integer of 0 to 4, at least one among $R_4$ and $R_5$ is a substituted or unsubstituted amine group, or a substituted or unsubstituted carbazole group, if $R_4$ is the substituted or unsubstituted amine group, or the substituted or unsubstituted carbazole group, $n_1$ is an integer of 1 to 4, if $R_5$ is the substituted or unsubstituted amine group, or the substituted or unsubstituted carbazole group, $n_2$ is an integer of 1 to 4, Y is a direct linkage, and a is 0 or 1.

2. The organic electroluminescence device of claim 1, wherein the plurality of organic layers comprise:

a hole transport region on the first electrode;

an emission layer on the hole transport region; and an electron transport region on the emission layer, and the emission layer comprises the fused polycyclic compound represented by Formula 1.

3. The organic electroluminescence device of claim 2, wherein the emission layer is to emit delayed fluorescence.

4. The organic electroluminescence device of claim 2, wherein the emission layer is a delayed fluorescence emission layer comprising a first compound and a second compound, and the second compound comprises the fused polycyclic compound represented by Formula 1.

5. The organic electroluminescence device of claim 2, wherein the emission layer comprises:

a first compound having a first lowest triplet excitation energy level;

a second compound having a second lowest triplet excitation energy level which is lower than the first lowest triplet excitation energy level; and a third compound having a third lowest triplet excitation energy level which is lower than the second lowest triplet excitation energy level, and the second compound comprises the fused polycyclic compound represented by Formula 1.

6. The organic electroluminescence device of claim 5, wherein the second compound is a delayed fluorescence material, and the third compound is a phosphorescence material or a fluorescence material.

7. The organic electroluminescence device of claim 1, wherein the fused polycyclic compound represented by Formula 1 is represented by Formula 3:

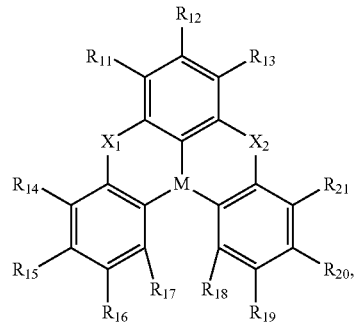

Formula 3 wherein, in Formula 3, $R_{11}$ to $R_{21}$ are each independently a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_{11}$ to $R_{21}$ are optionally combined with an adjacent group to form a ring, at least one among $R_{11}$ to $R_{21}$ is represented by Formula 2, and M, $X_1$, and $X_2$ are the same as defined in Formula 1.

8. The organic electroluminescence device of claim 7, wherein the fused polycyclic compound represented by Formula 3 is represented by Formula 4:

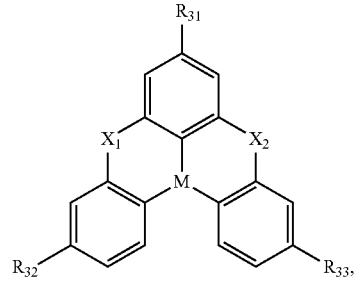

Formula 4 wherein, in Formula 4, $R_{31}$ to $R_{33}$ are each independently a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_{31}$ to $R_{33}$ are optionally combined with an adjacent group to form a ring, at least one among $R_{31}$ to $R_{33}$ is represented by Formula 2, and M, $X_1$, and $X_2$ are the same as defined in Formula 1.

9. The organic electroluminescence device of claim 1, wherein
the substituent represented by Formula 2 is represented by Formula 5-1 or Formula 5-2:

Formula 5-1

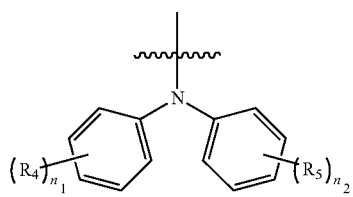

Formula 5-2

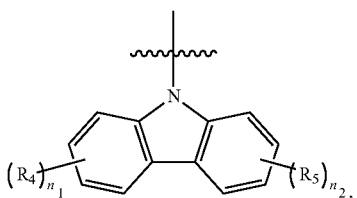

wherein, in Formulae 5-1 and 5-2, $R_4$, $R_5$, $n_1$, and $n_2$ are the same as defined in Formula 2.

10. The organic electroluminescence device of claim 9, wherein
the substituent represented by Formula 2 is represented by any one among Formula 6-1 to Formula 6-4:

Formula 6-1

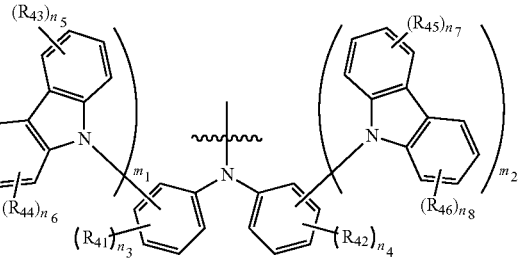

Formula 6-2

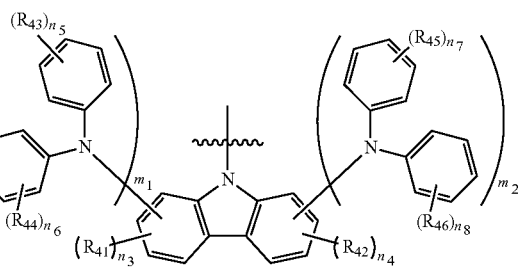

Formula 6-3

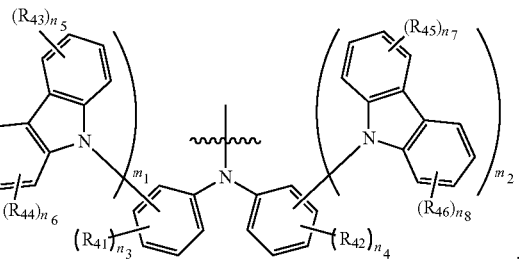

Formula 6-4

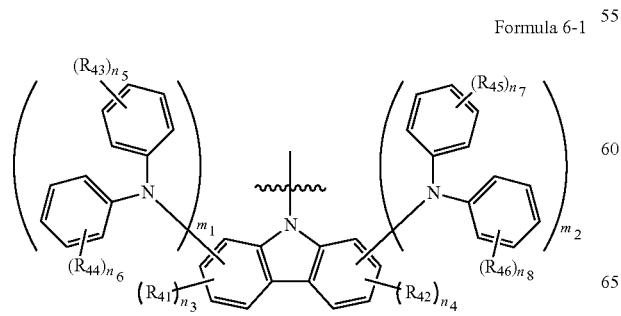

wherein, in Formulae 6-1 to 6-4, $R_{41}$ to $R_{46}$ are each independently a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_{41}$ to $R_{46}$ are optionally combined with an adjacent group to form a ring, $n_3$ and $n_4$ are each independently an integer of 0 to 3, $n_5$ to $n_8$ are each independently an integer of 0 to 4, $m_1$ and $m_2$ are each independently 0 or 1, and at least one of $m_1$ and $m_2$ is 1.

11. The organic electroluminescence device of claim 1, wherein
the substituent represented by Formula 2 is represented by Formula 7-1 or Formula 7-2:

Formula 7-1

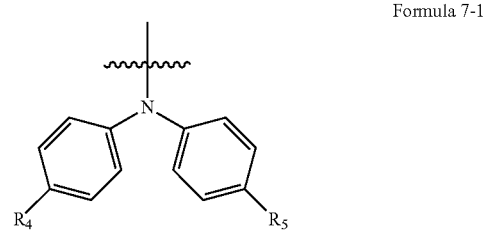

Formula 7-2

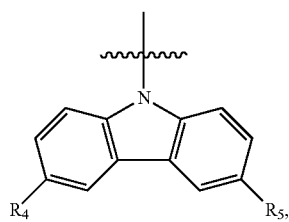

wherein, in Formulae 7-1 and 7-2,

R₄, and R₅ are the same as defined in Formula 2.

12. The organic electroluminescence device of claim 1, wherein

X₁ and X₂ are each independently NR₁, or O, and

R₁ is a substituted or unsubstituted phenyl group.

13. The organic electroluminescence device of claim 1, wherein the fused polycyclic compound represented by Formula 1 is at least one selected among compounds in Compound Group 1:

Compound Group 1

1

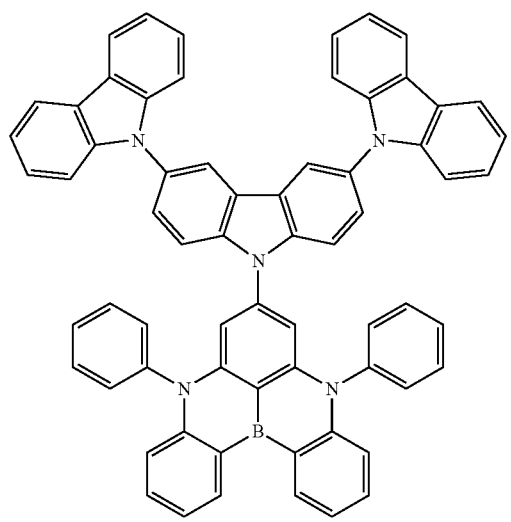

2

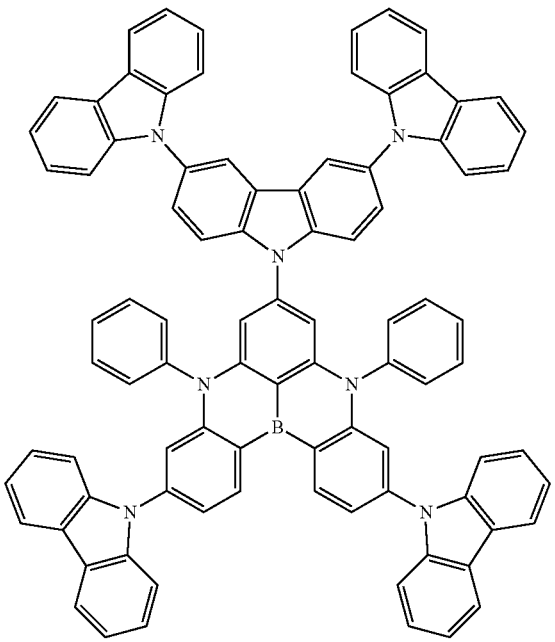

3

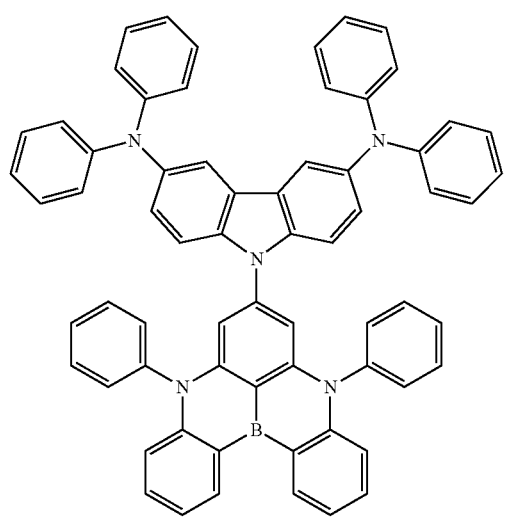

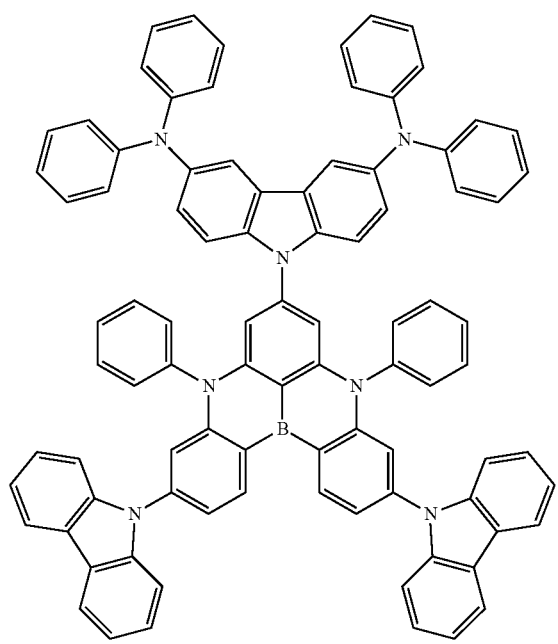
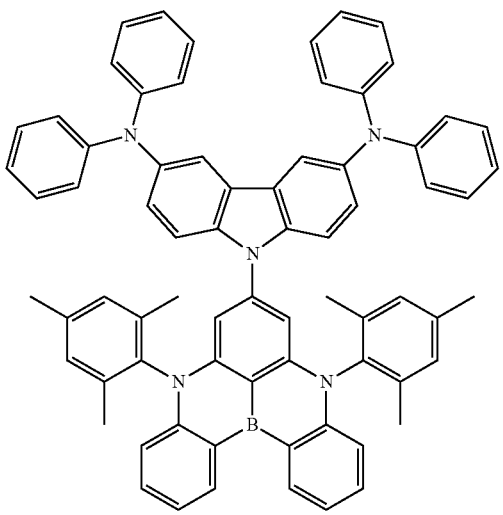
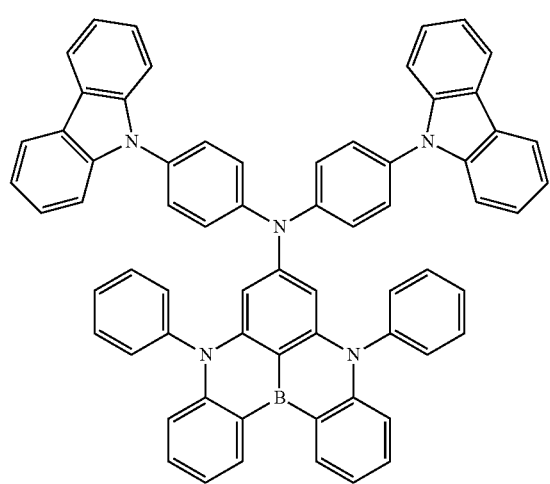
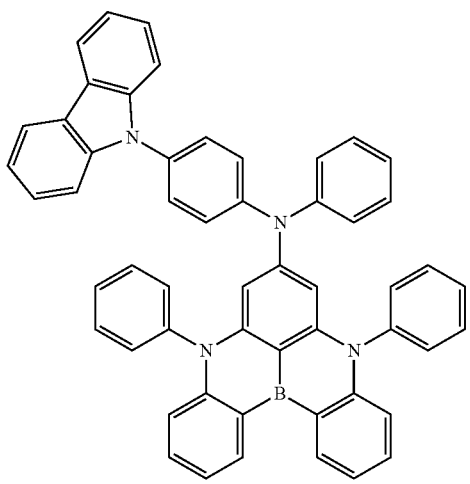

10
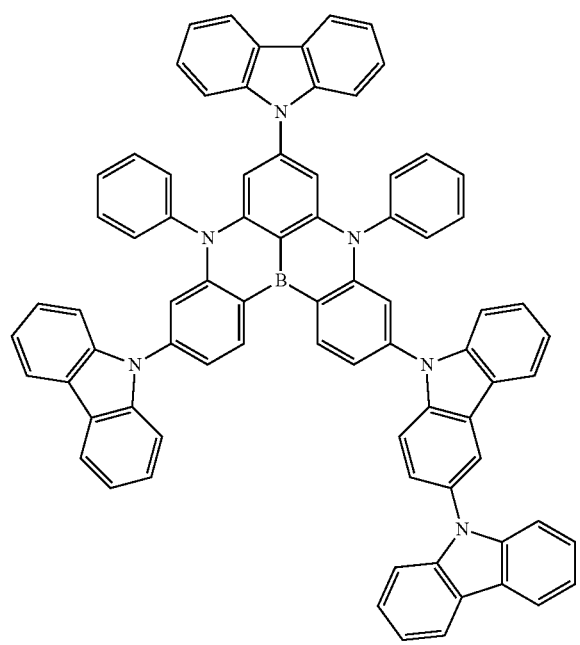
11
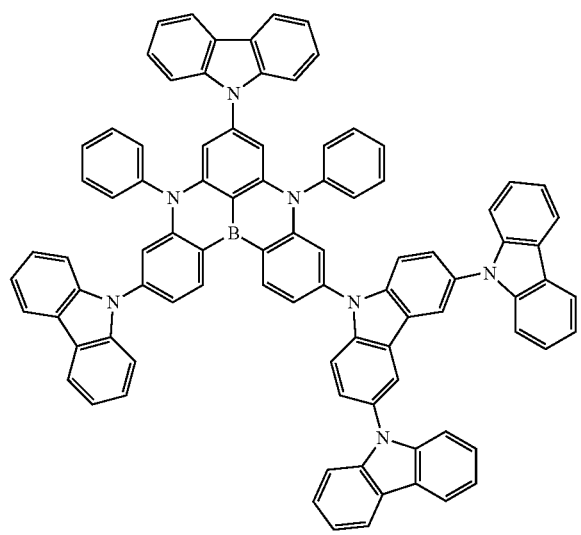
12
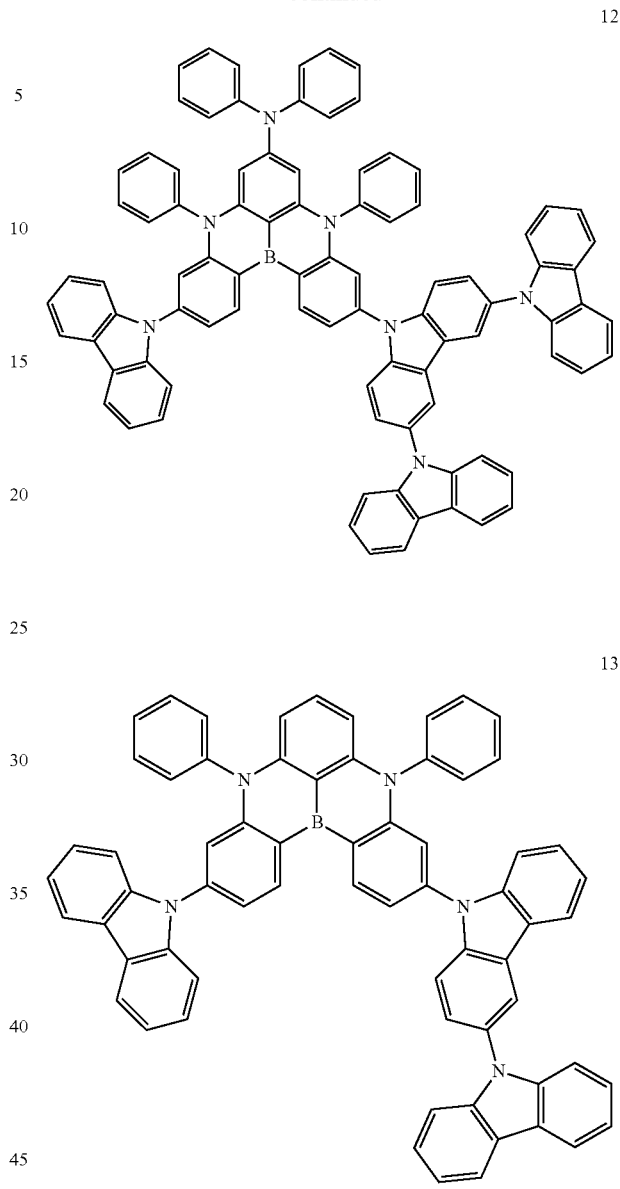
13
14
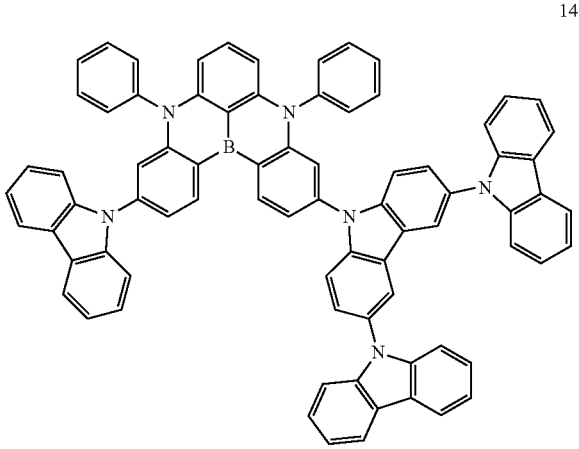

15
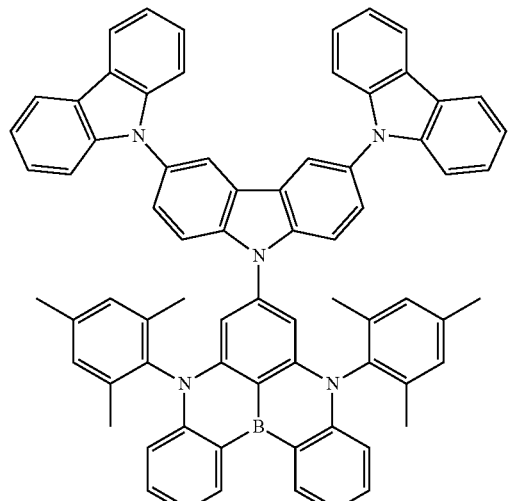
16
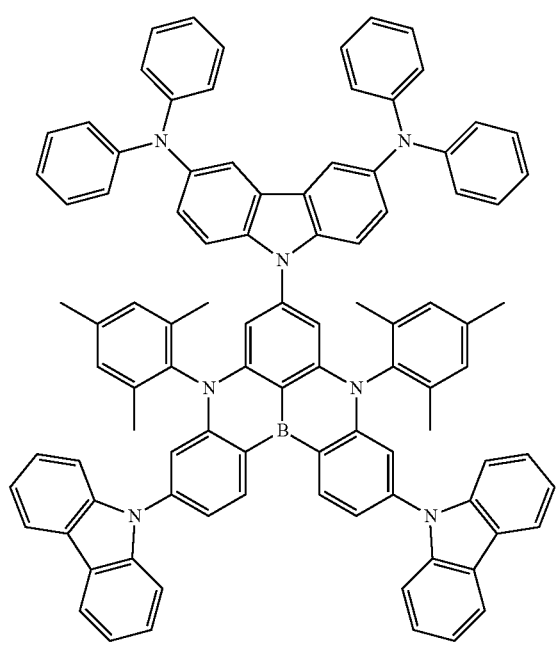
17
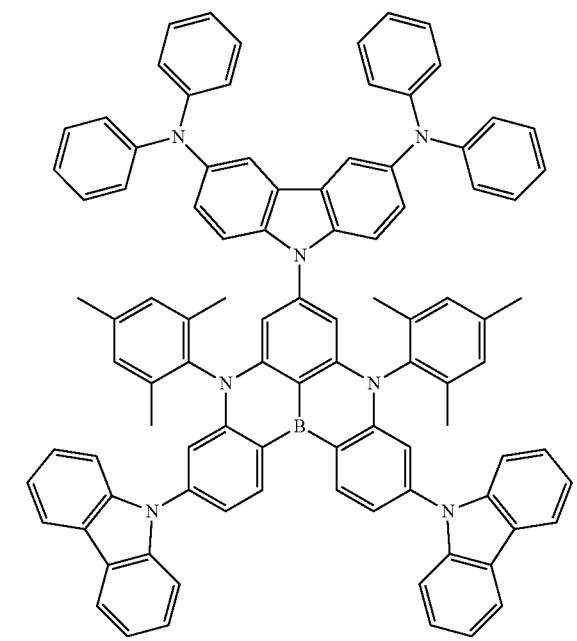
18
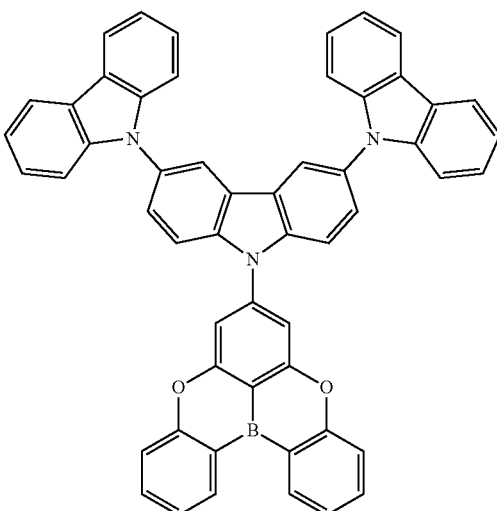

19
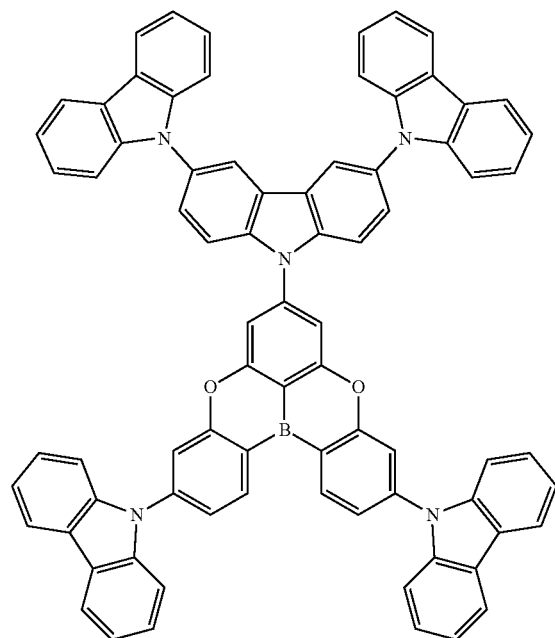
20
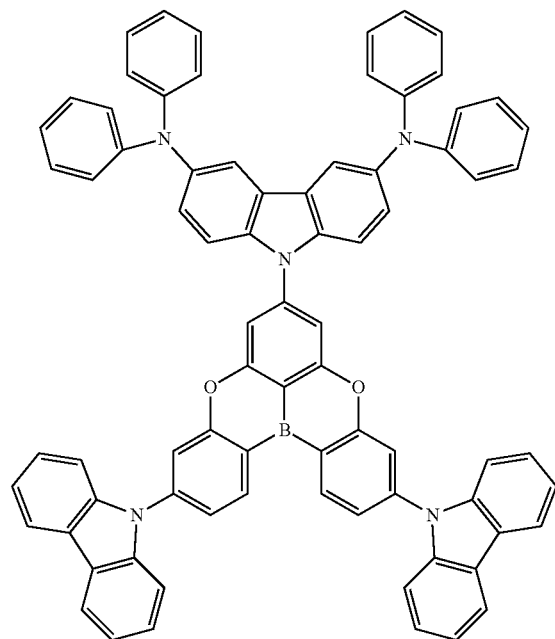
21
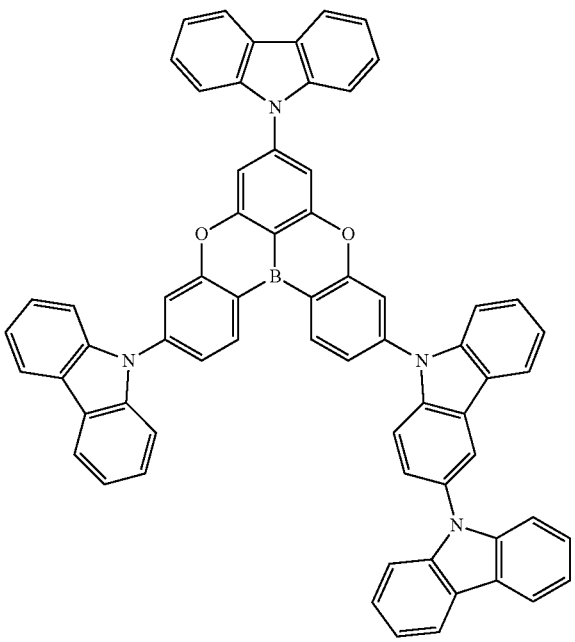
22

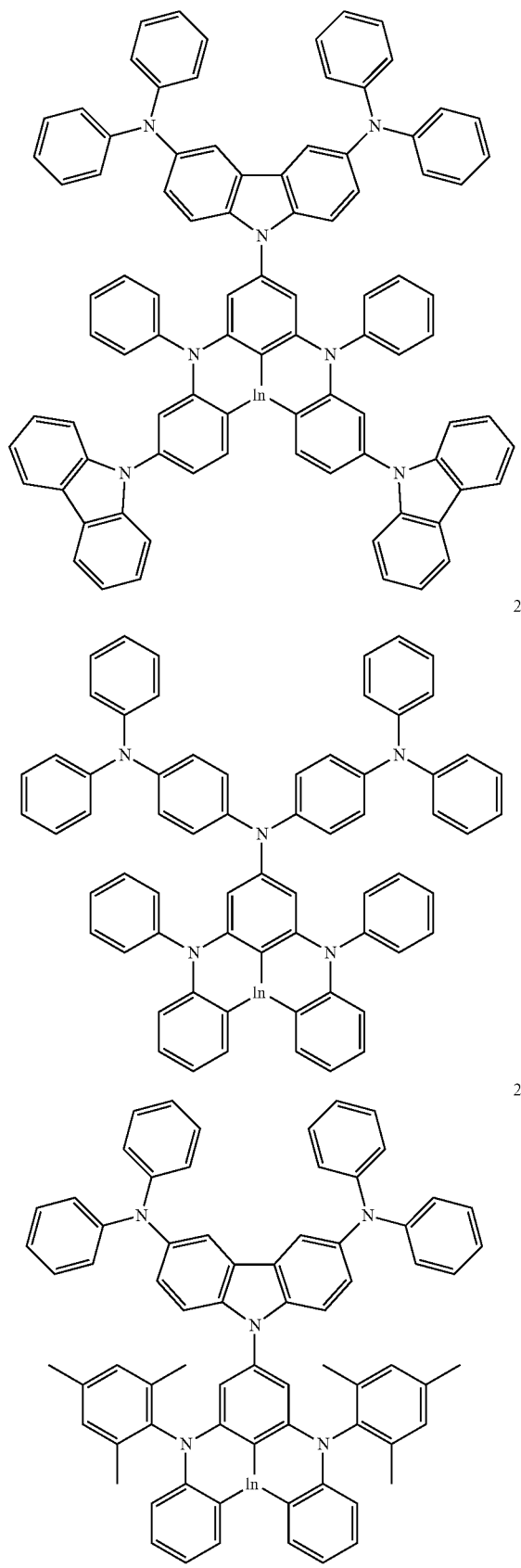
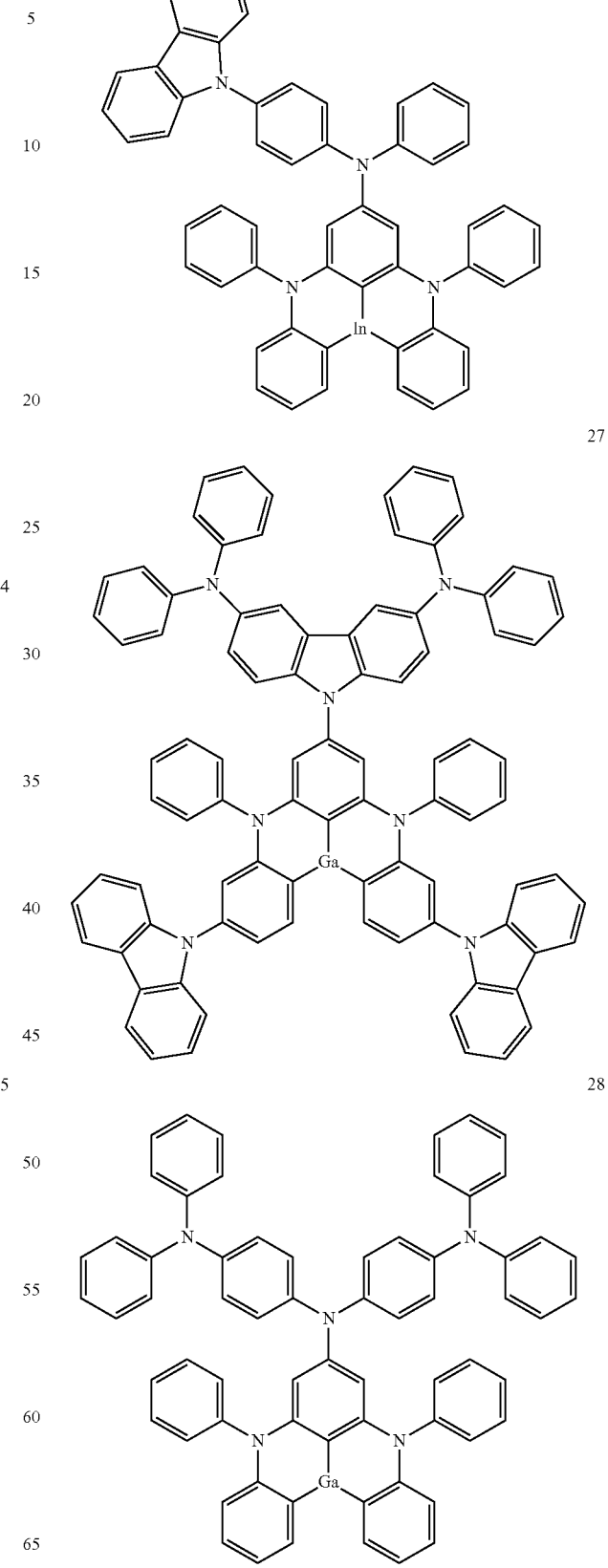

-continued

29

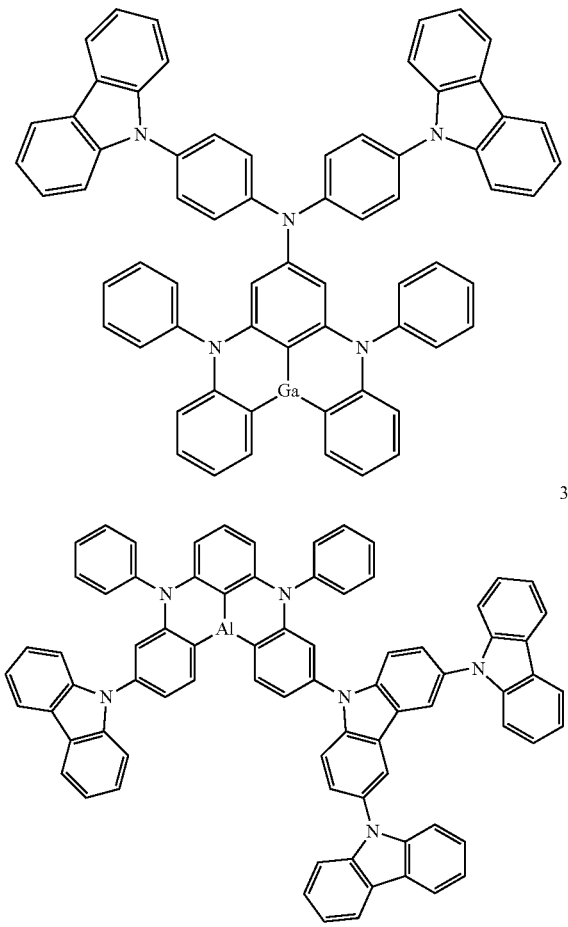

14. A fused polycyclic compound represented by Formula 1:

Formula 1

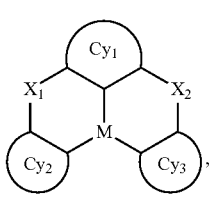

wherein, in Formula 1,

M is B, Al, Ga, or In, $X_1$ and $X_2$ are each independently $NR_1$, O, S, $P(=O)R_2$, or $P(=S)R_3$, $R_1$ to $R_3$ are each independently a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_1$ to $R_3$ are optionally combined with an adjacent group to form a ring, $Cy_1$ to $Cy_3$ are each independently a substituted or unsubstituted aromatic hydrocarbon ring, or a substituted or unsubstituted aromatic heterocycle, and any of $Cy_1$ to $Cy_3$ are optionally combined with an adjacent group to form a ring, and at least one among $Cy_1$ to $Cy_3$ is substituted with a substituent represented by Formula 2:

Formula 2

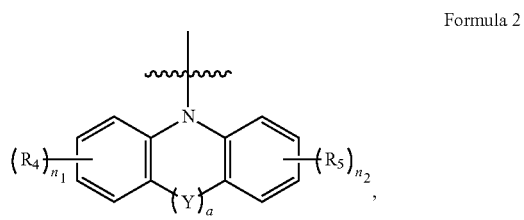

wherein, in Formula 2, $R_4$ and $R_5$ are each independently a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_4$ and $R_5$ are optionally combined with an adjacent group to form a ring, $n_1$ and $n_2$ are each independently an integer of 0 to 4, at least one among $R_4$ and $R_5$ is a substituted or unsubstituted amine group, or a substituted or unsubstituted carbazole group, if $R_4$ is the substituted or unsubstituted amine group, or the substituted or unsubstituted carbazole group, $n_1$ is an integer of 1 to 4, if $R_5$ is the substituted or unsubstituted amine group, or the substituted or unsubstituted carbazole group, $n_2$ is an integer of 1 to 4, Y is a direct linkage, and a is 0 or 1.

15. The fused polycyclic compound of claim 14, wherein the fused polycyclic compound represented by Formula 1 has an absolute value of a difference between a lowest singlet excitation energy level (S1) and a lowest triplet excitation energy level (T1) of about 0.4 eV or less.

16. The fused polycyclic compound of claim 14, wherein the fused polycyclic compound represented by Formula 1 is represented by Formula 3:

Formula 3

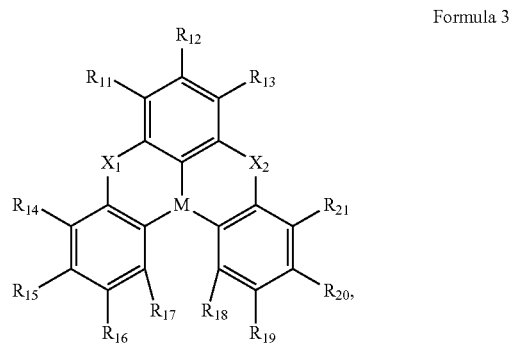

wherein, in Formula 3, $R_{11}$ to $R_{21}$ are each independently a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_{11}$ to $R_{21}$ are optionally combined with an adjacent group to form a ring, at least one among $R_{11}$ to $R_{21}$ is represented by Formula 2, and M, $X_1$, and $X_2$ are the same as defined in Formula 1.

17. The fused polycyclic compound of claim 16, wherein the fused polycyclic compound represented by Formula 3 is represented by Formula 4:

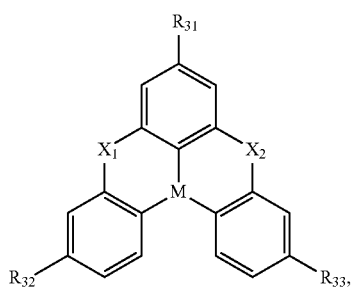

Formula 4 wherein, in Formula 4, $R_{31}$ to $R_{33}$ are each independently a hydrogen atom, a deuterium atom, a halogen atom, a substituted or unsubstituted amine group, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_{31}$ to $R_{33}$ are optionally combined with an adjacent group to form a ring, at least one among $R_{31}$ to $R_{33}$ is represented by Formula 2, and M, $X_1$, and $X_2$ are the same as defined in Formula 1.

18. The fused polycyclic compound of claim 14, wherein the substituent represented by Formula 2 is represented by any one among Formula 6-1 to Formula 6-4:

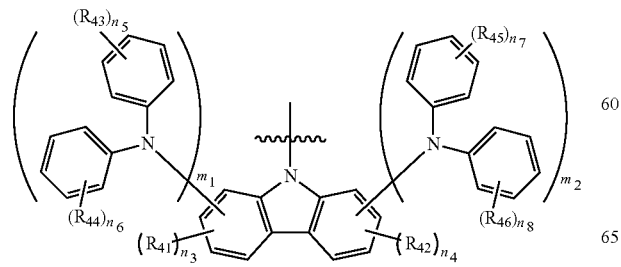

Formula 6-1

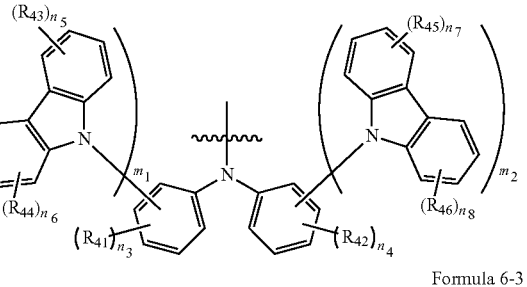

Formula 6-2

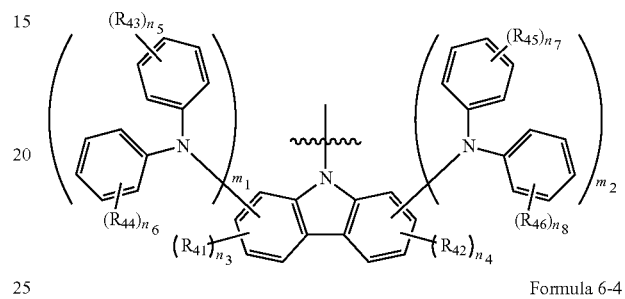

Formula 6-3

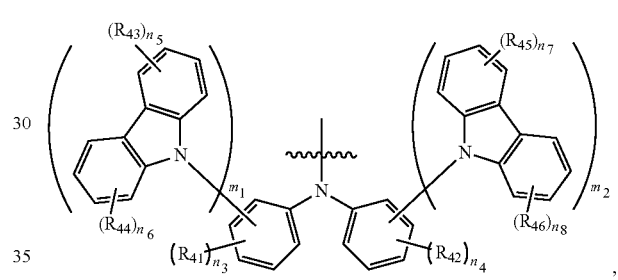

Formula 6-4 wherein, in Formulae 6-1 to 6-4, $R_{41}$ to $R_{46}$ are each independently a hydrogen atom, a deuterium atom, a halogen atom, a substituted or unsubstituted alkyl group of 1 to 20 carbon atoms, a substituted or unsubstituted aryl group of 6 to 60 carbon atoms to form a ring, or a substituted or unsubstituted heteroaryl group of 2 to 60 carbon atoms to form a ring, and any of $R_{41}$ to $R_{46}$ are optionally combined with an adjacent group to form a ring, $n_3$ and $n_4$ are each independently an integer of 0 to 3, $n_5$ to $n_8$ are each independently an integer of 0 to 4, $m_1$ and $m_2$ are each independently 0 or 1, and at least one of $m_1$ and $m_2$ is 1.

19. The fused polycyclic compound of claim 14, wherein the substituent represented by Formula 2 is represented by Formula 7-1 or Formula 7-2:

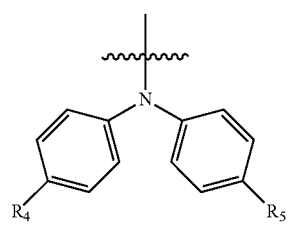

Formula 7-1

Formula 7-2
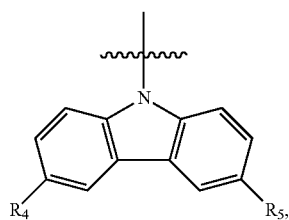
wherein, in Formulae 7-1 and 7-2,
$R_4$, and $R_5$ are the same as defined in Formula 2.
20. The fused polycyclic compound of claim 14, wherein the fused polycyclic compound represented by Formula 1 is at least one selected among compounds in Compound Group 1:
Compound Group 1
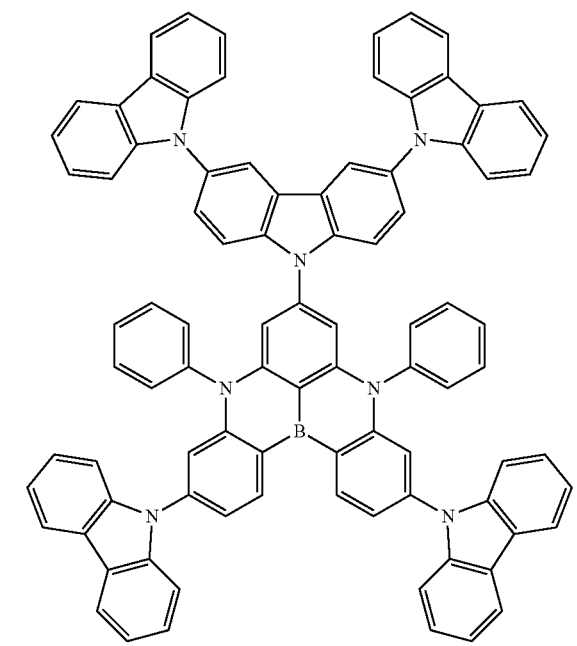
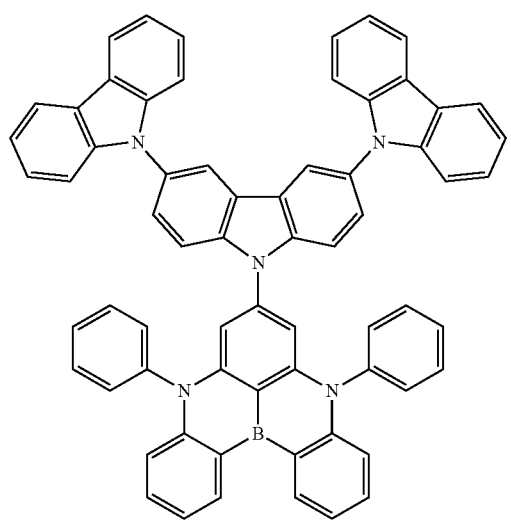
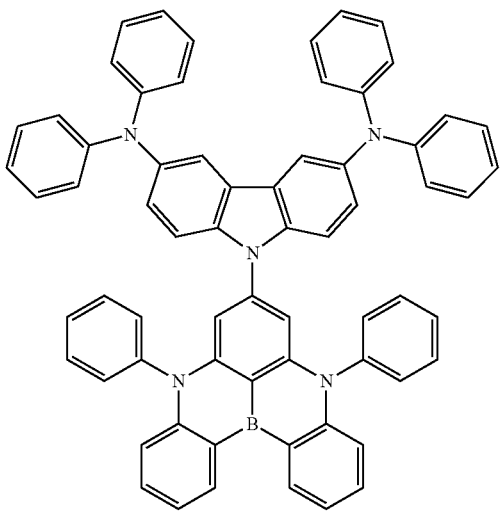

81
-continued
4
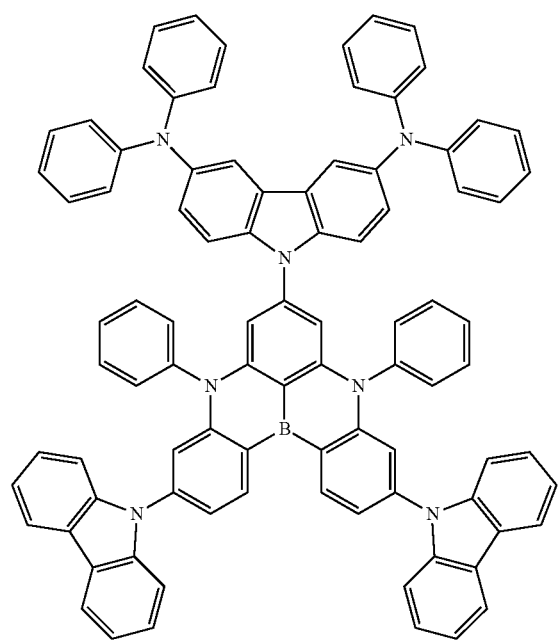
5
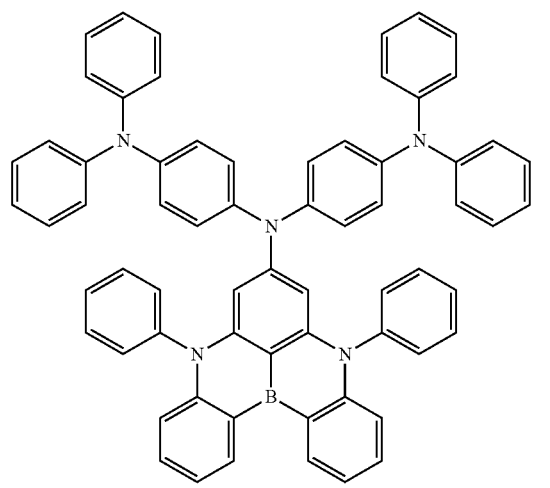
6
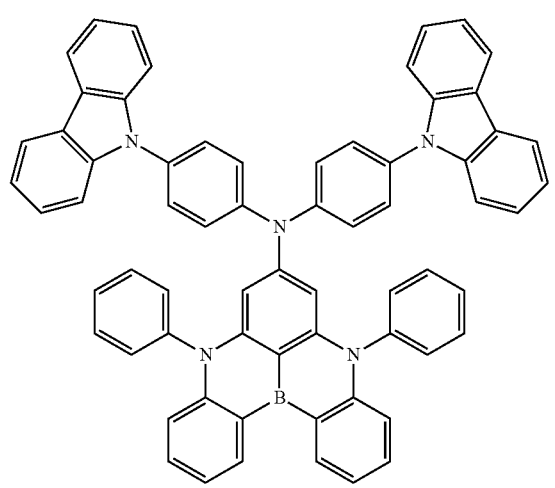
82
-continued
7
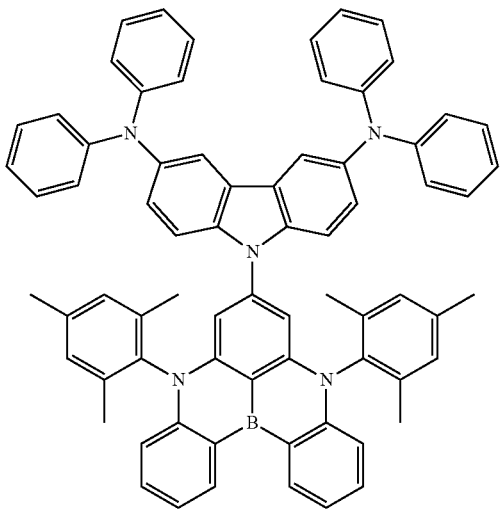
8
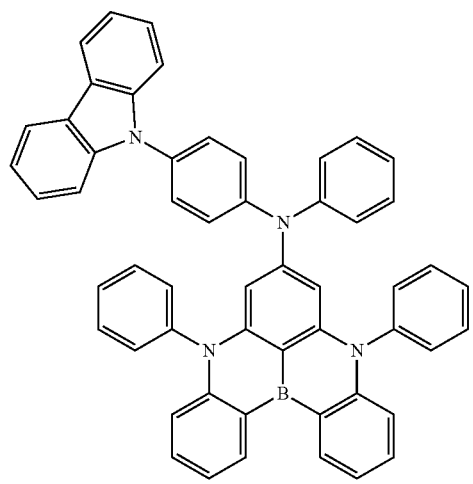
9
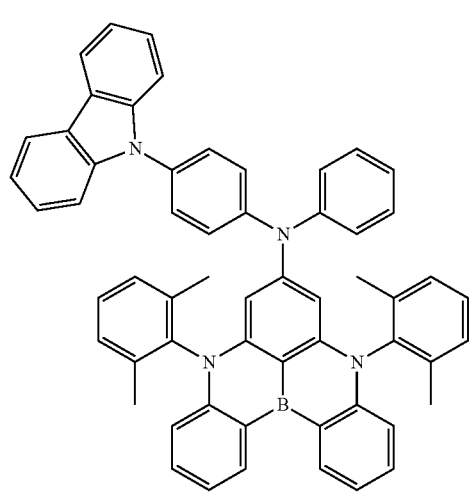

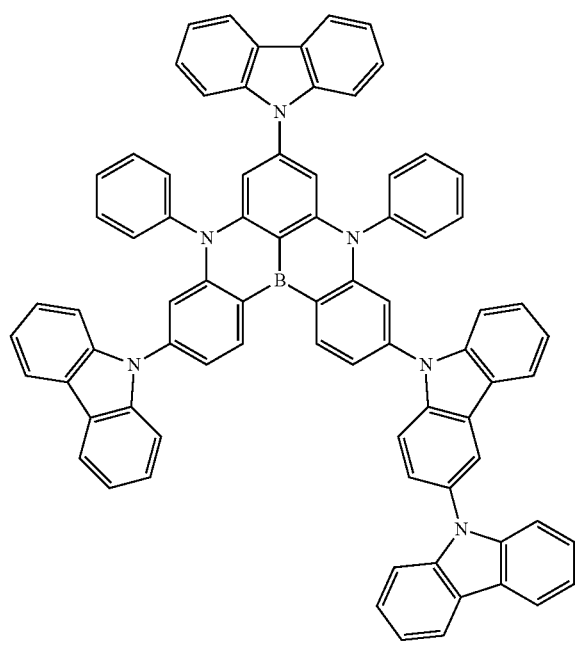
10
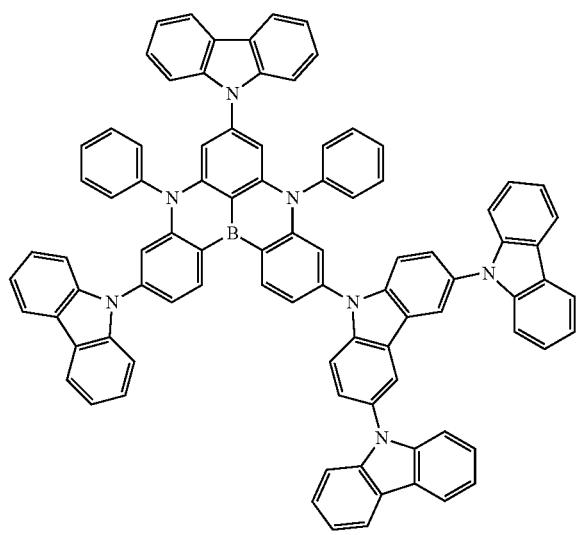
11
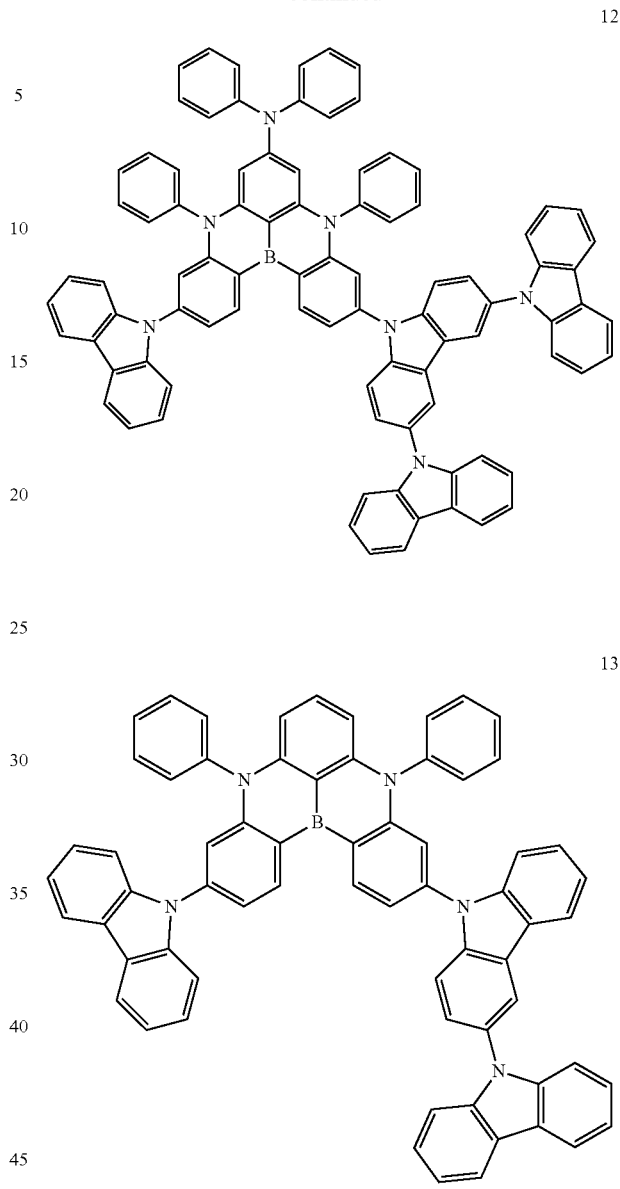
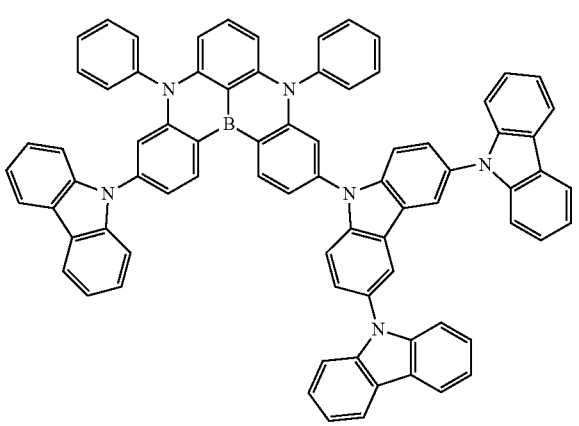

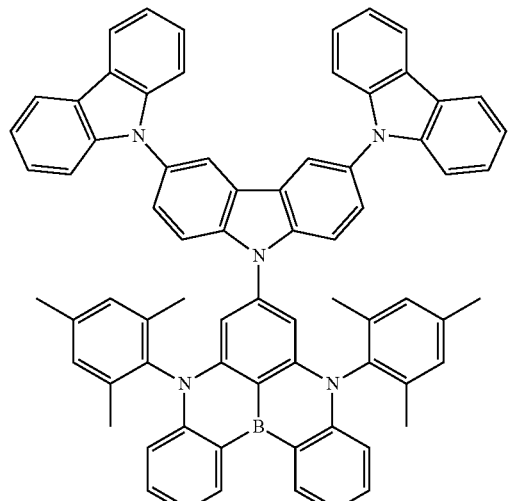
15
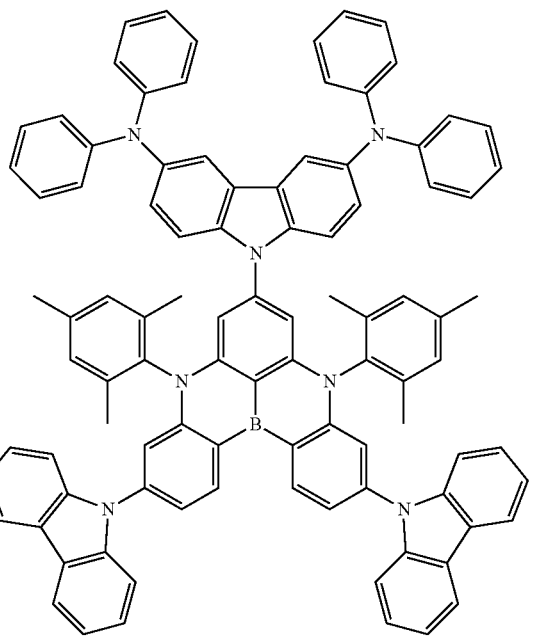
16
17
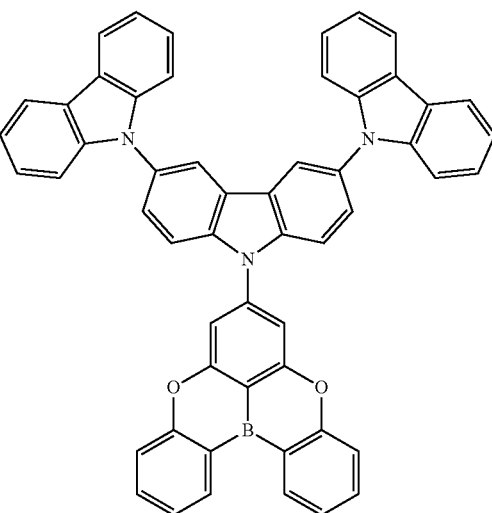
18

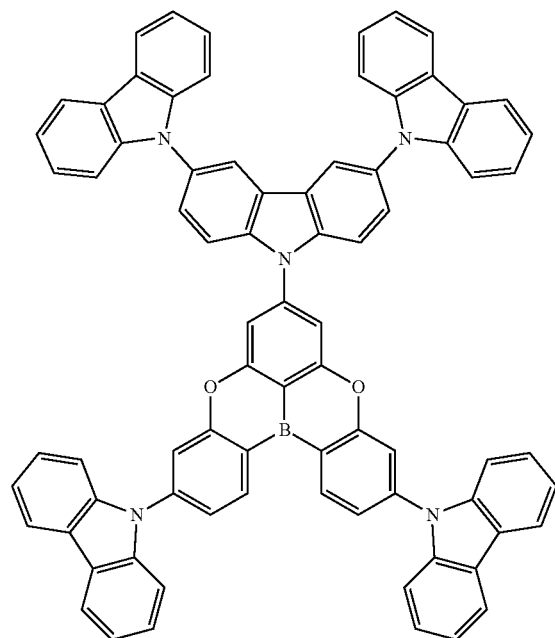
19
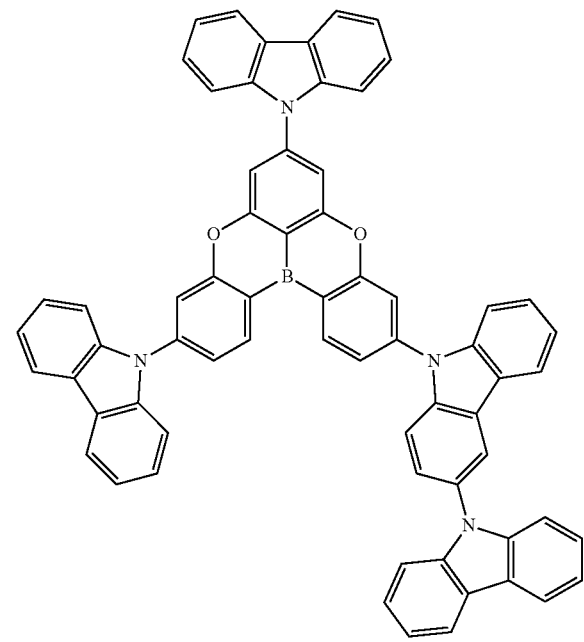
21
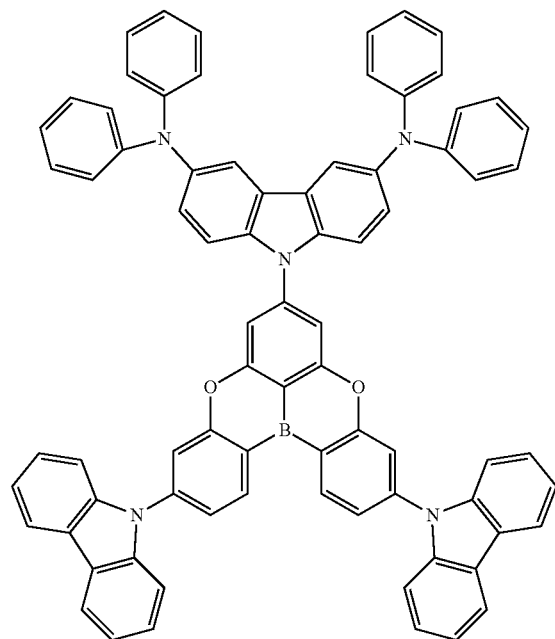
20
22

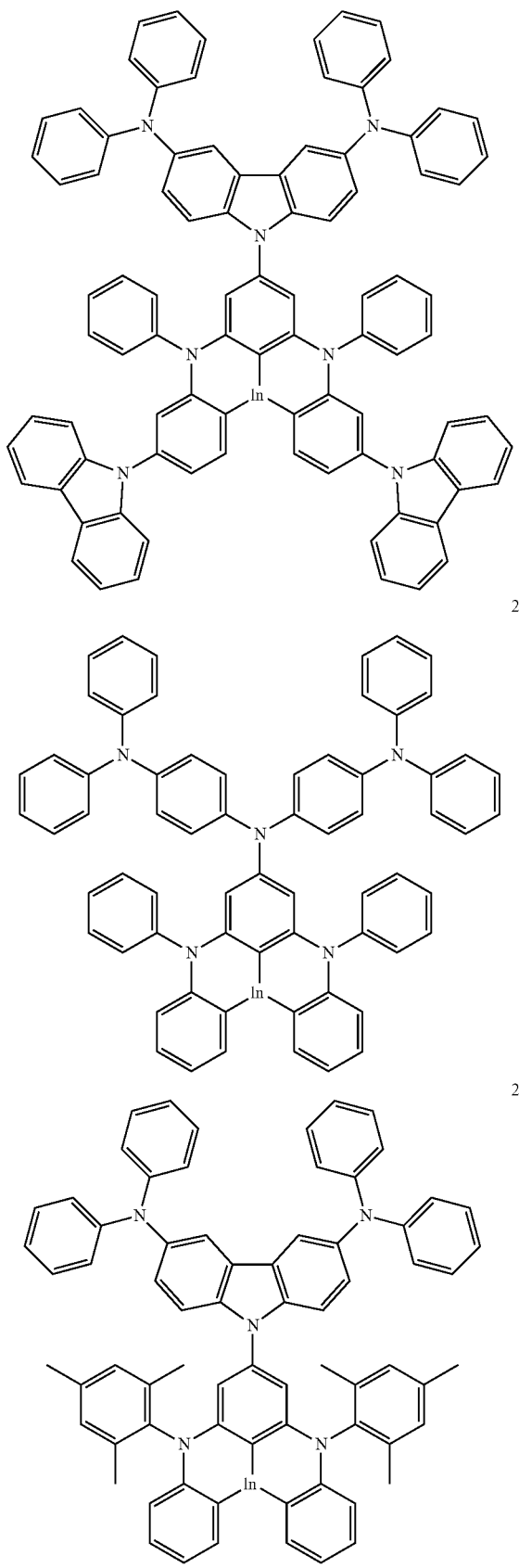
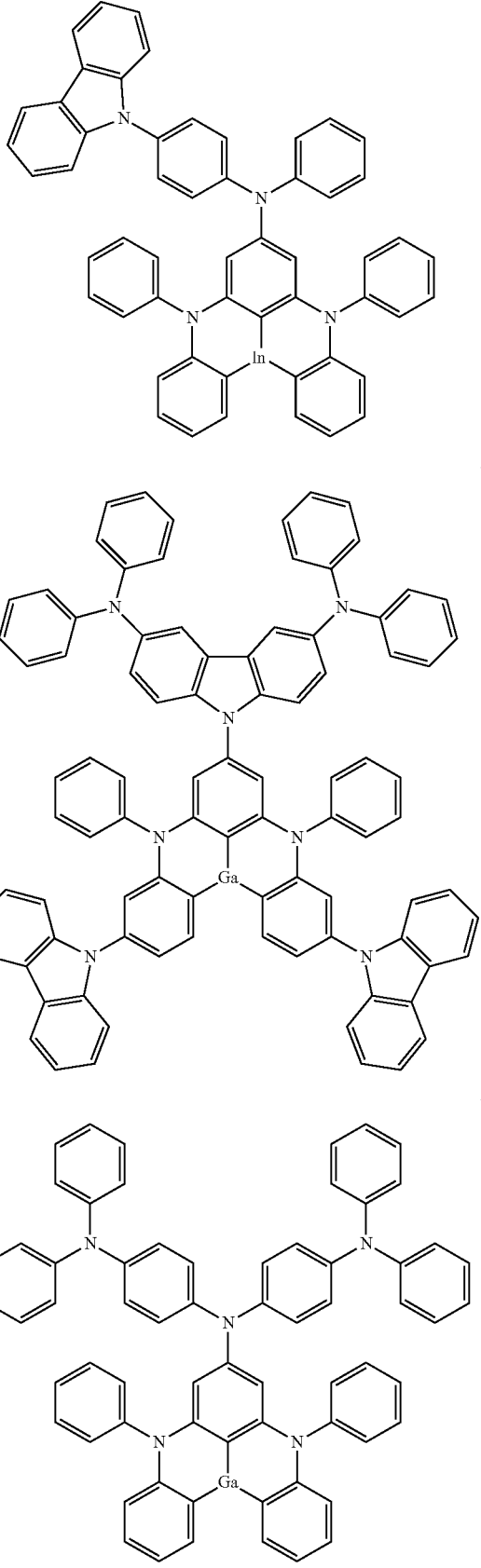

91
-continued
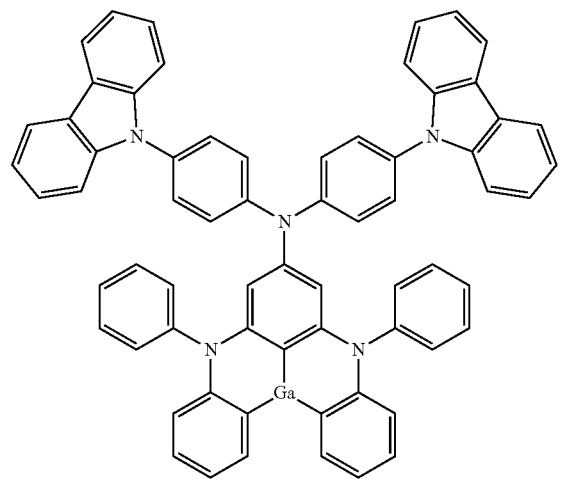
29
92
-continued
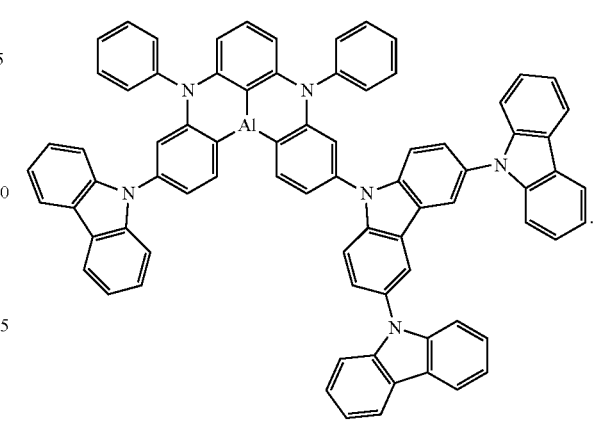
30
* * * * *

UNITED STATES PATENT AND TRADEMARK OFFICE
CERTIFICATE OF CORRECTION

PATENT NO.          : 11,489,124 B2                     Page 1 of 3
APPLICATION NO.     : 16/882900
DATED               : November 1, 2022
INVENTOR(S)         : Hyoyoung Lee et al.

It is certified that error appears in the above-identified patent and that said Letters Patent is hereby corrected as shown below:

In the Claims

Column 61, Lines 57-67 (Approx.), Claim 10, Formula 6-1

Delete " 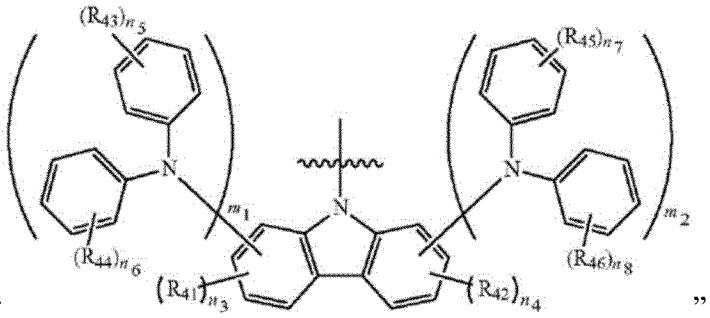 "

and Insert

-- 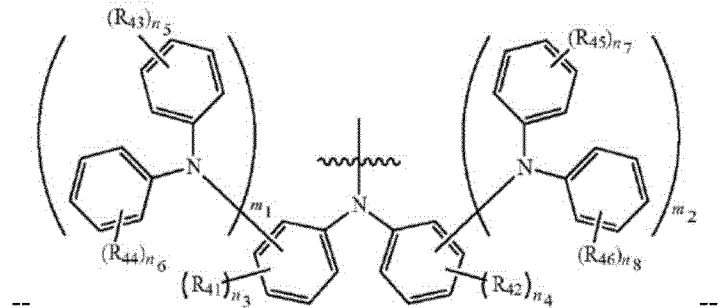 --

Signed and Sealed this
Tenth Day of October, 2023

Katherine Kelly Vidal
*Director of the United States Patent and Trademark Office*

CERTIFICATE OF CORRECTION (continued)
U.S. Pat. No. 11,489,124 B2

| | |
|---|---|
| Column 62, Lines 26-35 (Approx.), Claim 10, Formula 6-4 | Delete " 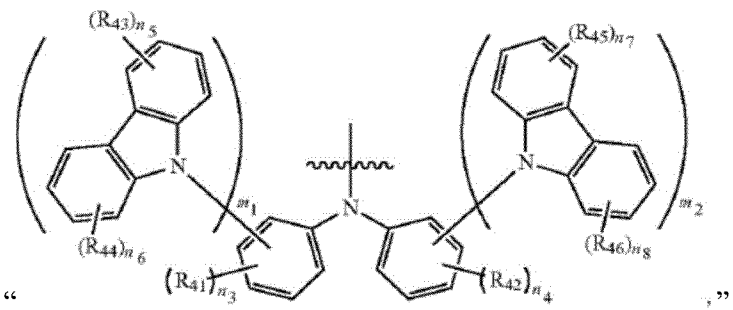 ," and Insert -- 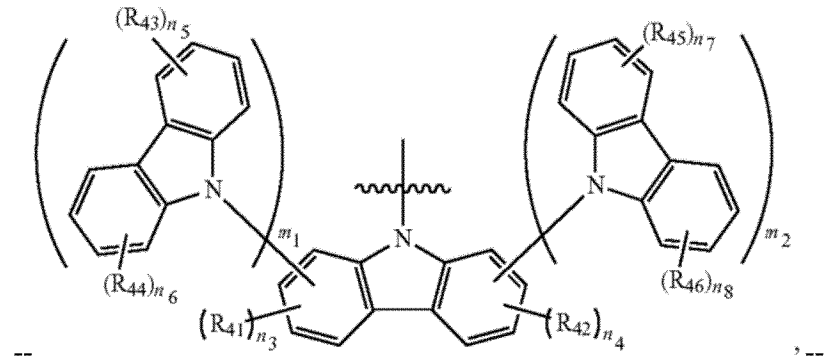 , -- |
| Column 77, Lines 57-67 (Approx.), Claim 18, Formula 6-1 | Delete " 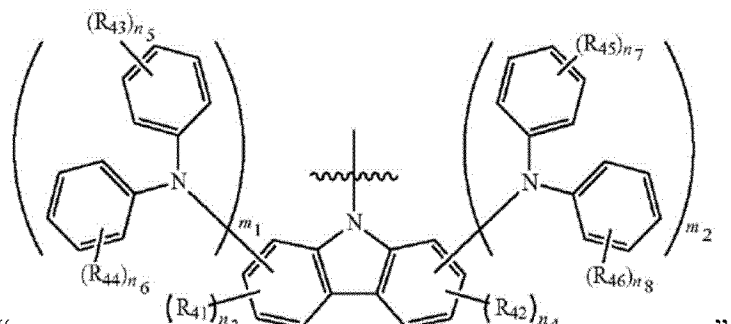 " and Insert -- 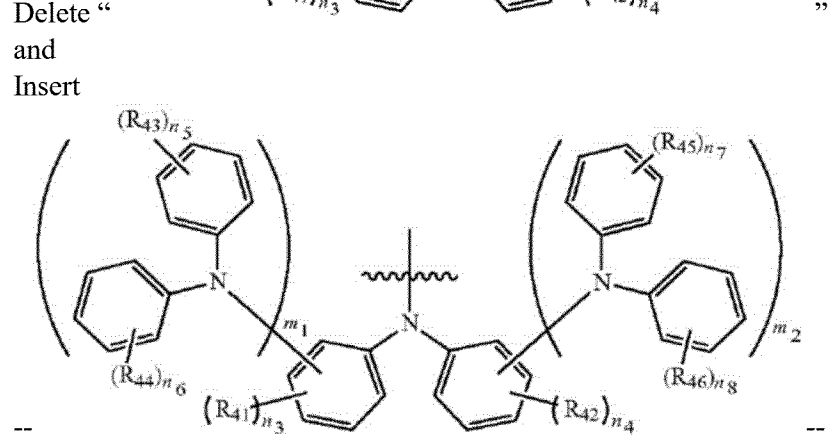 -- |

CERTIFICATE OF CORRECTION (continued)
U.S. Pat. No. 11,489,124 B2

Column 78, Lines 26-35 (Approx.), Claim 18, Formula 6-4

Delete "
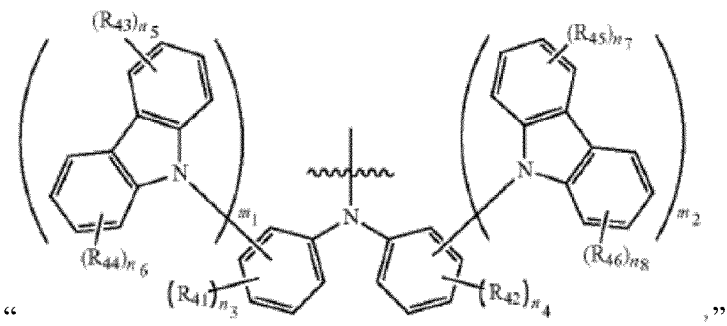
,"
and Insert
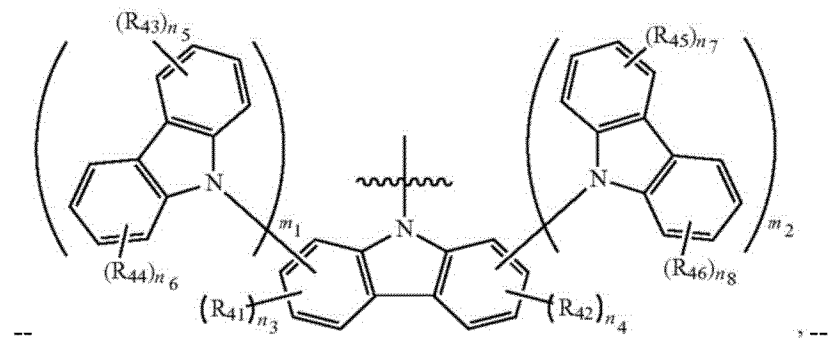
--     , --